United States Patent
Chou et al.

(10) Patent No.: US 8,836,146 B2
(45) Date of Patent: Sep. 16, 2014

(54) CHIP PACKAGE AND METHOD FOR FABRICATING THE SAME

(75) Inventors: Chien-Kang Chou, Tainan Hsien (TW); Chiu-Ming Chou, Kao-hsiung (TW); Li-Ren Lin, Taipei County (TW); Hsin-Jung Lo, Taipei County (TW)

(73) Assignee: Qualcomm Incorporated, San Diego, CA (US)

( * ) Notice: Subject to any disclaimer, the term of this patent is extended or adjusted under 35 U.S.C. 154(b) by 434 days.

(21) Appl. No.: 11/681,219

(22) Filed: Mar. 2, 2007

(65) Prior Publication Data

US 2007/0205520 A1 Sep. 6, 2007

Related U.S. Application Data

(60) Provisional application No. 60/767,080, filed on Mar. 2, 2006.

(51) Int. Cl.
*H01L 23/48* (2006.01)
*H01L 23/00* (2006.01)
*H01L 23/31* (2006.01)
*H01L 25/065* (2006.01)
*H01L 23/66* (2006.01)
*H01L 23/498* (2006.01)

(52) U.S. Cl.
CPC ....... *H01L 24/12* (2013.01); *H01L 2224/13155* (2013.01); *H01L 2224/0401* (2013.01); *H01L 2924/12044* (2013.01); *H01L 2924/14* (2013.01); *H01L 2224/05568* (2013.01); *H01L 2224/05559* (2013.01); *H01L 2224/48463* (2013.01); *H01L 2224/11912* (2013.01); *H01L 2224/13147* (2013.01); *H01L 2224/4807* (2013.01); *H01L 2225/06579* (2013.01); *H01L 2924/01007* (2013.01); *H01L 2924/01072* (2013.01); *H01L 2224/13176* (2013.01); *H01L 2924/014* (2013.01); *H01L 2224/73204* (2013.01); *H01L 24/48* (2013.01); *H01L 2224/45147* (2013.01); *H01L 2924/01019* (2013.01); *H01L 2924/01074* (2013.01); *H01L 2225/06506* (2013.01); *H01L 2224/04073* (2013.01); *H01L 2924/19042* (2013.01); *H01L 2224/05024* (2013.01); *H01L 24/05* (2013.01);

(Continued)

(58) Field of Classification Search
USPC ............................................ 257/780, E23.02
See application file for complete search history.

(56) References Cited

U.S. PATENT DOCUMENTS 4,685,998 A  8/1987  Quinn
4,789,647 A  12/1988  Peters (Continued)

OTHER PUBLICATIONS

Foreign Office Action for Taiwan Application No. 096107211 dated Apr. 19, 2010 with an English Summary thereof.

(Continued)

*Primary Examiner* — Alexander Sofocleous
*Assistant Examiner* — John P Dulka
(74) *Attorney, Agent, or Firm* — Seyfarth Shaw LLP

(57) ABSTRACT

A chip package includes a semiconductor substrate, a first metal pad over the semiconductor substrate, and a second metal pad over the semiconductor substrate. In a case, the first metal pad is tape automated bonded thereto, and the second metal pad is solder bonded thereto. In another case, the first metal pad is tape automated bonded thereto, and the second metal pad is wirebonded thereto. In another case, the first metal pad is solder bonded thereto, and the second metal pad is wirebonded thereto. In another case, the first metal pad is bonded to an external circuitry using an anisotropic conductive film, and the second metal pad is solder bonded thereto. In another case, the first metal pad is bonded to an external circuitry using an anisotropic conductive film, and the second metal pad is wirebonded thereto.

48 Claims, 44 Drawing Sheets

(52) U.S. Cl.
CPC .......... *H01L 2924/04953* (2013.01); *H01L 2224/48844* (2013.01); *H01L 2924/09701* (2013.01); *H01L 2224/48453* (2013.01); *H01L 2924/01046* (2013.01); H01L 23/3157 (2013.01); *H01L 2924/01033* (2013.01); *H01L 2224/13139* (2013.01); *H01L 2924/19043* (2013.01); *H01L 2924/0105* (2013.01); *H01L 2924/01023* (2013.01); *H01L 2924/19041* (2013.01); *H01L 23/66* (2013.01); *H01L 2924/01073* (2013.01); *H01L 2224/1147* (2013.01); *H01L 2924/01013* (2013.01); *H01L 2924/01024* (2013.01); *H01L 2924/01075* (2013.01); *H01L 2224/13164* (2013.01); *H01L 2225/06517* (2013.01); H01L 24/16 (2013.01); *H01L 2224/05644* (2013.01); *H01L 2924/01027* (2013.01); H01L 24/03 (2013.01); *H01L 2224/05572* (2013.01); *H01L 2924/01082* (2013.01); H01L 24/45 (2013.01); *H01L 2224/05027* (2013.01); *H01L 2224/13022* (2013.01); H01L 24/73 (2013.01); *H01L 2924/01079* (2013.01); *H01L 2224/13183* (2013.01); H01L 24/06 (2013.01); *H01L 23/4985* (2013.01); *H01L 2224/05558* (2013.01); *H01L 2224/48145* (2013.01); *H01L 2924/00013* (2013.01); *H01L 2224/45144* (2013.01); *H01L 2224/48644* (2013.01); *H01L 2224/13173* (2013.01); *H01L 2924/01044* (2013.01); *H01L 2924/01028* (2013.01); *H01L 2224/05124* (2013.01); *H01L 2924/01049* (2013.01); H01L 24/11 (2013.01); *H01L 2224/48655* (2013.01); *H01L 2924/10329* (2013.01); *H01L 2224/13144* (2013.01); *H01L 2924/01015* (2013.01); H01L 25/0657 (2013.01); *H01L 2224/11902* (2013.01); *H01L 2224/48855* (2013.01); *H01L 2924/04941* (2013.01); *H01L 2924/05042* (2013.01); *H01L 2924/01018* (2013.01); *H01L 2924/01011* (2013.01); *H01L 2924/01078* (2013.01); *H01L 2224/04042* (2013.01); *H01L 2224/05655* (2013.01); *H01L 2224/13169* (2013.01); *H01L 2924/01047* (2013.01); *H01L 2224/05147* (2013.01); *H01L 2924/01045* (2013.01); *H01L 224/05155* (2013.01); *H01L 2224/48091* (2013.01); *H01L 2924/01006* (2013.01); *H01L 2924/01029* (2013.01); *H01L 2225/06513* (2013.01); *H01L 2924/01022* (2013.01); *H01L 2924/01014* (2013.01)
USPC .......... 257/780; 257/E25.013; 257/E23.021; 257/E21.508; 257/E23.02

(56) References Cited

U.S. PATENT DOCUMENTS

| | | | |
|---|---|---|---|
| 5,083,187 A | 1/1992 | Lamson | |
| 5,226,232 A | 7/1993 | Boyd | |
| 5,384,488 A | 1/1995 | Golshan | |
| 5,468,984 A | 11/1995 | Efland | |
| 5,532,512 A | 7/1996 | Fillion | |
| 5,659,201 A | 8/1997 | Wollesen | |
| 5,665,989 A | 9/1997 | Dangelo | |
| 5,691,248 A | 11/1997 | Cronin | |
| 5,792,594 A | 8/1998 | Brown | |
| 5,834,844 A | 11/1998 | Akagawa | |
| 5,854,513 A | 12/1998 | Kim | |
| 5,883,435 A | 3/1999 | Geffken | |
| 5,892,273 A | 4/1999 | Iwasaki | |
| 5,952,726 A | 9/1999 | Liang | |
| 5,994,766 A | 11/1999 | Shenoy | |
| 6,011,314 A | 1/2000 | Leibovitz | |
| 6,022,792 A | 2/2000 | Ishii | |
| 6,077,726 A | 6/2000 | Mistry | |
| 6,144,100 A | 11/2000 | Shen | |
| 6,184,143 B1 | 2/2001 | Ohashi | |
| 6,187,680 B1 | 2/2001 | Costrini | |
| 6,288,447 B1 | 9/2001 | Amishiro | |
| 6,359,328 B1 | 3/2002 | Dubin | |
| 6,362,087 B1 | 3/2002 | Wang | |
| 6,376,353 B1 | 4/2002 | Zhou et al. | |
| 6,383,916 B1 | 5/2002 | Lin | |
| 6,429,120 B1 | 8/2002 | Ahn | |
| 6,472,745 B1 | 10/2002 | Iizuka | |
| 6,495,442 B1 | 12/2002 | Lin | |
| 6,500,748 B2 * | 12/2002 | Anand | 438/612 |
| 6,614,091 B1 | 9/2003 | Downey | |
| 6,639,299 B2 | 10/2003 | Aoki | |
| 6,646,347 B2 | 11/2003 | Mercado | |
| 6,649,509 B1 | 11/2003 | Lin | |
| 6,653,563 B2 | 11/2003 | Bohr | |
| 6,680,544 B2 | 1/2004 | Lu | |
| 6,683,380 B2 | 1/2004 | Efland | |
| 6,707,124 B2 | 3/2004 | Wachtler | |
| 6,756,295 B2 | 6/2004 | Lin | |
| 6,780,748 B2 | 8/2004 | Yamaguchi | |
| 6,861,740 B2 | 3/2005 | Hsu | |
| 6,943,440 B2 | 9/2005 | Kim | |
| 6,963,136 B2 | 11/2005 | Shinozaki | |
| 7,230,340 B2 | 6/2007 | Lin | |
| 7,239,028 B2 | 7/2007 | Anzai | |
| 7,271,489 B2 | 9/2007 | Lin | |
| 7,319,277 B2 | 1/2008 | Lin | |
| 7,372,161 B2 | 5/2008 | Lin | |
| 7,381,642 B2 | 6/2008 | Lin | |
| 7,416,971 B2 | 8/2008 | Lin | |
| 7,420,276 B2 | 9/2008 | Lin | |
| 7,423,346 B2 | 9/2008 | Lin | |
| 7,470,997 B2 | 12/2008 | Lin | |
| 7,473,999 B2 | 1/2009 | Lin | |
| 2001/0051426 A1 * | 12/2001 | Pozder et al. | 438/666 |
| 2002/0000673 A1 * | 1/2002 | Farnworth | 257/779 |
| 2002/0158334 A1 | 10/2002 | Vu | |
| 2003/0003703 A1 * | 1/2003 | Barth et al. | 438/601 |
| 2003/0218246 A1 | 11/2003 | Abe | |
| 2004/0023450 A1 | 2/2004 | Katagiri | |
| 2004/0042189 A1 | 3/2004 | Chao | |
| 2004/0070042 A1 | 4/2004 | Lee | |
| 2004/0082106 A1 * | 4/2004 | Lee et al. | 438/107 |
| 2004/0150112 A1 * | 8/2004 | Oda | 257/758 |
| 2004/0166659 A1 * | 8/2004 | Lin et al. | 438/611 |
| 2005/0017355 A1 * | 1/2005 | Chou et al. | 257/738 |
| 2005/0023692 A1 * | 2/2005 | Matsunaga et al. | 257/758 |
| 2005/0208702 A1 * | 9/2005 | Kim | 438/106 |
| 2006/0055035 A1 * | 3/2006 | Lin et al. | 257/737 |
| 2007/0026631 A1 | 2/2007 | Lin | |
| 2007/0111389 A1 * | 5/2007 | Kim et al. | 438/111 |
| 2007/0164279 A1 * | 7/2007 | Lin et al. | 257/48 |
| 2009/0309224 A1 | 12/2009 | Lin | |

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

(56) References Cited

OTHER PUBLICATIONS

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Foreign Office Action for Taiwan Application No. 096107214 dated Jan. 27, 2011 with an English Summary.

Decision for Taiwan Application No. 096107211 dated Nov. 22, 2011 with an English translated summary.

Summary English Translation of Office Action of Taiwan Patent Application No. 096107214 dated Oct. 20, 2011.

* cited by examiner

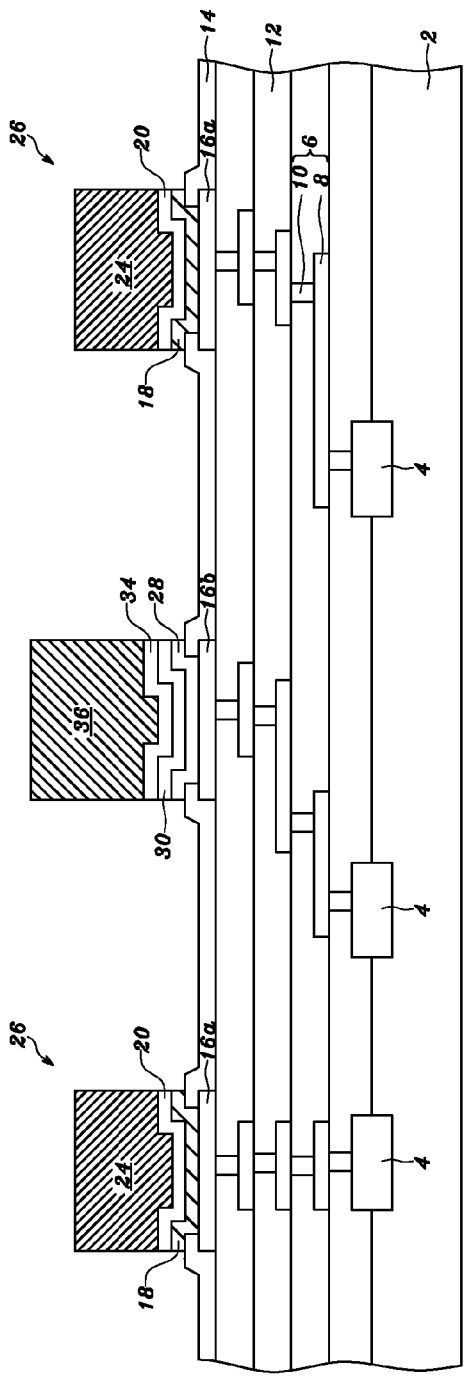
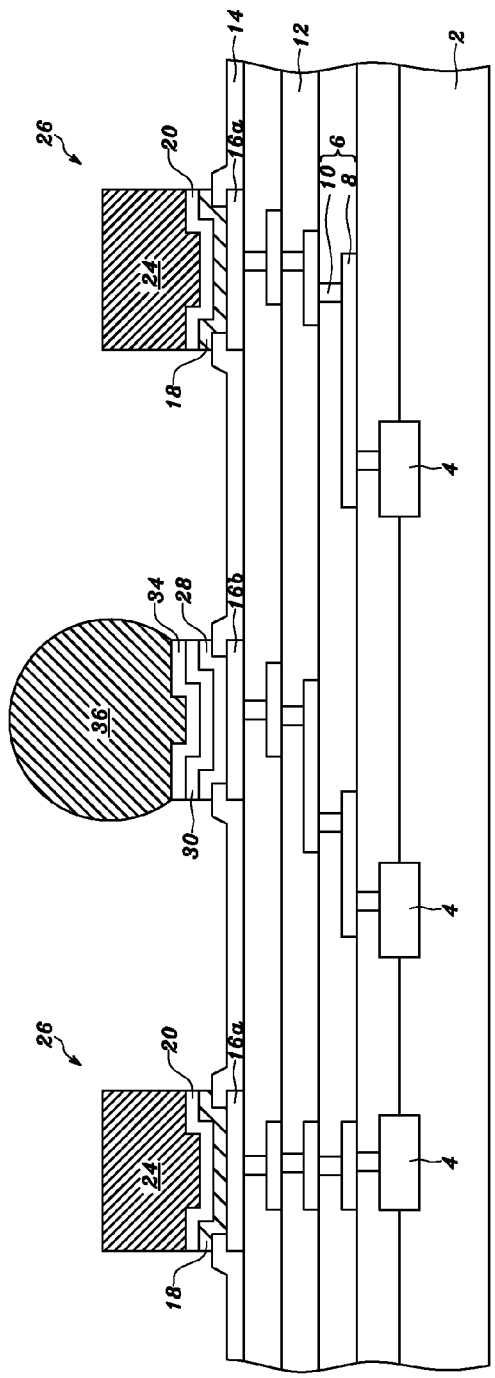
Fig. 2F
Fig. 2G

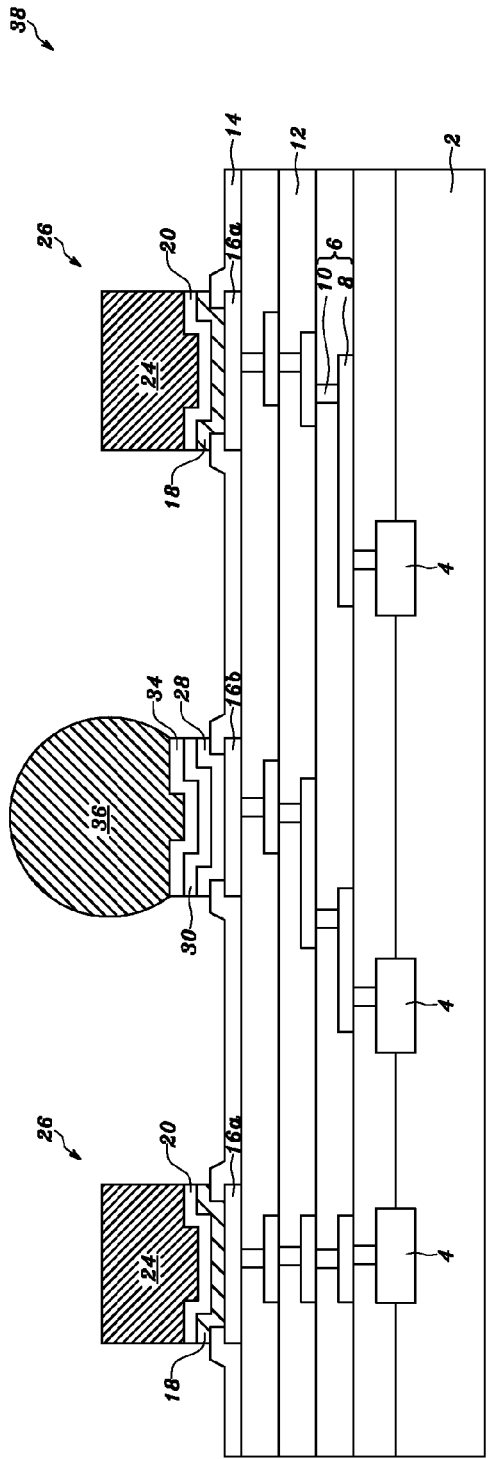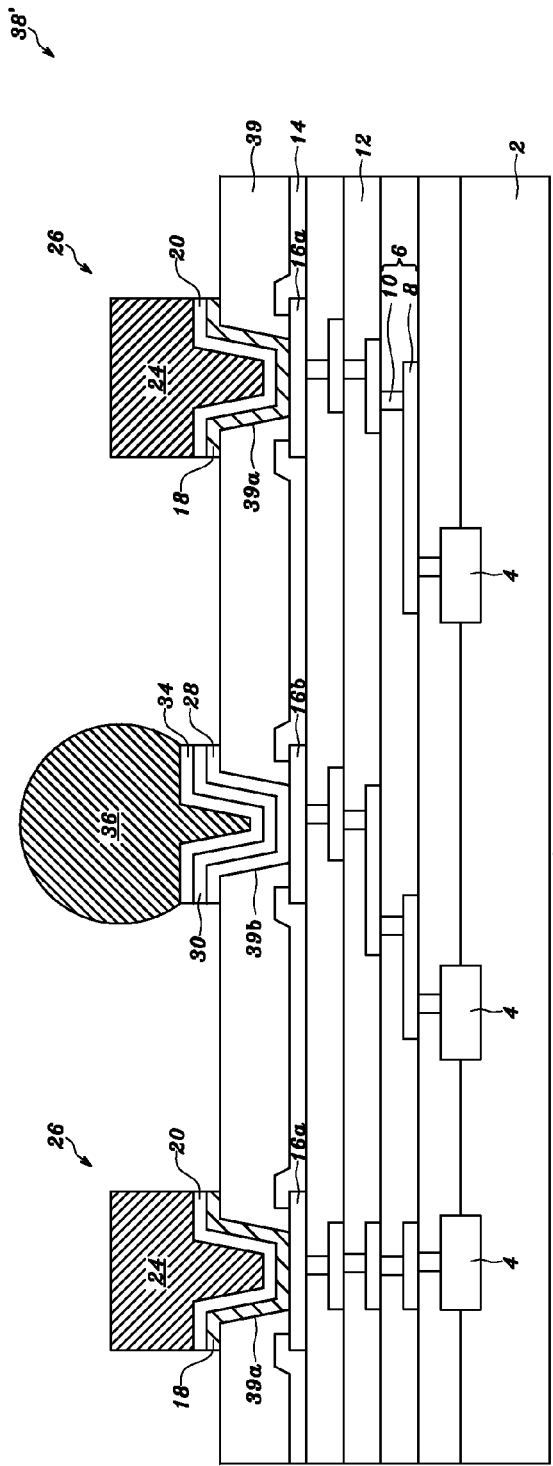
Fig. 2H
Fig. 2I

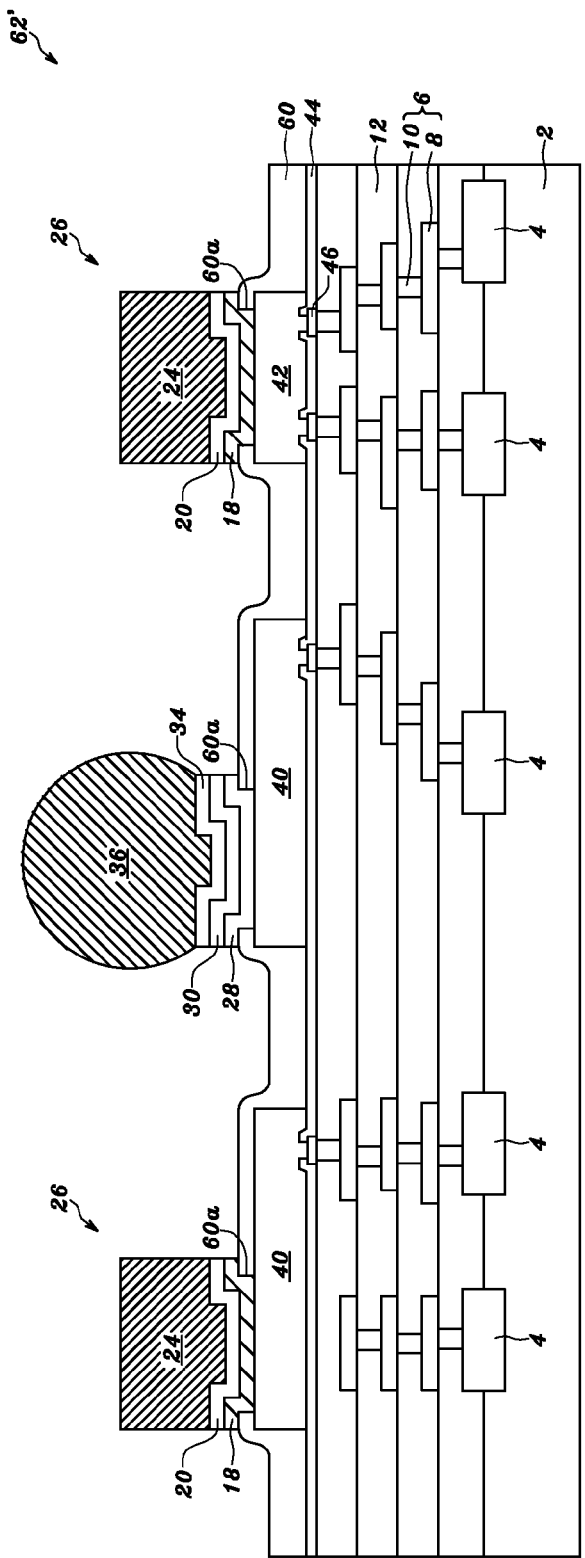
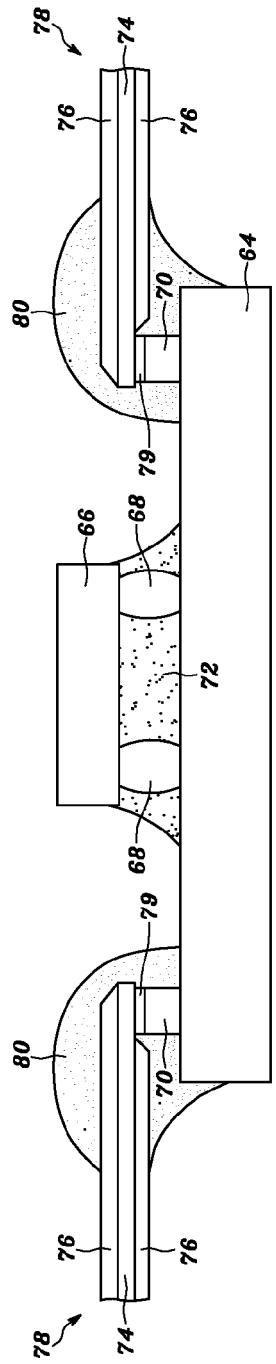
Fig. 3E
Fig. 4

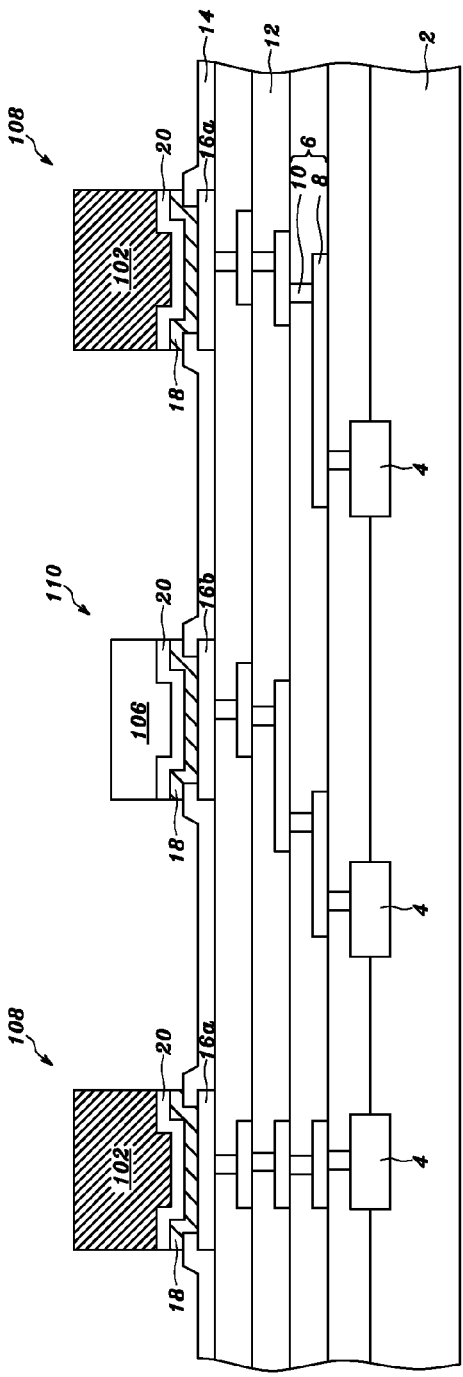
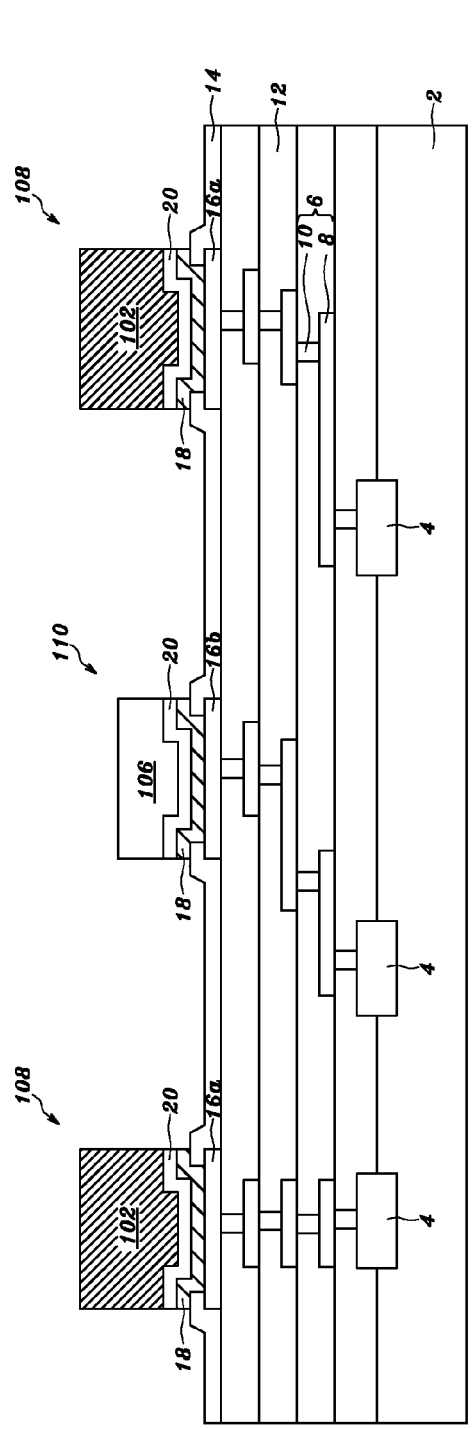
Fig. 7C
Fig. 7D

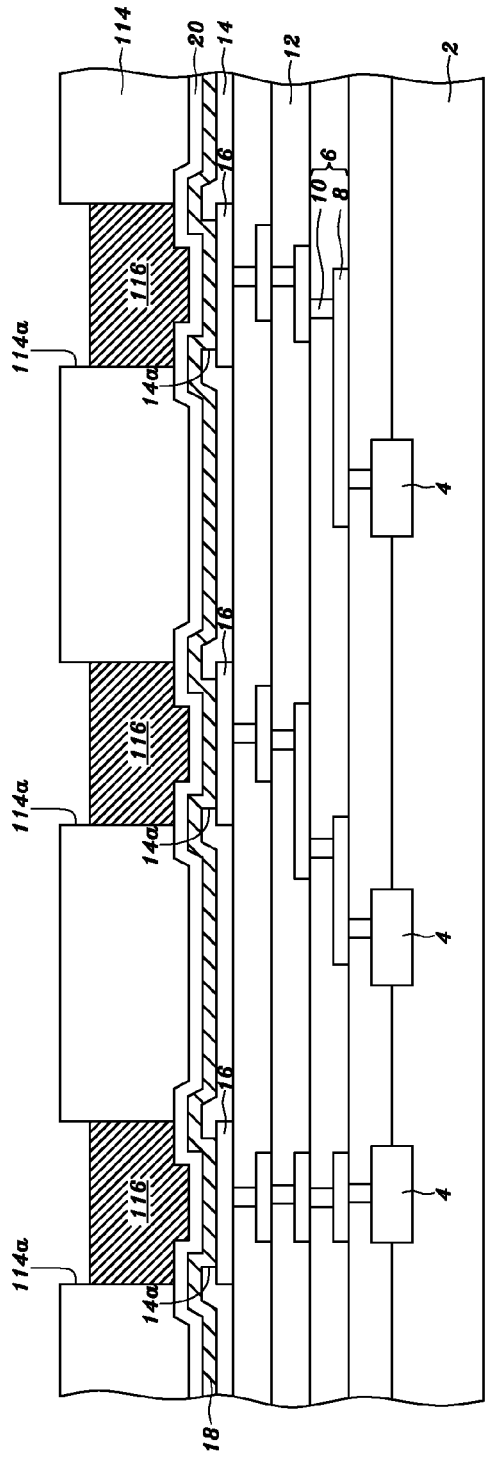
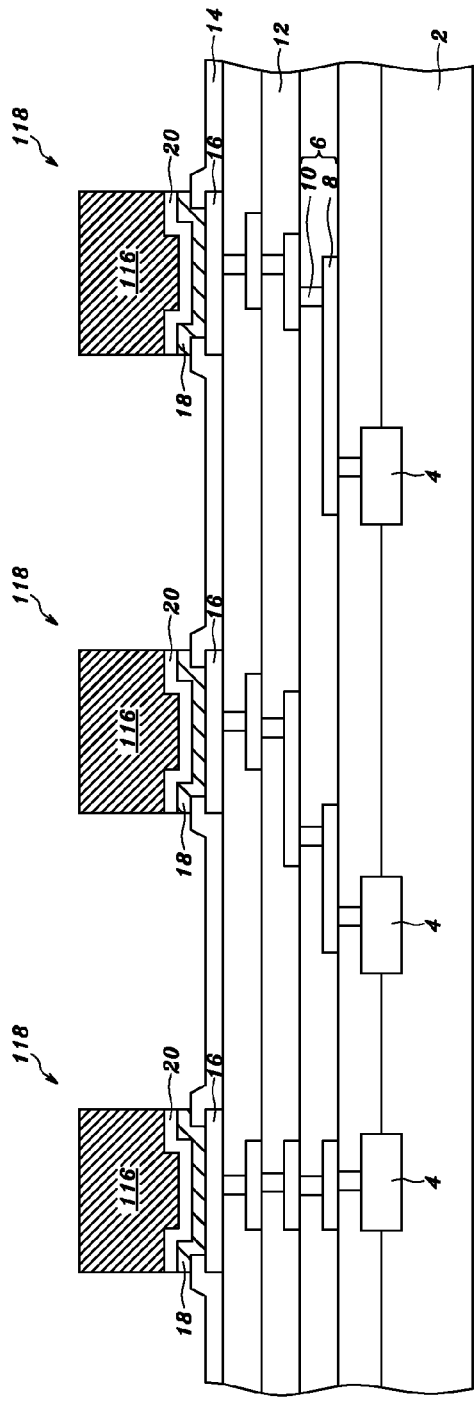
Fig. 8A
Fig. 8B

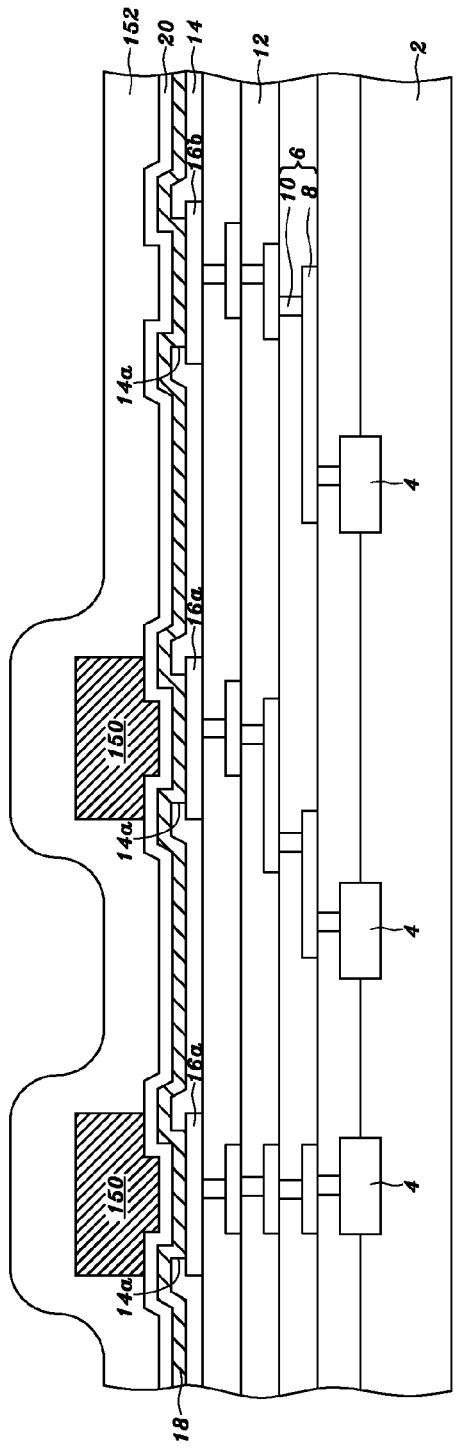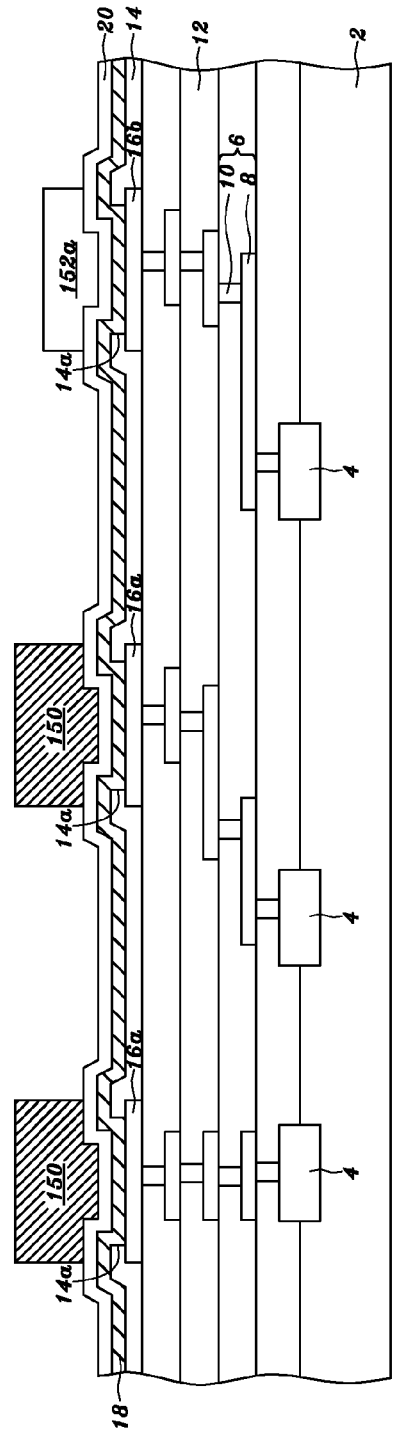
Fig. 11C
Fig. 11D

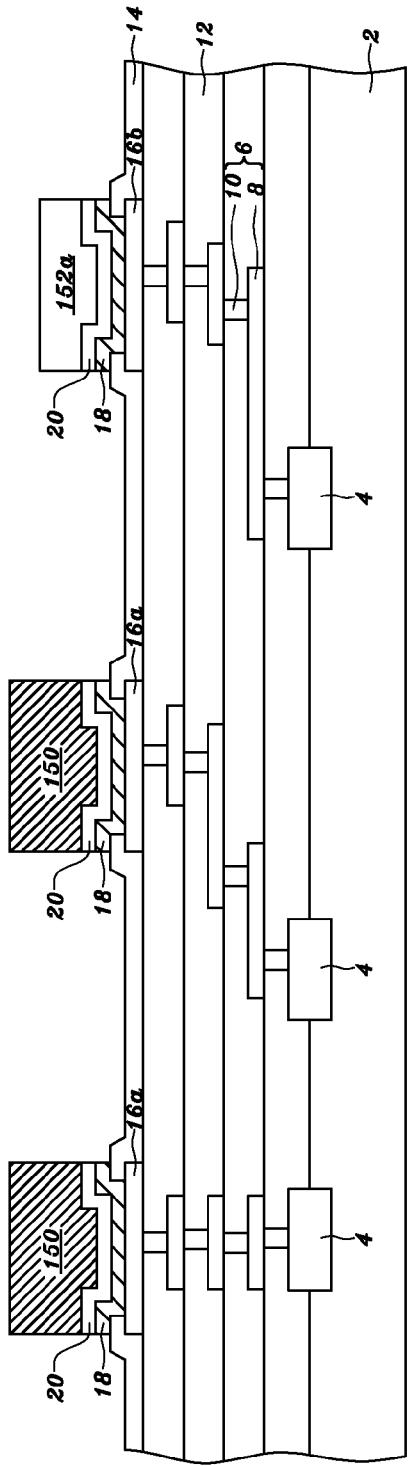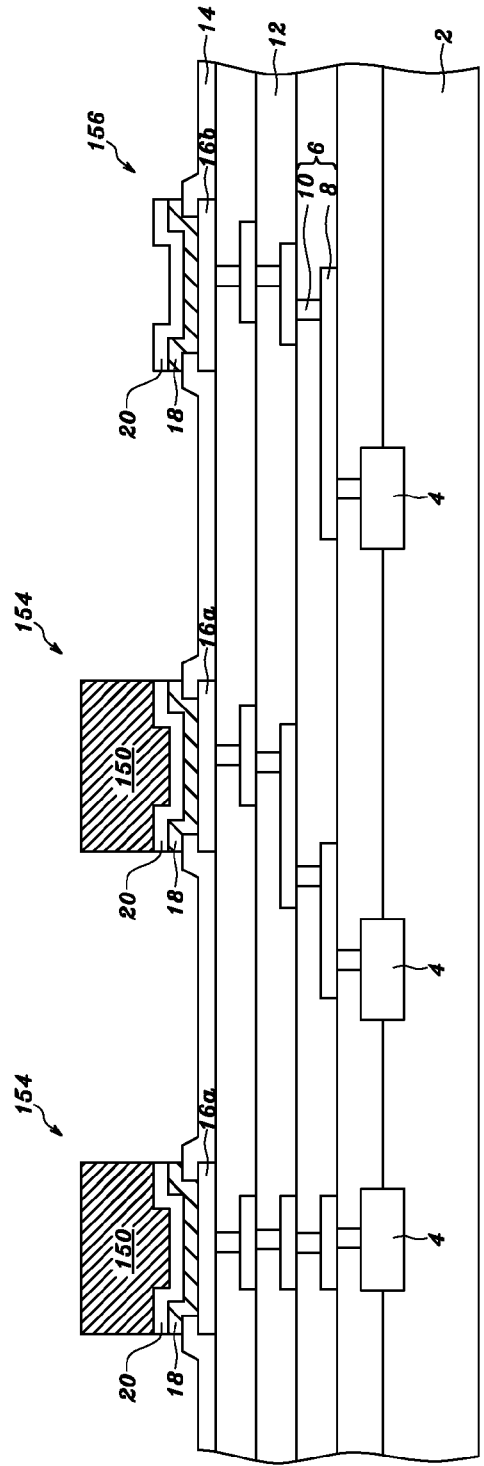

_US 8,836,146 B2_

CHIP PACKAGE AND METHOD FOR FABRICATING THE SAME

This application claims priority to U.S. provisional application No. 60/767,080, filed on Mar. 2, 2006, which are herein incorporated by reference in their entirety.

BACKGROUND OF THE INVENTION

1. Field of the Invention

The present invention relates to a chip package and a method for fabricating the same. More particularly, the present invention relates to a chip package having two different kinds of metal pads over a same semiconductor substrate and a method for forming the same.

2. Brief Description of the Related Art

At present, the market for multimedia applications is expanding rapidly. The integrated circuit (IC) packaging techniques, therefore, also need to be able to accommodate the developing trends of electronic devices, such as, digitalization, networking, localization, and user friendliness. In order to meet the above requirements, electronic devices must be multifunctional, highly integrated, miniaturized and light weighted, inexpensive, and must provide a high operating speed. High-density packages, such as, ball grid arrays (BGAs), chip scale packages (CSPs), flip chips, and multichip modules (MCMs) thereby have been developed. For high-density IC packaging, the speed of signal transmission increases as the wiring length decreases. Thus, the application of bumps has become the main trend in high-density packaging.

Further, in this packaging structure, solder bumps are used as a medium for electrical connections of a semiconductor chip to another one. Besides, multiple wires formed by a wirebonding process connect the semiconductor chip to a printed circuit board.

Conventionally, a majority of the bonding pads on a semiconductor wafer is formed of aluminum. If solder bumps and wirebonds are to be formed on a same chip, some damage to original aluminum pad could easily occur when an under bump metallurgy (UBM) layer acting with an adhesion function and a barrier function is formed on the original pads for solder bumps. The under bump metallurgy layer is etched by hydrofluoric acid (HF), which leads the aluminum pads for being wirebonded thereto to be damaged by the etchant of hydrofluoric acid (HF).

SUMMARY OF THE INVENTION

One objective of the present invention is to provide a chip package having two different kinds of metal pads over a same semiconductor substrate.

One objective of the present invention is to provide a chip package having a pad connected to a tin-containing layer and another pad connected to a wire.

One objective of the present invention is to provide a chip package having a pad connected to a tin-containing layer and another pad connected to a tape.

One objective of the present invention is to provide a chip package having a pad connected to a tin-containing layer and another pad connected to an external circuit using an anisotropic conductive film (ACF) or an anisotropic conductive paste (ACP).

One objective of the present invention is to provide a chip package having metal pads with a same thickness over a same semiconductor substrate.

One objective of the present invention is to provide a chip package having metal pads with different thicknesses over a same semiconductor substrate.

In order to reach the above objectives, a chip package is provided with a semiconductor substrate, a first metal pad over the semiconductor substrate, and a second metal pad over the semiconductor substrate. In a case, the first metal pad is tape automated bonded thereto, and the second metal pad is solder bonded thereto. In another case, the first metal pad is tape automated bonded thereto, and the second metal pad is wirebonded thereto. In another case, the first metal pad is solder bonded thereto, and the second metal pad is wirebonded thereto. In another case, the first metal pad is bonded to an external circuitry using an anisotropic conductive film (ACF) or anisotropic conductive paste (ACP), and the second metal pad is solder bonded thereto. In another case, the first metal pad is bonded to external circuitry using an anisotropic conductive film (ACF) or anisotropic conductive paste (ACP), and the second metal pad is wirebonded thereto.

To enable the objectives, technical contents, characteristics and accomplishments of the present invention, the embodiments of the present invention are to be described in detail in cooperation with the attached drawings below.

BRIEF DESCRIPTION OF THE DRAWINGS

FIG. 2A to FIG. 2I are sectional views schematically showing the fabrication process according to one embodiment of the present invention.

FIG. 3A to FIG. 3E are sectional views schematically showing the fabrication process according to one embodiment of the present invention.

FIG. 4 is a sectional view schematically showing a multichip package according to one embodiment of the present invention.

FIG. 7A to FIG. 7G are sectional views schematically showing the fabrication process according to one embodiment of the present invention.

FIG. 8A to FIG. 8F are sectional views schematically showing the fabrication process according to one embodiment of the present invention.

FIG. 11A to FIG. 11J are sectional views schematically showing the fabrication process according to one embodiment of the present invention.

DETAILED DESCRIPTION OF THE INVENTION

The present invention provides a chip package having two different kinds of metal pads over a same semiconductor substrate of a chip. These metal pads can be used to be wirebonded thereto, to be tape automated bonded (TAB) thereto, to have a metal bump formed thereon, to have a tin-containing bump formed thereon, to be connected to an external circuit through an ACF or ACP.

Each of the structures disclosed by the present invention is constructed over a passivation layer of a semiconductor wafer. After the structures of the present invention have been constructed, the semiconductor wafer is diced into multiple semiconductor chips. Under the above mentioned passivation layer, there is a semiconductor substrate. A circuit structure and multiple dielectric layers are interposed between the passivation layer and the semiconductor substrate. Openings in the passivation layer expose bonding pads of the circuit structure over the semiconductor substrate. The semiconductor substrate, the circuit structure, the dielectric layers, the bonding pads and the passivation layer, together with the methods for fabricating the structures, are to be described below.

Figure 1:
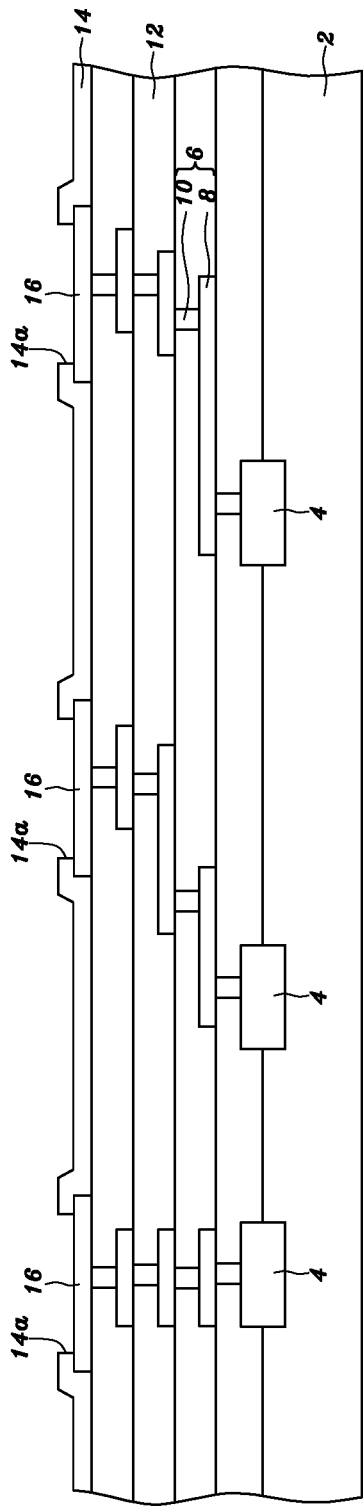
FIG. 1 is a sectional view schematically showing a semiconductor wafer according to the present invention.

Referring to FIG. 1, the semiconductor substrate 2 may be a silicon substrate, a GaAs substrate, or a SiGe substrate. Multiple semiconductor devices 4 are formed in or over the semiconductor substrate 2. The semiconductor device 4 may be a passive device or an active device, wherein the passive device may be a resistor, a capacitor or an inductor, and the active device may be a MOS (Metal Oxide Semiconductor) device. The MOS device may be a p-channel MOS device, an n-channel MOS device, a CMOS (Complementary Metal Oxide Semiconductor), a BJT (Bipolar Junction Transistor) or a BiCMOS (Bipolar CMOS) device.

A circuit structure 6 is formed over the semiconductor substrate 2. The circuit structure 6 comprises multiple metal layers 8 having a thickness of less than 3 µm and multiple metal plugs 10. For example, the metal layer 8 and the metal plug 10 are made of copper. Alternatively, the metal layer 8 is made of aluminum, and the metal plug 10 is made of tungsten. The metal layer 8 may be fabricated by a damascene process including sputtering a adhesion/barrier layer, such tantalum or tantalum nitride, on an insulating layer, composed of Low-K oxide and oxynitride on the Low-K oxide, and in and on an opening in the insulating layer, then sputtering a first copper layer on the adhesion/barrier layer, then electroplating a second copper layer on the first copper layer, then removing the first and second copper layers outside the opening in the insulating layer. Alternatively, the metal layer 8 may be fabricated by a process including sputtering an aluminum-alloy layer, containing more than 90 wt % aluminum and less than 10 wt % copper, on an insulating layer, such as oxide, then patterning the aluminum-alloy layer using photolithography and etching processes.

Multiple dielectric layers 12 having a thickness of less than 3 micrometers (µm) are located over the semiconductor substrate 2 and respectively interposed between the metal layers 8, and the neighboring metal layers are interconnected through the metal plugs 10 inside the dielectric layer 12. The dielectric layer 12 is commonly fabricated by a chemical vapor deposition (CVD) process. The material of the dielectric layer 12 may include silicon oxide, TEOS (Tetraethoxysilane), a compound containing silicon, carbon, oxygen and hydrogen (such as $Si_wC_xO_yH_z$), silicon nitride (such as $Si_3N_4$), silicon oxynitride, FSG (Fluorinated Silicate Glass), Black Diamond, SiLK, a porous silicon oxide, a porous compound containing nitrogen, oxygen and silicon, SOG (Spin-On Glass), a polyarylene ether, PBO (Polybenzoxazole), or a material having a low dielectric constant (K), between 1.5 and 3, for example.

A passivation layer 14 is formed over the circuit structure 6 and the dielectric layers 12. The passivation layer 14 can protect the semiconductor devices 4 and the circuit structure 6 from being damaged by moisture and foreign ion contamination. In other words, the passivation layer 14 can prevent mobile ions (such as sodium ion), transition metals (such as gold, silver and copper) and impurities from penetrating through the passivation layer 14 to the semiconductor devices 4, such as transistors, polysilicon resistor elements and polysilicon-polysilicon capacitor elements, and the circuit structure 6. The passivation layer 14 is commonly made of silicon oxide (such as $SiO_2$), PSG (phosphosilicate glass), silicon nitride (such as $Si_3N_4$), or silicon oxynitride. The passivation layer 14 commonly has a thickness of more than 0.35 µm. In a preferred case, the silicon-nitride layer has a thickness of more than 0.3 µm. Ten methods for depositing the passivation layer 14 are described as below.

In a first method, the passivation layer 14 is formed by depositing a silicon oxide layer with a thickness of between 0.2 and 1.2 µm using a CVD method and then depositing a silicon nitride layer with a thickness of 0.2 and 1.2 µm on the silicon oxide layer using a CVD method.

In a second method for depositing the passivation layer 14, a silicon oxide layer having a thickness of between 0.2 and 1.2 µm is firstly formed with a CVD method; next, a silicon oxynitride layer having a thickness of between 0.05 and 0.15 µm is formed over the silicon oxide layer with a Plasma Enhanced CVD (PECVD) method; then, a silicon nitride layer having a thickness of between 0.2 and 0.12 µm is formed over the silicon oxynitride layer with a CVD method.

In a third method for depositing the passivation layer 14, a silicon oxynitride layer having a thickness of between 0.05 and 0.15 µm is firstly formed with a CVD method; next, a silicon oxide layer having a thickness of between 0.2 and 1.2 µm is formed over the silicon oxynitride layer with a CVD method; then, a silicon nitride layer having a thickness of between 0.2 and 0.12 µm is formed over the silicon oxide layer with a CVD method.

In a fourth method for depositing the passivation layer 14, a first silicon oxide layer having a thickness of between 0.2 and 0.5 µm is firstly formed with a CVD method; next, a second silicon oxide layer having a thickness of between 0.5 and 1 µm is formed over the first silicon oxide layer with a spin-coating method; next, a third silicon oxide layer having a thickness of between 0.2 and 0.5 µm is formed over the second silicon oxide layer with a CVD method; then, a silicon nitride layer having a thickness of 0.2 and 1.2 µm is formed over the third silicon oxide with a CVD method.

In a fifth method for depositing the passivation layer 14, a silicon oxide layer having a thickness of between 0.5 and 2 µm is firstly formed with a High Density Plasma CVD (HDP-CVD) method; then, a silicon nitride layer having a thickness of 0.2 and 1.2 µm is formed over the silicon oxide layer with a CVD method.

In a sixth method for depositing the passivation layer 14, an Undoped Silicate Glass (USG) layer having a thickness of between 0.2 and 3 µm is firstly formed; next, an insulating layer having a thickness of between 0.5 and 3 µm is formed over the USG layer, wherein the insulating layer is made of TEOS, PSG or BPSG (borophosphosilicate glass); then, a silicon nitride layer having a thickness of 0.2 and 1.2 µm is formed over the insulating layer with a CVD method.

In a seventh method for depositing the passivation layer 14, a first silicon oxynitride layer having a thickness of between 0.05 and 0.15 µm is firstly formed with a CVD method optionally; next, a silicon oxide layer having a thickness of between 0.2 and 1.2 µm is formed over the first silicon oxynitride layer with a CVD method; next, a second silicon oxynitride layer having a thickness of between 0.05 and 0.15 µm is optionally formed over the silicon oxide layer with a CVD method; next, a silicon nitride layer having a thickness of between 0.2 and 1.2 µm is formed over the second silicon oxynitride layer or the silicon oxide with a CVD method; next, a silicon oxide layer having a thickness of between 0.2 and 1.2 µm is formed over the first silicon oxynitride layer with a CVD method; next, a third silicon oxynitride layer having a thickness of between 0.05 and 0.15 µm is optionally formed over the silicon nitride layer with a CVD method; then, a silicon oxide layer having a thickness of between 0.2 and 1.2 µm is formed over the third silicon oxynitride layer or the silicon nitride layer with a CVD method.

In a eighth method for depositing the passivation layer 14, a first silicon oxide layer having a thickness of between 0.2 and 0.5 µm is firstly formed with a CVD method; a second silicon oxide layer having a thickness of between 0.5 and 1 µm is formed over the first silicon oxide layer with a spin-coating method; next, a third silicon oxide layer having a thickness of between 0.2 and 1.2 µm is formed over the second silicon oxide layer with a CVD method; next, a silicon nitride layer having a thickness of between 0.2 and 1.2 µm is formed over the third silicon oxide layer with a CVD method; then, a fourth silicon oxide layer having a thickness of between 0.2 and 1.2 µm is formed over the silicon over nitride layer with a CVD method.

In a ninth method for depositing the passivation layer 14, a first silicon oxide layer having a thickness of between 0.5 and 2 µm is firstly formed with a HDP-CVD method; next, a silicon nitride layer having a thickness of between 0.2 and 1.2 µm is formed over the first silicon oxide layer with a CVD method; then, a second silicon oxide layer having a thickness of between 0.5 and 2 µm is formed over the silicon nitride with a HDP-CVD method.

In a tenth method for depositing the passivation layer 14, a first silicon nitride layer having a thickness of between 0.2 and 1.2 µm is firstly formed with a CVD method; next, a silicon oxide layer having a thickness of between 0.2 and 1.2 µm is formed over the first silicon nitride layer with a CVD method; then, a second silicon nitride layer having a thickness of between 0.2 and 1.2 µm is formed over the silicon oxide layer with a CVD method.

Referring to FIG. 1, multiple openings 14a in the passivation layer 14 expose multiple bonding pads 16 for inputting/outputting signals or for being connected to a power source or a ground reference. The bonding pads 16 may be composed of sputtered aluminum or sputtered aluminum-copper alloy, or electroplated copper having a bottom surface and side walls covered by a barrier layer, such as tantalum or tantalum nitride.

The openings 14a each have a maximum transverse dimension of between 5 and 40 µm or between 40 and 300 µm. The shape of the openings 14a may be a circle, and the diameter of the circle-shaped opening 14 may be between 5 and 40 µm or between 40 and 300 µm. The shape of the openings 14a may be a square, the greatest diagonal length of the square-shaped opening 14 may be between 5 and 40 µm or between 40 and 300 µm. The shape of the openings 14a may be a polygon, the greatest diagonal length of a polygon may be between 5 and 40 µm or between 40 and 300 µm. The shape of the openings 14a may also be a rectangle, and the rectangle-shaped opening 14a has a length of between 80 and 200 µm and a width of between 40 and 110 µm. Further, the semiconductor device 4 may be below the bonding pad 16 exposed by the opening 14a. Alternatively, there may be no semiconductor device 4 under the bonding pad 16 exposed by the opening 14a.

A metal cap (not shown in the drawing) may be optionally formed on the bonding pad 16 exposed by the opening 14a in the passivation layer 14 to prevent the bonding pad 16 from oxidation or contamination. The metal cap may be an aluminum layer, a gold layer, a titanium layer, a titanium-tungsten alloy layer, a tantalum layer, a tantalum nitride layer or a nickel layer. For example, when the bonding pad 16 is a copper pad, the metal cap (such as aluminum layer) is used to protect the copper pad from oxidation. Alternatively, when the metal cap is an aluminum layer, a barrier layer is interposed between the aluminum layer and the bonding pad 16. The barrier layer may be made of titanium, titanium nitride, titanium-tungsten alloy, tantalum, tantalum nitride, chromium or nickel. Such a structure with the metal cap may be applied to the following embodiments. Below, only the cases without the metal cap are discussed.

So far, the description of the semiconductor substrate 2, the circuit structure 6, the dielectric layers 12, the passivation layer 14 and the bonding pads 16 can be applied to all the following embodiments.

Embodiment 1

FIG. 2A to FIG. 2H are schematic cross-sectional views showing a method for forming a tin-containing metal layer or bump and a metal pad or bump over a semiconductor wafer.

Figure 2A:
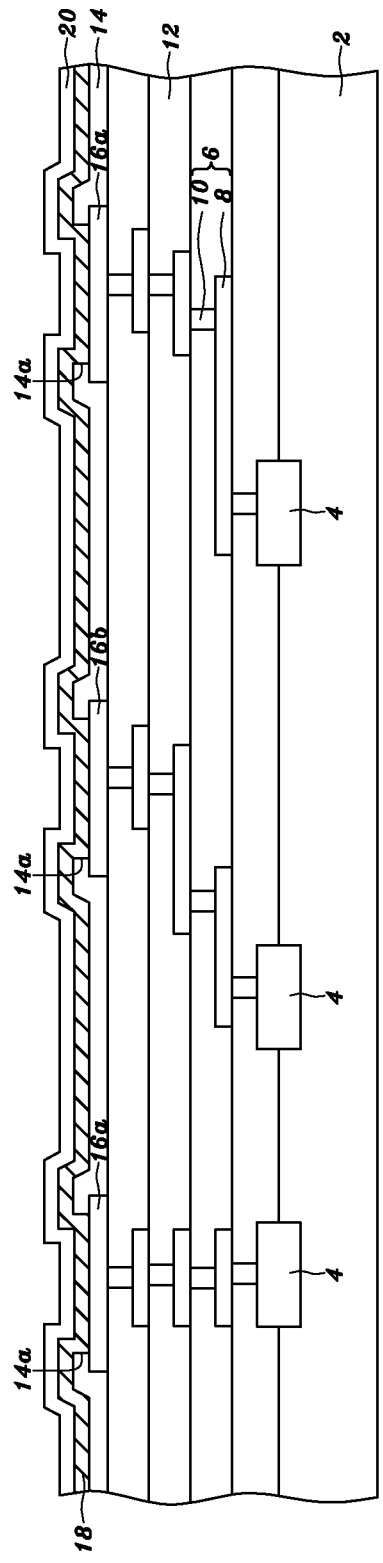

Referring to FIG. 2A, the bonding pads 16 comprise multiple first bonding pads 16a (only two is shown) and multiple second bonding pads 16b (only one is shown). An adhesion/barrier layer 18 having a thickness of 0.01 and 3 µm is formed on the passivation layer 14, on the first bonding pad 16a exposed by the opening 14a, and on the second bonding pad 16b exposed by the opening 14a. The thickness of the adhesion/barrier layer 18 is preferred to be between 0.01 and 1 µm. The material of the adhesion/barrier layer 18 may include titanium, tungsten, cobalt, nickel, titanium nitride, a titanium-tungsten alloy, a nickel-vanadium alloy, aluminum, chromium, copper, gold, protactinium, platinum, palladium, ruthenium, rhodium, silver, or a composite of the above mentioned materials. The adhesion/barrier layer 18 may be fabricated by a sputtering method or a vapor deposition method.

Next, a seed layer 20 having a thickness of 0.005 and 2 µm is formed on the adhesion/barrier layer 18 with a sputtering method, a vapor deposition method, an electroplating method, an electroless plating method or a PVD (Physical Vapor Deposition) method. The thickness of the seed layer 20 is preferred to be between 0.01 and 0.7 µm. The seed layer 20 is beneficial to electroplating a metal layer thereon. Thus, the material of the seed layer 20 varies with the material of the succeeding metal layer formed on the seed layer 20. When a copper metal layer is to be electroplated on the seed layer 20, copper is a preferable material to the seed layer 20. When a gold metal layer is to be electroplated on the seed layer 20, gold is a preferable material to the seed layer 20. When a palladium metal layer is to be electroplated on the seed layer 20, palladium is a preferable material to the seed layer 20. When a platinum metal layer is to be electroplated on the seed layer 20, platinum is a preferable material to the seed layer 20. When a rhodium metal layer is to be electroplated on the seed layer 20, rhodium is a preferable material to the seed layer 20. When a ruthenium metal layer is to be electroplated on the seed layer 20, ruthenium is a preferable material to the seed layer 20. When a rhenium metal layer is to be electroplated on the seed layer 20, rhenium is a preferable material to the seed layer 20. When a nickel metal layer is to be electroplated on the seed layer 20, nickel is a preferable material to the seed layer 20.

When the adhesion/barrier layer 18 is formed by sputtering a titanium layer with a thickness of between 3000 and 8000 angstroms, the seed layer 20 can be formed by sputtering a gold layer with a thickness of between 100 and 3000 angstroms on the titanium layer. When the adhesion/barrier layer 18 is formed by sputtering a titanium-tungsten layer with a thickness of between 3000 and 8000 angstroms, the seed layer 20 can be formed by sputtering a gold layer with a thickness of between 100 and 3000 angstroms on the titanium-tungsten layer. When the adhesion/barrier layer 18 is formed by sputtering a titanium layer with a thickness of between 3000 and 8000 angstroms, the seed layer 20 can be formed by sputtering a copper layer with a thickness of between 100 and 3000 angstroms on the titanium layer. When the adhesion/barrier layer 18 is formed by sputtering a titanium-tungsten layer with a thickness of between 3000 and 8000 angstroms, the seed layer 20 can be formed by sputtering a copper layer with a thickness of between 100 and 3000 angstroms on the titanium-tungsten layer.

Figure 2B:
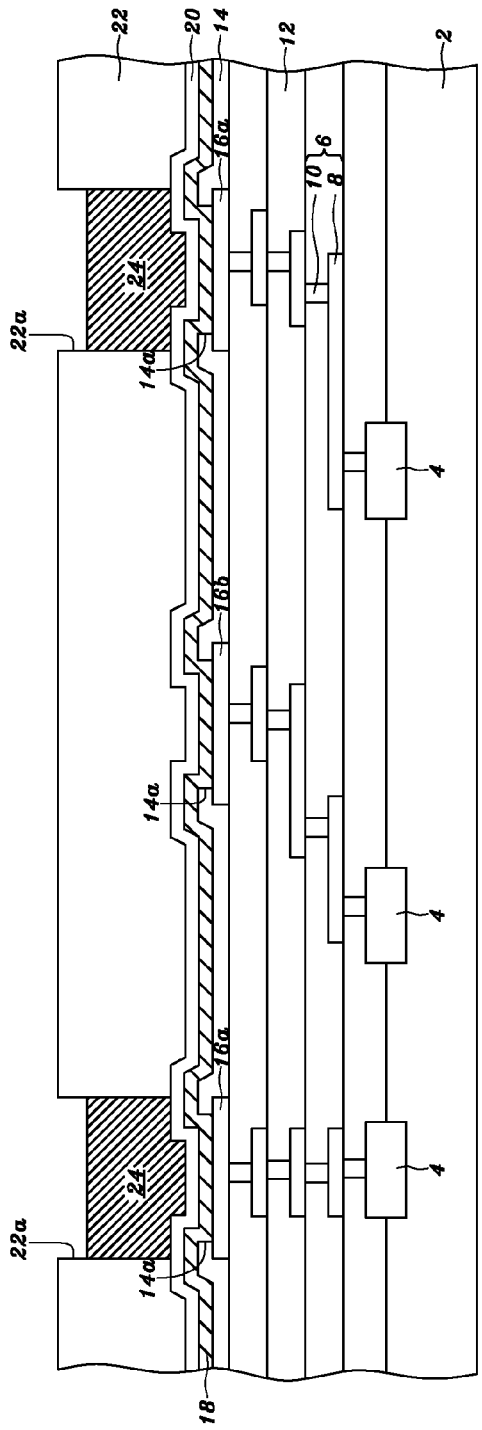

Referring to FIG. 2B, a photoresist layer 22 is formed on the seed layer 20, and the photoresist layer 22 is patterned with exposing and developing processes to form an opening 22a in the photoresist layer 22, exposing the seed layer 20 over the first bonding pad 16a. A 1X stepper or a 1X scanner is used to expose the photoresist layer 22. Next, a metal layer 24 is formed on the seed layer 20 exposed by the opening 22a. The metal layer 24 has a thickness of between 1 and 200 μm and, for example, a thickness of between 1 and 50 μm. The thickness of the metal layer 24 is preferred to be between 2 and 30 μm. The metal layer 24 may be deposited by an electroplating method or an electroless plating method. The metal layer 24 may be a single layer made of gold, copper, silver, palladium, platinum, rhodium, ruthenium, rhenium, or nickel. The metal layer 24 may also be a composite layer made of the above mentioned metals.

For example, the metal layer 24 may be deposited by electroplating a gold layer with a thickness of between 8 and 35 μm on the seed layer 20 made of gold exposed by the opening 22a. Alternatively, the metal layer 24 may be deposited by electroplating a copper layer with a thickness of between 8 and 35 μm on the seed layer 20 made of copper exposed by the opening 22a. Alternatively, the metal layer 24 is formed by electroplating a copper layer with a thickness of between 8 and 35 μm on the seed layer 20 made of copper exposed by the opening 22a in the photoresist layer 22, next electroplating a nickel layer with a thickness of between 0.1 and 10 μm, and preferably with a thickness of between 0.1 and 5 μm, on the copper layer in the opening 22a, next electroplating a gold layer with a thickness of between 0.01 and 10 μm, and preferably with a thickness of between 0.1 and 2 μm, on the nickel layer in the opening 22a.

Figure 2C:
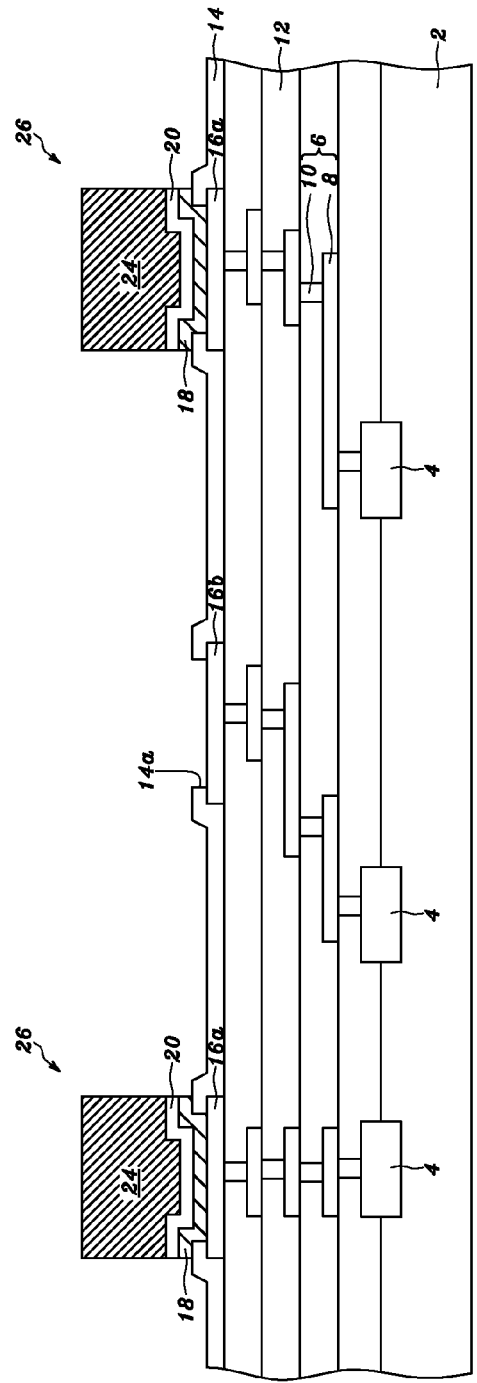

Referring to FIG. 2C, after the metal layer 24 is formed, the photoresist layer 22 is removed. Next, the seed layer 20 and the adhesion/barrier layer 18 not under the metal layer 24 are removed. The adhesion/barrier layer 18 can be removed with a dry-etching method or a wet-etching method. The dry-etching method may be implemented with an argon sputter process. Alternatively, the adhesion/barrier layer 18 not under the metal layer 24 is wet etched using an etchant containing an H2O2 liquid in case that the adhesion/barrier layer 18 is a titanium-tungsten alloy or titanium. If the seed layer 20 is made of gold, it can be removed with an iodine-containing etchant, such as a potassium iodine solution.

A metal pad or bump 26 is formed on the first bonding pad 16a exposed by the opening 14a in the passivation layer 14. The metal pad or bump 26 comprises an adhesion/barrier layer 18, a seed layer 20 on the adhesion/barrier layer 18 and a metal layer 24 on the seed layer 20. The metal pad or bump 26 may have a wire (such as a gold wire or a copper wire) bonded thereon by a wire-bonding process, may have a tape bonded thereon using a tape automated bonding (TAB) process, may be bonded with a metal bump (such as a gold bump) preformed on an external circuit, may be bonded with a tin-containing bump preformed on an external circuit, or may be bonded with an external circuit using an anisotropic conductive film (ACF) or an anisotropic conductive paste (ACP). The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a discrete passive device, such as inductor, capacitor, resistor or filter.

For example, when the metal layer 24 is a gold layer and a wire is bonded to the gold layer using a wirebonding process, the thickness of the gold layer is preferred to be between 2 and 10 μm. When the metal layer 24 is a gold layer and a tape is bonded to the gold layer using a tape automated bonding (TAB) process, the thickness of the gold layer is preferred to be between 10 and 30 μm.

Figure 2D:
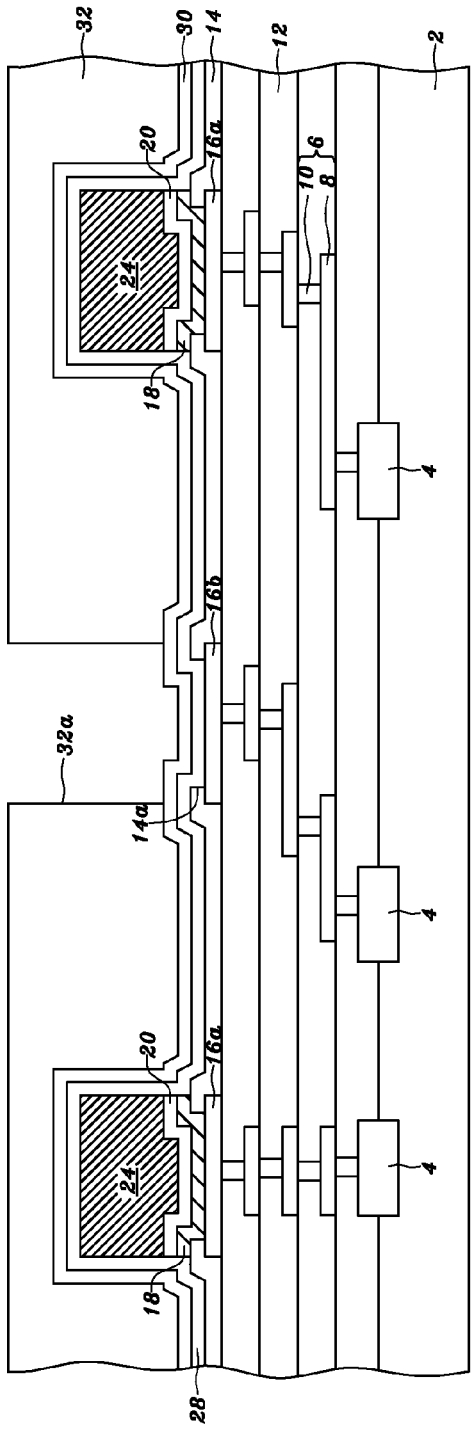

After the metal pad or bump 26 is formed, a tin-containing layer may be formed over the second bonding pad 16b. Referring to FIG. 2D, an adhesion/barrier layer 28 having a thickness of 0.01 and 3 μm is formed on the passivation layer 14, on the second bonding pad 16b exposed by the opening 14a and on the metal pad or bump 26. The thickness of the adhesion/barrier layer 28 is preferred to be between 0.01 and 1 μm. The material of the adhesion/barrier layer 28 may include titanium, tungsten, cobalt, nickel, titanium nitride, a titanium-tungsten alloy, a nickel-vanadium alloy, aluminum, chromium, copper, gold, protactinium, platinum, palladium, ruthenium, rhodium, silver, or a composite of the above mentioned materials. The adhesion/barrier layer 28 may be fabricated by a sputtering method or a vapor deposition method.

Next, a seed layer 30 having a thickness of 0.005 and 2 μm is formed on the adhesion/barrier layer 28 with a sputtering method, a vapor deposition method, an electroplating method, an electroless plating method or a PVD method. The thickness of the seed layer 30 is preferred to be between 0.01 and 0.7 μm. The seed layer 30 is beneficial to electroplating a metal layer thereon. Thus, the material of the seed layer 30 varies with the material of the succeeding metal layer formed on the seed layer 30. When a copper metal layer is to be electroplated on the seed layer 30, copper is a preferable material to the seed layer 30. When a gold metal layer is to be electroplated on the seed layer 30, gold is a preferable material to the seed layer 30.

When the adhesion/barrier layer 28 is formed by sputtering a titanium layer with a thickness of between 3000 and 8000 angstroms, the seed layer 30 can be formed by sputtering a copper layer with a thickness of between 100 and 3000 angstroms on the titanium layer. When the adhesion/barrier layer 28 is formed by sputtering a titanium-tungsten layer with a thickness of between 3000 and 8000 angstroms, the seed layer 30 can be formed by sputtering a copper layer with a thickness of between 100 and 3000 angstroms on the titanium-tungsten layer. When the adhesion/barrier layer 28 is formed by sputtering a chromium layer with a thickness of between 1000 and 8000 angstroms and then sputtering a chromium-copper-alloy layer with a thickness of between 100 and 5000 angstroms on the chromium layer, the seed layer 30 can be formed by sputtering a copper layer with a thickness of between 100 and 3000 angstroms on the chromium-copper-alloy layer. When the adhesion/barrier layer 28 is formed by sputtering an aluminum layer with a thickness of between 1000 and 8000 angstroms and then sputtering a nickel-vanadium-alloy layer with a thickness of between 100 and 5000 angstroms on the aluminum layer, the seed layer 30 can be formed by sputtering a copper layer with a thickness of between 100 and 3000 angstroms on the nickel-vanadium-alloy layer.

Next, a photoresist layer 32 is formed on the seed layer 30, and the photoresist layer 32 is patterned with exposing and developing processes to form multiple openings 32a (only one is shown) in the photoresist layer 32, exposing the seed layer 30 over the second bonding pad 16b. Preferably, a 1X stepper or a 1X scanner is used to expose the photoresist layer 32.

Figure 2E:
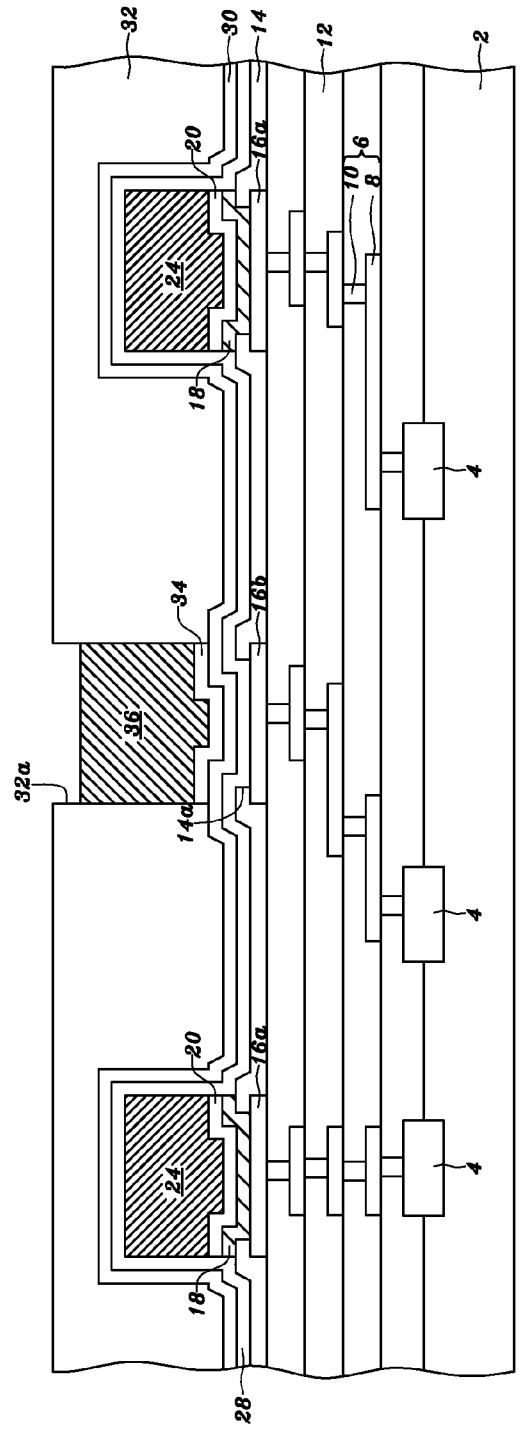

Referring to FIG. 2E, a diffusion barrier layer 34 is formed on the seed layer 30 exposed by the opening 32a. The diffusion barrier layer 34 is formed by, for example, first electroplating a copper layer with a thickness of between 0.5 and 10 µm on the seed layer 30 made of copper exposed by the opening 32a in the photoresist layer 32, next electroplating a nickel layer with a thickness of between 0.1 and 5 µm on the copper layer in the opening 32a in the photoresist layer 32. The diffusion barrier layer 34 is a copper-nickel composite layer.

Next, a tin-containing metal layer or bump 36 is electroplated on the diffusion barrier layer 34 in the opening 32a. The thickness of the tin-containing metal layer or bump 36 is between 1 and 500 µm, and preferably between 3 and 250 µm, for example. Alternatively, the tin-containing metal layer or bump 36 may be deposited by an electroless plating method or a screen printing process. The tin-containing metal layer or bump 36 is, for example, a tin-lead alloy, a tin-silver alloy, a tin-silver-copper alloy, a lead-free alloy. Using a tin-lead solder for illustration, the weight ratio of tin to lead can be adjusted accordingly. A typical weight ratio of lead to tin is 90/10, 95/5, 97/3 or 37/63, etc.

The embodiment may include forming a solder wettable layer (not shown) on the diffusion barrier layer 34 to increase the bonding ability between the subsequently formed the tin-containing metal layer or bump 36 and the diffusion barrier layer 34. The solder wettable layer is, for example, gold, copper, tin, a tin-lead alloy, a tin-silver alloy, a tin-silver-copper alloy, or a lead-free alloy etc. For example, after forming the nickel layer of the diffusion barrier layer 34, a solder wettable layer made of gold with a thickness of between 100 and 3000 angstroms is electroplated on the nickel layer of the diffusion barrier layer 34 in the opening 32a, followed by electroplating the tin-containing metal layer or bump 36 on the solder wettable layer.

Referring to FIG. 2F, after forming the tin-containing metal layer or bump 36, the photoresist layer 32 is removed. Thereafter, the seed layer 30 and the adhesion/barrier layer 28 not under the tin-containing metal layer or bump 36 are removed. The adhesion/barrier layer 28 can be removed with a dry-etching method or a wet-etching method. The dry-etching method may be implemented with an argon sputter process. Alternatively, the adhesion/barrier layer 28 not under the tin-containing metal layer or bump 36 is wet etched using an etchant containing an H2O2 liquid in case that the adhesion/barrier layer 28 is a titanium-tungsten alloy or titanium.

Referring to FIG. 2G, a reflow process is performed to lead the tin-containing metal layer or bump 36 to be formed like a global shape. Alternatively, a reflow method may be first performed to lead the tin-containing metal layer or bump 36 to be formed like a global shape, followed by removing the adhesion/barrier layer 28 and the seed layer 30 not under tin-containing metal layer or bump 36. Alternatively, the reflow process may be performed until the tin-containing metal layer or bump 36 is connected to an external circuit. The tin-containing metal layer or bump 36 may be joined with an external circuit, such as semiconductor chip, printed circuit board (PCB) comprising a glass fiber as a core, flexible tape comprising a polymer layer (such as polyimide) having a thickness of between 30 and 200 µm and not comprising any polymer layer with glass fiber, ceramic substrate comprising a ceramic material as insulating layers between circuit layers, glass substrate having circuit layers made of Indium Tin Oxide (ITO), or discrete passive device, such as inductor, capacitor, resistor or filter.

The present invention provides the metal pads or bumps 26 on the some of the bonding pads 16 exposed by the opening 14a in the passivation layer 14, and provides the tin-containing metal layer or bump 36 over some of the bonding pads 16 not having the metal pad or bump 26 formed thereon. The metal pads or bumps 26 may be joined with a wire (such as a gold wire or a copper wire) by a wire-bonding process, joined with a tape by a TAB process, joined with a metal bump (such as gold bump) preformed on an external circuit, joined with a tin-containing layer or bump preformed on an external circuit, or joined with an external circuit using an ACF or an ACP. The external circuit may be a semiconductor chip, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, a glass substrate having circuit layers made of Indium Tin Oxide (ITO), or a discrete passive device, such as inductor, capacitor, resistor or filter.

The metal pads or bumps 26 may have a topmost wettable layer, such as gold, used to be wirebonded thereto. In some case, the tin-containing metal layer or bump 36 can be formed on a gold layer, serving as a wettable layer, on the diffusion barrier layer 34. Furthermore, the tin-containing metal layer or bump 36 in the present invention can be replaced by another kind of solder bump.

Referring to FIG. 2H, after completing the above-mentioned process, the semiconductor substrate 2 is diced into multiple semiconductor chips 38. Each of the semiconductor chips 38 comprises a semiconductor substrate 2, a circuit structure 6, multiple dielectric layers 12, a passivation layer 14, at least one metal pad or bump 26, and at least one tin-containing metal layer or bump 36. Multiple semiconductor devices 4, such as transistors or MOS devices, are in or over the semiconductor substrate 2. Some of the semiconductor devices 4 may be under the metal pad or bump 26 or the tin-containing metal layer or bump 36. Two of the semiconductor devices 4 are electrically connected to the metal pad or bump 26 and the tin-containing metal layer or bump 36, respectively. The passivation layer 14 may include a topmost silicon-nitride layer of the individual semiconductor chip 38. Besides, the passivation layer 14 may include a topmost silicon-oxide layer of the individual semiconductor chip 38.

Each semiconductor chip 38 can be connected to an external circuit via the tin-containing metal layer or bump 36. The external circuit may be a semiconductor chip, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, or a discrete passive device, such as inductor, capacitor, resistor or filter.

Alternatively, the metal pad or bump 26 of one semiconductor chip 38 can be bonded with a bonding wire (such as a gold wire or a copper wire) via a wirebonding process and then connected to an external circuit. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter.

Alternatively, the metal pad or bump 26 of one semiconductor chip 38 can be bonded with a tape via a TAB (Tape Automated Bonding) technology and then connected to an external circuit. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter. The tape comprises at least one polymer layer, at least one metal trace made of copper on the polymer layer, and a tin layer or tin-silver-alloy layer on the metal trace. When the tape is bonded to the metal pad or bump 26, the tin layer or tin-silver-alloy layer preformed on the metal trace of the tape can be joined with the metal pad or bump 26.

Alternatively, the metal pad or bump 26 of one semiconductor chip 38 can be pressed into ACF (anisotropic conductive film) or ACP (anisotropic conductive paste) via a thermal-press process; thereby, the metallic particles in the ACF or ACP are clustered between the metal pad or bump 26 and a ITO (Indium-Tin Oxide)-containing pad of an external circuit (such as a glass substrate). By the way, the metal pad or bump 26 and the ITO-containing pad of the external circuit are thus electrically connected to each other. Alternatively, the metal pad or bump 26 of one semiconductor chip 38 can be bonded with other kinds of external circuit, such as semiconductor chip, printed circuit board (PCB) comprising a glass fiber as a core, flexible tape comprising a polymer layer (such as polyimide) having a thickness of between 30 and 200 μm and not comprising any polymer layer with glass fiber, ceramic substrate comprising a ceramic material as insulating layers between circuit layers, or a discrete passive device, such as inductor, capacitor, resistor or filter, using ACF (anisotropic conductive film) or ACP (anisotropic conductive paste).

Alternatively, the metal pad or bump 26 of one semiconductor chip 38 can be bonded with a metal bump (such as a gold bump) preformed on an external circuit, such as semiconductor chip, printed circuit board (PCB) comprising a glass fiber as a core, flexible tape comprising a polymer layer (such as polyimide) having a thickness of between 30 and 200 μm and not comprising any polymer layer with glass fiber, ceramic substrate comprising a ceramic material as insulating layers between circuit layers, or a discrete passive device, such as inductor, capacitor, resistor or filter.

Alternatively, in this embodiment, the semiconductor chips 38 can be connected to external circuits via a tin-containing metal layer or bump 36 before the semiconductor substrate 2 is diced. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter. Next, the semiconductor substrate 2 is diced into multiple semiconductor chips. Then, the metal pad or bump 26 of each semiconductor chip is bonded with a bonding wire (via a wireboning process), with a tape (via a TAB technology), with a metal bump (such as a gold bump) preformed on an external circuit, with a tin-containing metal layer or bump preformed on an external circuit, or with an external circuit via ACF or ACP.

Referring to FIG. 21, in this embodiment, a polymer layer 39 may be beforehand formed on the passivation layer 14; multiple openings 39a and multiple openings 39b expose the first bonding pads 16a and the second bonding pads 16b. Next, according to the steps shown in from FIG. 2A to FIG. 2G, the metal pad or bump 26 is formed on the first bonding pad 16a exposed by the opening 39a in the polymer layer 39, and the tin-containing metal layer or bump 36 is formed on the second bonding pad 16b exposed by the opening 39b in the polymer layer 39. The process for forming the metal pad or bump 26 and the tin-containing metal layer or bump 36 on the bonding pads 16a and 16b can be referred to the above-mentioned process corresponding to FIGS. 2A-2H. During forming the metal pad or bump 26, the above-mentioned adhesion/barrier layer 18 is sputtered on the polymer layer 39, on the bonding pads 16a exposed by the openings 39a in the polymer layer 39, and on the bonding pads 16b exposed by the openings 39b in the polymer layer 39. During forming the tin-containing metal layer or bump 36, the above-mentioned adhesion/barrier layer 28 is sputtered on the polymer layer 39, on the metal pad or bump 26, and on the bonding pads 16b exposed by the openings 39b in the polymer layer 39.

The material of the polymer layer 39 may include PI (polyimide), BCB (benzo-cyclo-butene), polyurethane, epoxy, a parylene-based polymer, a solder-mask material, an elastomer, or a porous dielectric material. The polymer layer 39 can be fabricated by spin-coating, heat-pressing a dry film, or screen-printing. In a case, the polymer layer 39 can be formed by spin-on coating a photosensitive polyimide layer on the passivation layer 14 and on the bonding pads 16a and 16b, followed by exposing the polyimide layer using 1X stepper and scanner, followed by developing the polyimide layer, followed by curing the polyimide layer at the temperature of between 250 and 350 degrees C. in an nitrogen ambient. The polymer layer 39 has a thickness of between 1 and 30 μm. In a preferred case, the polymer layer 39 has a thickness of between 5 and 20 μm.

Alternatively, the tin-containing metal layer or bump 36 can be formed before forming the metal pad or bump 26. The process for forming the tin-containing metal layer or bump 36 on the bonding pad 16b can be referred to the above-mentioned process corresponding to FIGS. 2D-2F. During forming the tin-containing metal layer or bump 36, the above-mentioned adhesion/barrier layer 28 is sputtered on the passivation layer 14 or polymer layer 39, and on the bonding pads 16a and 16b. The process for forming the metal pad or bump 26 on the bonding pad 16a can be referred to the above-mentioned process corresponding to FIGS. 2A-2C. During forming the metal pad or bump 26, the above-mentioned adhesion/barrier layer 18 is sputtered on the passivation layer 14 or polymer layer 39, on the tin-containing metal layer or bump 36, and on the bonding pads 16a.

Embodiment 2

Embodiment 1 can apply to a RDL (Re-Distribution Layer) or an interconnecting trace. Below is to be described an embodiment, wherein a RDL and an interconnecting trace are simultaneously formed over a semiconductor substrate. However, the present invention also includes the case: only a RDL or interconnecting trace is formed over a semiconductor substrate, and a metal pad or bump and a tin-containing metal layer or bump are then formed on the RDL or interconnecting trace.

Figure 3A:
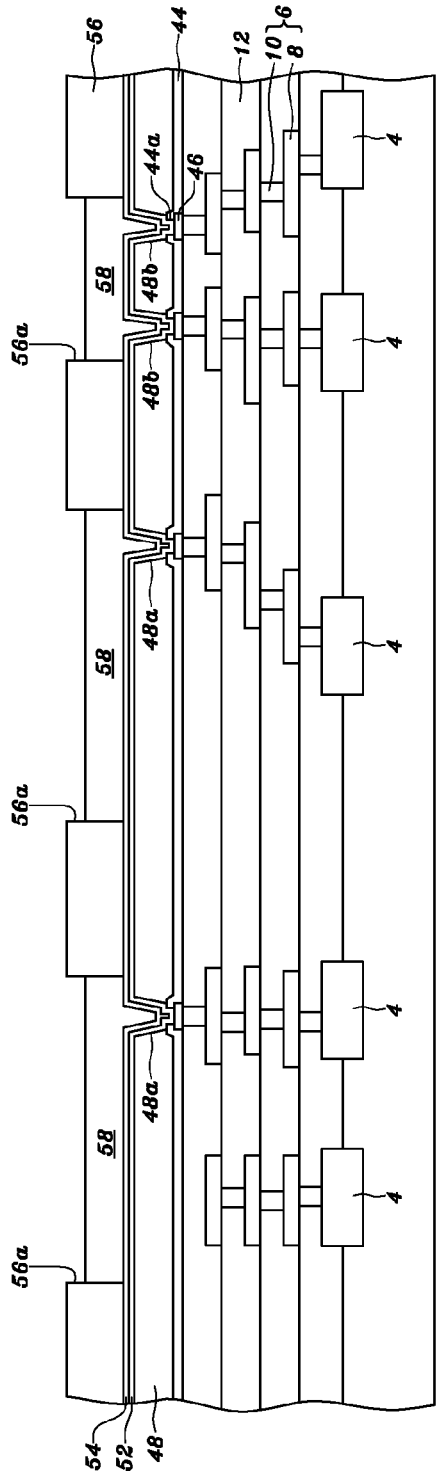
Figure 3B:
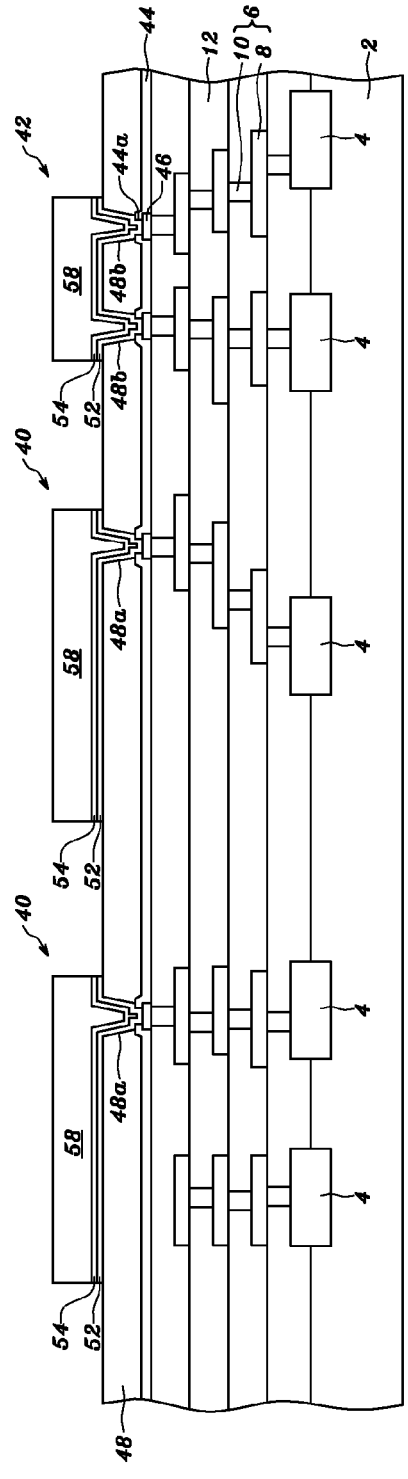
Figure 3C:
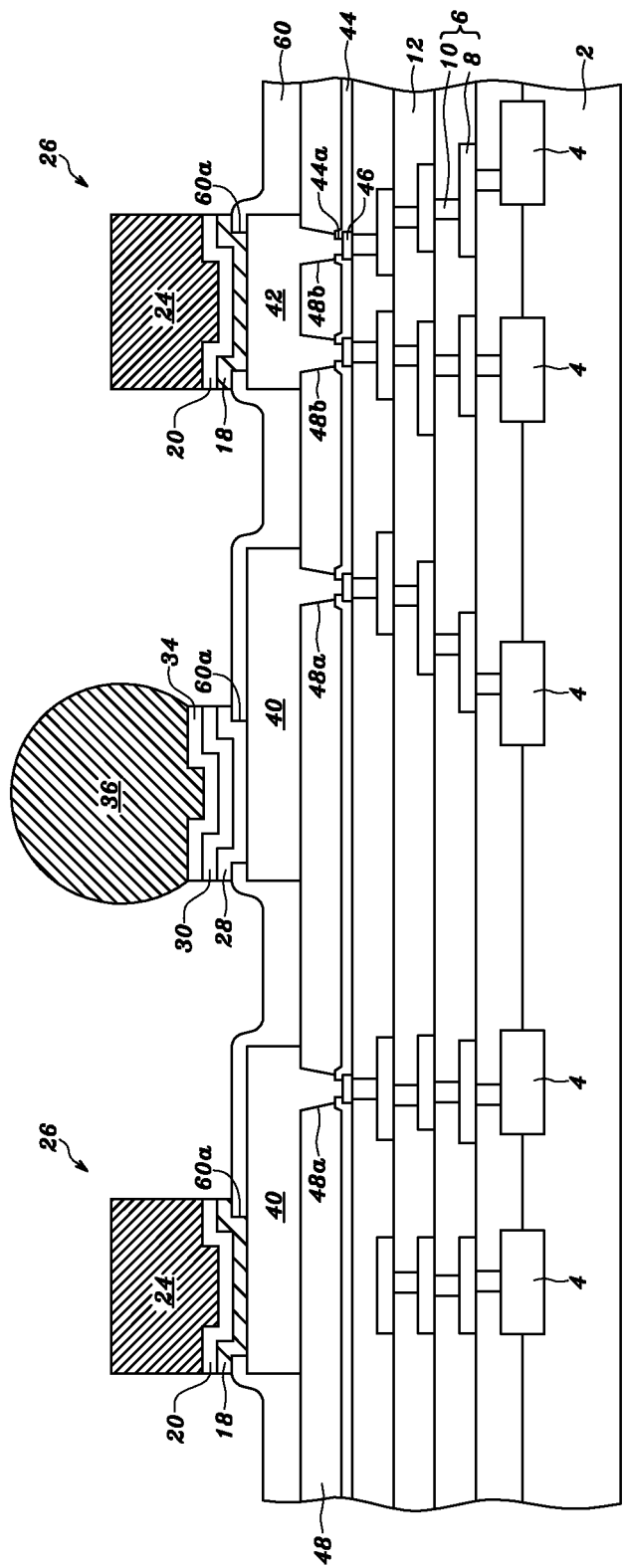

Referring to FIG. 3C, a metal trace 40 functioning as a redistribution layer (RDL) is formed over a passivation layer 44 and connected to a bonding pad 46 exposed by an opening 44a in the passivation layer 44. A metal trace 42 functioning as an interconnecting trace is formed over the passivation layer 44 and connects multiple of to the bonding pads 46 exposed by the openings 44a in the passivation layer 44. Refer to the foregoing description of the passivation layer 14 and the bonding pad 16 for the material and structure of the passivation layer 44 and the bonding pad 46, which will not repeat herein.

The maximum transverse dimension of the opening 44a in the passivation layer 44 may be equal to or less than that of the opening 14a in the passivation layer 14. For example, the openings 44a each have a maximum transverse dimension of between 0.05 and 25 μm. In a preferred case, the openings 44a have the maximum transverse dimension of between 1 and 15 μm. The shape of the openings 44a may be a circle, and the diameter of the circle-shaped opening 44a may be between 0.05 and 25 μm, and preferably between 1 and 15 μm. The shape of the openings 44a may be a square, the length of one side of the square-shaped opening 44a may be between 0.05 and 25 μm, and preferably between 1 and 15 μm. The shape of the openings 44a may be a polygon, the greatest diagonal length of the polygon-shaped opening 44a may be between 0.05 and 25 μm, and preferably between 1 and 15 μm. The shape of the openings 44a may also be a rectangle and the rectangle-shaped opening 44a may have a length of between 0.05 and 25 μm, and preferably between 1 and 15 μm. Further, the semiconductor device 4 may be below the bonding pad 46 exposed by the opening 44a. Alternatively, there may be no semiconductor device 4 under the bonding pad 46 exposed by the opening 44a.

FIG. 3A and FIG. 3B are schematic cross-sectional views showing the steps of forming a RDL and an interconnecting trace. As shown in FIG. 3A, a polymer layer 48 is formed on the passivation layer 44, and multiple openings 48a and 48b in the polymer layer 48 expose the bonding pads 46 exposed by the openings 44a. The material of the polymer layer 48 may include PI, BCB, polyurethane, epoxy, a parylene-based polymer, a solder-mask material, an elastomer, or a porous dielectric material. The polymer layer 48 can be fabricated by spin-coating, heat-pressing a dry film, or screen-printing. In a case, the polymer layer 48 can be formed by spin-on coating a photosensitive polyimide layer on the passivation layer 14, followed by exposing the polyimide layer using 1X stepper and scanner, followed by developing the polyimide layer, followed by curing the polyimide layer at the temperature of between 250 and 350 degrees C. in an nitrogen ambient. The polymer layer 48 has a thickness of between 1 and 30 μm. In a preferred case, the polymer layer 48 has a thickness of between 5 and 20 μm.

Next, the metal traces 40 and 42 are formed on the polymer layer 48 and connected to the bonding pad 46 exposed by the openings 48a and 48b. The method of forming the metal traces 40 and 42 is described as follows:

[Step 1]

An adhesion/barrier layer 52 having a thickness of 0.01 and 3 μm is formed on the polymer layer 48 and on the bonding pads 46 exposed by the openings 48a and 48b. The thickness of the adhesion/barrier layer 52 is preferred to be between 0.01 and 1 μm. The material of the adhesion/barrier layer 52 may include titanium, tungsten, cobalt, nickel, titanium nitride, a titanium-tungsten alloy, a nickel-vanadium alloy, aluminum, chromium, copper, gold, protactinium, platinum, palladium, ruthenium, rhodium, silver, or a composite of the above mentioned materials. The adhesion/barrier layer 52 may be fabricated by a sputtering method or a vapor deposition method.

[Step 2]

A seed layer 54 having a thickness of 0.005 and 2 μm is formed on the adhesion/barrier layer 52 with a sputtering method, a vapor deposition method, an electroplating method, an electroless plating method or a PVD method. The thickness of the seed layer 54 is preferred to be between 0.01 and 0.7 μm. The seed layer 54 is beneficial to electroplating a metal layer thereon. Thus, the material of the seed layer 54 varies with the material of the succeeding metal layer formed on the seed layer 54. When a copper metal layer is to be electroplated on the seed layer 54, copper is a preferable material to the seed layer 54. When a gold metal layer is to be electroplated on the seed layer 54, gold is a preferable material to the seed layer 54. When a palladium metal layer is to be electroplated on the seed layer 54, palladium is a preferable material to the seed layer 54. When a platinum metal layer is to be electroplated on the seed layer 54, platinum is a preferable material to the seed layer 54. When a rhodium metal layer is to be electroplated on the seed layer 54, rhodium is a preferable material to the seed layer 54. When a ruthenium metal layer is to be electroplated on the seed layer 54, ruthenium is a preferable material to the seed layer 54. When a rhenium metal layer is to be electroplated on the seed layer 54, rhenium is a preferable material to the seed layer 54. When a nickel metal layer is to be electroplated on the seed layer 54, nickel is a preferable material to the seed layer 54.

When the adhesion/barrier layer 52 is formed by sputtering a titanium layer with a thickness of between 3000 and 8000 angstroms, the seed layer 54 can be formed by sputtering a gold layer with a thickness of between 100 and 3000 angstroms on the titanium layer. When the adhesion/barrier layer 52 is formed by sputtering a titanium-tungsten layer with a thickness of between 3000 and 8000 angstroms, the seed layer 54 can be formed by sputtering a gold layer with a thickness of between 100 and 3000 angstroms on the titanium-tungsten layer. When the adhesion/barrier layer 52 is formed by sputtering a titanium layer with a thickness of between 3000 and 8000 angstroms, the seed layer 54 can be formed by sputtering a copper layer with a thickness of between 100 and 3000 angstroms on the titanium layer. When the adhesion/barrier layer 52 is formed by sputtering a titanium-tungsten layer with a thickness of between 3000 and 8000 angstroms, the seed layer 54 can be formed by sputtering a copper layer with a thickness of between 100 and 3000 angstroms on the titanium-tungsten layer. When the adhesion/barrier layer 52 is formed by sputtering a chromium layer with a thickness of between 3000 and 8000 angstroms and then sputtering a chromium-copper-alloy layer with a thickness of between 500 and 3000 angstroms on the chromium, the seed layer 54 can be formed by sputtering a copper layer with a thickness of between 100 and 3000 angstroms on the chromium-copper-alloy layer. When the adhesion/barrier layer 52 is formed by sputtering an aluminum layer with a thickness of between 3000 and 8000 angstroms and then sputtering a nickel-vanadium-alloy layer with a thickness of between 3000 and 8000 angstroms on the aluminum, the seed layer 54 can be formed by sputtering a copper layer with a thickness of between 100 and 3000 angstroms on the nickel-vanadium-alloy layer.

[Step 3]

A photoresist layer 56 is formed on the seed layer 54, and the photoresist layer 56 is patterned with exposing and developing processes to form multiple openings 56a in the photoresist layer 56, exposing the seed layer 54. Preferably, a 1X stepper or a 1X scanner is used to expose the photoresist layer 56.

[Step 4]

A metal layer 58 is formed on the seed layer 54 exposed by the opening 56a. The metal layer 58 has a thickness of between 1 and 200 µm and, for example, a thickness of between 1 and 50 µm. The thickness of the metal layer 58 is preferred to be between 1 and 35 µm. The metal layer 58 may be deposited by an electroplating method or an electroless plating method. The metal layer 58 may be a single layer made of gold, copper, silver, palladium, platinum, rhodium, ruthenium, rhenium, or nickel. The metal layer 58 may also be a composite layer made of the above mentioned metals.

For example, the metal layer 58 may be deposited by electroplating a gold layer with a thickness of between 1 and 35 µm, and preferably with a thickness of between 2 and 12 µm, on the seed layer 54 made of gold exposed by the opening 56a. Alternatively, the metal layer 58 may be deposited by electroplating a copper layer with a thickness of between 1 and 35 µm, and preferably with a thickness of between 2 and 20 µm, on the seed layer 54 made of copper exposed by the opening 56a. Alternatively, the metal layer 58 is formed by electroplating a copper layer with a thickness of between 2 and 20 µm on the seed layer 54 made of copper exposed by the opening 56a in the photoresist layer 56, next electroplating a nickel layer with a thickness of between 0.1 and 10 µm, and preferably with a thickness of between 0.5 and 5 µm, on the copper layer in the opening 56a, next electroplating a gold layer with a thickness of between 0.01 and 5 µm, and preferably with a thickness of between 0.01 and 1 µm, on the nickel layer in the opening 56a.

[Step 5]

After the metal layer 58 is formed, the photoresist layer 56 is removed. Next, the seed layer 54 and the adhesion/barrier layer 52 not under the metal layer 58 are removed as shown in FIG. 3B. The adhesion/barrier layer 52 can be removed with a dry-etching method or a wet-etching method. The dry-etching method may be implemented with an argon sputter process. Alternatively, the adhesion/barrier layer 52 not under the metal layer 58 is wet etched using an etchant containing an H2O2 liquid in case that the adhesion/barrier layer 52 is a titanium-tungsten alloy or titanium. If the seed layer 54 is made of gold, it can be removed with an iodine-containing etchant, such as a potassium iodine solution.

Referring to FIG. 3C, after the metal traces 40 and 42 are formed, a polymer layer 60 is formed on the metal traces 40 and 42 and the polymer layer 48, and multiple openings 60a in the polymer layer 60 expose the metal traces 40 and 42. The material of the polymer layer 60 may include PI, BCB, polyurethane, epoxy, a parylene-based polymer, a solder-mask material, an elastomer, or a porous dielectric material. The polymer layer 60 can be fabricated by spin-coating, heat-pressing a dry film, or screen-printing. In a case, the polymer layer 60 can be formed by spin-on coating a photosensitive polyimide layer on the metal traces 40 and 42 and the polymer layer 48, followed by exposing the polyimide layer using 1X stepper and scanner, followed by developing the polyimide layer, followed by curing the polyimide layer at the temperature of between 250 and 350 degrees C. in an nitrogen ambient. The polymer layer 60 has a thickness of between 1 and 30 µm. In a preferred case, the polymer layer 60 has a thickness of between 5 and 20 µm.

Lastly, in this embodiment, the tin-containing metal layer or bump 36 and the metal pad or bump 26 are formed on the metal traces 40 and 42 exposed by the openings 60a according to the method of forming the tin-containing metal layer or bump 36 and the metal pad or bump 26 in Embodiment 1. The process for forming the metal pad or bump 26 can be referred to the above-mentioned process corresponding to FIGS. 2A-2C. During forming the metal pad or bump 26, the above-mentioned adhesion/barrier layer 18 is sputtered on the polymer layer 60, and on the pads exposed by the openings 60a. The process for forming the tin-containing layer or bump 36 can be referred to the above-mentioned process corresponding to FIGS. 2D-2F. During forming the tin-containing layer or bump 36, the above-mentioned adhesion/barrier layer 28 is sputtered on the polymer layer 60, on the metal pad or bump 26, and on the bonding pads exposed by the openings 60a and not having the metal pad or bump 26 formed thereon. The metal pad or bump 26 may be bonded with a bonding wire (such as a gold wire or a copper wire) using a wirebonding process, with a tape (via a TAB technology), with a metal bump (such as a gold bump) preformed on an external circuit, with a tin-containing metal layer or bump preformed on an external circuit, or with an external circuit via ACF or ACP.

Figure 3D:
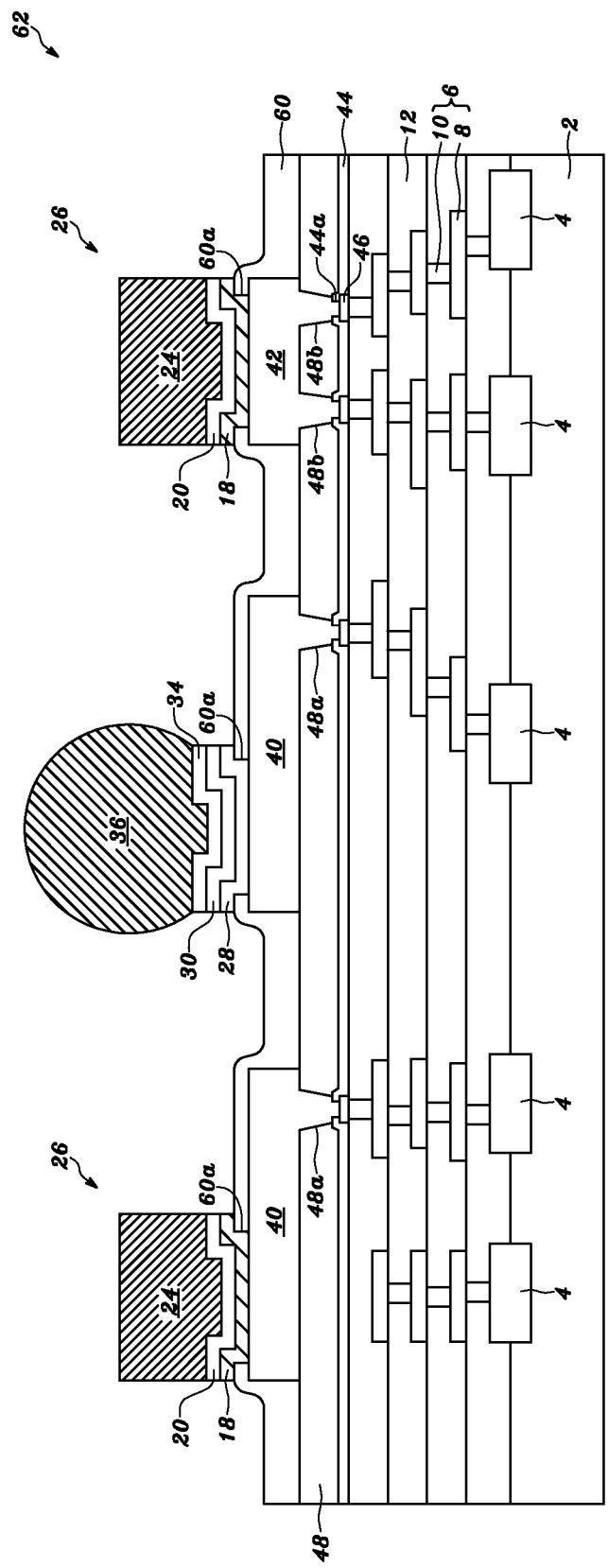

Referring to FIG. 3D, after completing the above-mentioned process, the semiconductor substrate 2 is diced into multiple semiconductor chips 62. Each of the semiconductor chips 62 comprises a semiconductor substrate 2, a circuit structure 6, multiple dielectric layers 12, a passivation layer 14, at least one RDL (such as the metal trace 40), at least one interconnecting trace (such as the metal trace 42), at least one metal pad or bump 26, and at least one tin-containing metal layer or bump 36. Multiple semiconductor devices 4, such as transistors or MOS devices, are in or over the semiconductor substrate 2. Some of the semiconductor devices 4 may be under the metal pad or bump 26 or the tin-containing metal layer or bump 36. Two of the semiconductor devices 4 are electrically connected to the metal pad or bump 26 and the tin-containing metal layer or bump 36, respectively. The passivation layer 14 may include a topmost silicon-nitride layer of the individual semiconductor chip 62. Besides, the passivation layer 14 may include a topmost silicon-oxide layer of the individual semiconductor chip 62.

Each semiconductor chip 62 can be connected to an external circuit via the tin-containing metal layer or bump 36. The external circuit may be a semiconductor chip, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, or a discrete passive device, such as inductor, capacitor, resistor or filter.

Alternatively, the metal pad or bump 26 of one semiconductor chip 62 can be bonded with a bonding wire (such as a gold wire or a copper wire) via a wirebonding process and then connected to an external circuit. The external circuit may be a semiconductor chip, a PCB, a flexible board, a ceramic-containing substrate, or a lead frame, wherein the PCB contains glass fibers, and wherein the flexible board contains a polymer layer, such as a polyimide layer, having a thickness of between 30 and 200 µm.

Alternatively, the metal pad or bump 26 of one semiconductor chip 62 can be bonded with a tape via a TAB technology and then connected to an external circuit. The external circuit may be a semiconductor chip, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, or a discrete passive device, such as inductor, capacitor, resistor or filter. The tape comprises at least one polymer layer, at least one metal trace made of copper on the polymer layer, and a tin layer or tin-silver-alloy layer on the metal trace. When the tape is bonded to the metal pad or bump 26, the tin layer or tin-silver-alloy layer preformed on the metal trace of the tape can be joined with the metal pad or bump 26.

Alternatively, the metal pad or bump 26 of one semiconductor chip 62 can be pressed into ACF or ACP via a thermal-press process; thereby, the metallic particles in the ACF or ACP are clustered between the metal pad or bump 26 and a ITO-containing pad of an external circuit (such as a glass substrate). By the way the metal pad or bump 26 and the ITO-containing pad of the external circuit are thus electrically connected to each other. Alternatively, the metal pad or bump 26 of one semiconductor chip 62 can be bonded with other kinds of external circuit, such as semiconductor chip, printed circuit board (PCB) comprising a glass fiber as a core, flexible tape comprising a polymer layer (such as polyimide) having a thickness of between 30 and 200 μm and not comprising any polymer layer with glass fiber, ceramic substrate comprising a ceramic material as insulating layers between circuit layers, or a discrete passive device, such as inductor, capacitor, resistor or filter, using ACF (anisotropic conductive film) or ACP (anisotropic conductive paste).

Alternatively, the metal pad or bump 26 of one semiconductor chip 62 can be bonded with a metal bump (such as a gold bump) preformed on an external circuit, such as semiconductor chip, printed circuit board (PCB) comprising a glass fiber as a core, flexible tape comprising a polymer layer (such as polyimide) having a thickness of between 30 and 200 μm and not comprising any polymer layer with glass fiber, ceramic substrate comprising a ceramic material as insulating layers between circuit layers, or a discrete passive device, such as inductor, capacitor, resistor or filter.

Alternatively, in this embodiment, the semiconductor chips 62 can be connected to external circuits via a tin-containing metal layer or bump 36 before the semiconductor substrate 2 is diced. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter. Next, the semiconductor substrate 2 is diced into multiple semiconductor chips. Then, the metal pad or bump 26 of each semiconductor chip is bonded with a bonding wire (via a wireboning process), with a tape (via a TAB technology), with a metal bump (such as a gold bump) preformed on an external circuit, a tin-containing metal layer or bump preformed on an external circuit, or with an external circuit via ACF or ACP.

In this embodiment, via a RDL (such as the metal trace 40 in FIG. 3C), the output for the bonding pad 46 originally exposed by the opening 44*a* can be relocated to a specified position. For example, the output for the bonding pad 46 is moved to the pad exposed by the opening 60*a* through the metal trace 40. From a top perspective view, it can be observed that the relocated position of the pad exposed by the opening 60*a* is different from the original position of the bonding pad 46. In this embodiment, via an interconnecting trace (such as the metal trace 42 shown in FIG. 3C), at least two bonding pads 46 exposed by the openings 44*a* can be interconnected.

Referring to FIG. 3E, the metal traces 40 and 42 may be directly formed on the passivation layer 14. Then, the tin-containing metal layer or bump 36 and the metal pad or bump 26 are formed on the metal traces 40 and 42 exposed by the openings 60*a* according to the steps shown in FIG.3C and FIG.3D. Those described above may be referred to for the applications of the semiconductor chip 62' shown in FIG. 3E, which will not repeat herein.

Therefore, in the present invention, on a RDL or interconnecting trace of a semiconductor wafer or semiconductor chip may be formed a metal pad or bump 26 to be bonded with a bonding wire (such as a gold wire or a copper wire) using a wirebonding process, with a tape(via a TAB technology), with a metal bump (such as a gold bump) preformed on an external circuit, with a tin-containing metal layer or bump preformed on an external circuit, or with an external circuit via ACF or ACP. In addition, on a RDL or interconnecting trace of a semiconductor wafer or semiconductor chip, over which no metal pad or bump 26 is formed, may be formed a tin-containing metal layer or bump 36.

Besides, the metal trace 40 or 42 may be a power bus, a signal bus or a ground bus connected respectively to the power circuit, a signal circuit or a ground circuit below the passivation layer 44 via the opening 44*a* in the passivation layer 44.

FIG. 4, is a schematic cross-sectional view showing a multi-chip package structure. As shown in FIG. 4, the semiconductor chip 64 may be the semiconductor chip 38 or 38' according to Embodiment 1 or the semiconductor chip 62 or 62' according to Embodiment 2. Therefore, the semiconductor chip 64 may has different types of metal pads or bumps 68 and 70. The metal pad or bump 68 comprises a tin-containing metal layer or bump 36 and multiple metal layers below the tin-containing metal layer or bump 36 (such as an adhesion/barrier layer 28, a seed layer 30, a diffusion barrier 34, etc). The details of the tin-containing metal layer or bump 36 and these metal layers can be referred to as those described above. The metal pad or bump 70 is to be bonded with a tape and may be the bonding pad or bump 26 according to Embodiment 1 or Embodiment 2. The details of the bonding pad 26 can be referred to as those described above.

As shown in the drawing, the semiconductor chip 64 is connected to a semiconductor chip 66 via the metal pad or bump 68 having a tin-containing layer with a thickness of between 3 and 250 μm, for example. Besides, a polymer 72 is filled in between the semiconductor chip 64 and the semiconductor chip 66 and covers the metal pad or bump 68. The material of the polymer 72 may include PI, BCB, polyurethane, epoxy, a parylene-based polymer, a solder-mask material, an elastomer, or a porous dielectric material.

After the semiconductor chips 64 and 64 are bonded with each other through the metal pad or bump 68, via a thermal-press process, at least one metal trace 74 of a flexible tape 78 is bonded on the metal pad or bump 70 having a gold layer with a thickness of between 8 and 35 μm, for example, via a metal layer 79 made of tin metal, a tin-silver alloy, or the like preformed on the metal trace 74. The tape 78 further comprises a polymer layer 76 having the metal trace 74 formed thereon. The material of the polymer layer 76 may include PI, BCB, polyurethane, epoxy, a parylene-based polymer, a solder-mask material, an elastomer, or a porous dielectric material.

Next, a polymer 80 is formed to cover the metal pad 70 and a portion of the flexible tape 78. The material of the polymer layer 80 may include PI, BCB, polyurethane, epoxy, a parylene-based polymer, a solder-mask material, an elastomer, or a porous dielectric material.

Therefore, via the metal pad or bump 68, the semiconductor chip 64 can be connected to an external circuit, such as the semiconductor chip 66. Further, via a TAB technology and a flexible tape 78, the metal pad or bump 70 can be connected to an external circuit, such as a semiconductor chip, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers.

Embodiment 3

FIG. 5A to FIG. 5H are schematic cross-sectional views showing a method for forming a tin-containing metal layer or bump and a metal pad or bump over a semiconductor wafer.

Figure 5A:
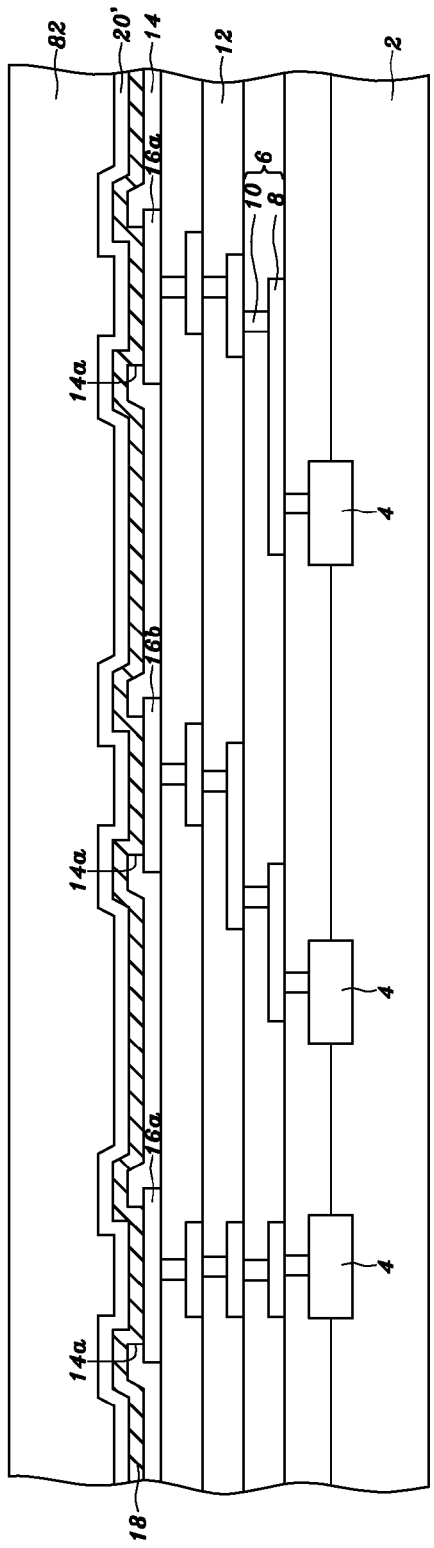
FIG. 5A to FIG. 5K are sectional views schematically showing the fabrication process according to one embodiment of the present invention.

Referring to FIG. 5A, after the adhesion/barrier layer 18 shown in FIG. 2A is formed, a seed layer 20' is formed on the adhesion/barrier layer 18, wherein the seed layer 20' has a thickness of between 0.005 and 10 µm with a preferred thickness of between 0.01 and 2 µm. The seed layer 20' may be formed by a sputtering method, a vapor deposition method, an electroplating method, an electroless plating method or a PVD method. The seed layer 20' is beneficial to electroplating a metal layer thereon. Thus, the material of the seed layer 20' varies with the material of the succeeding metal layer formed on the seed layer 20'. When a copper metal layer is to be electroplated on the seed layer 20', copper is a preferable material to the seed layer 20'. When a gold metal layer is to be electroplated on the seed layer 20', gold is a preferable material to the seed layer 20'.

When the adhesion/barrier layer 18 is formed by sputtering a titanium layer with a thickness of between 3000 and 8000 angstroms, the seed layer 20' can be formed by sputtering a gold layer with a thickness of between 100 and 3000 angstroms on the titanium layer. When the adhesion/barrier layer 18 is formed by sputtering a titanium-tungsten layer with a thickness of between 3000 and 8000 angstroms, the seed layer 20' can be formed by sputtering a gold layer with a thickness of between 100 and 3000 angstroms on the titanium-tungsten layer. When the adhesion/barrier layer 18 is formed by sputtering a titanium layer with a thickness of between 3000 and 8000 angstroms, the seed layer 20' can be formed by sputtering a copper layer with a thickness of between 100 and 3000 angstroms on the titanium layer. When the adhesion/barrier layer 18 is formed by sputtering a titanium-tungsten layer with a thickness of between 3000 and 8000 angstroms, the seed layer 20' can be formed by sputtering a copper layer with a thickness of between 100 and 3000 angstroms on the titanium-tungsten layer.

Figure 5B:
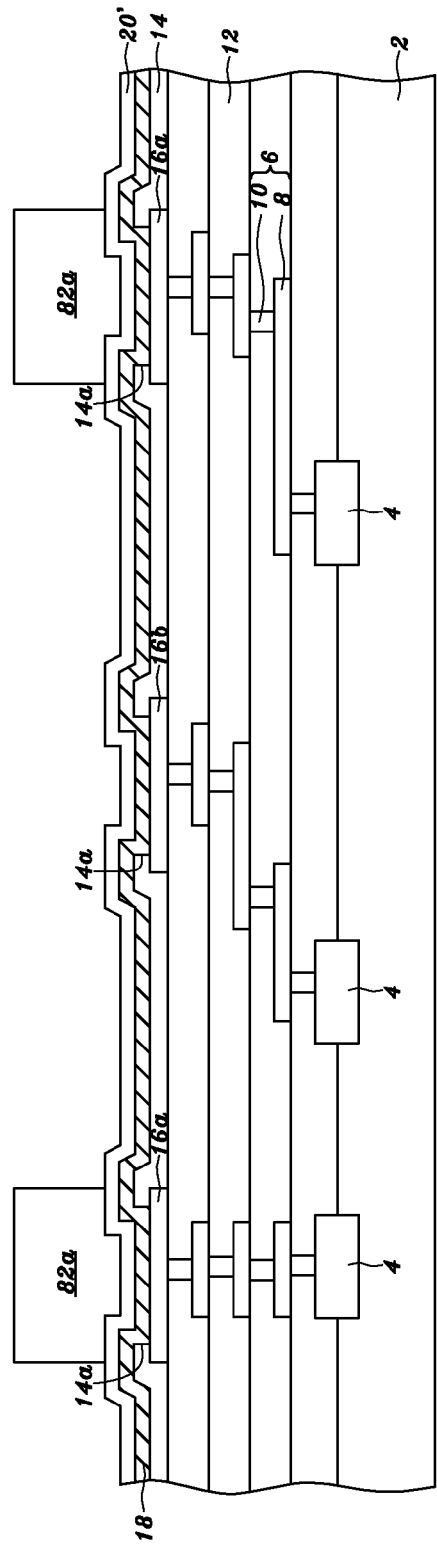
Figure 5C:
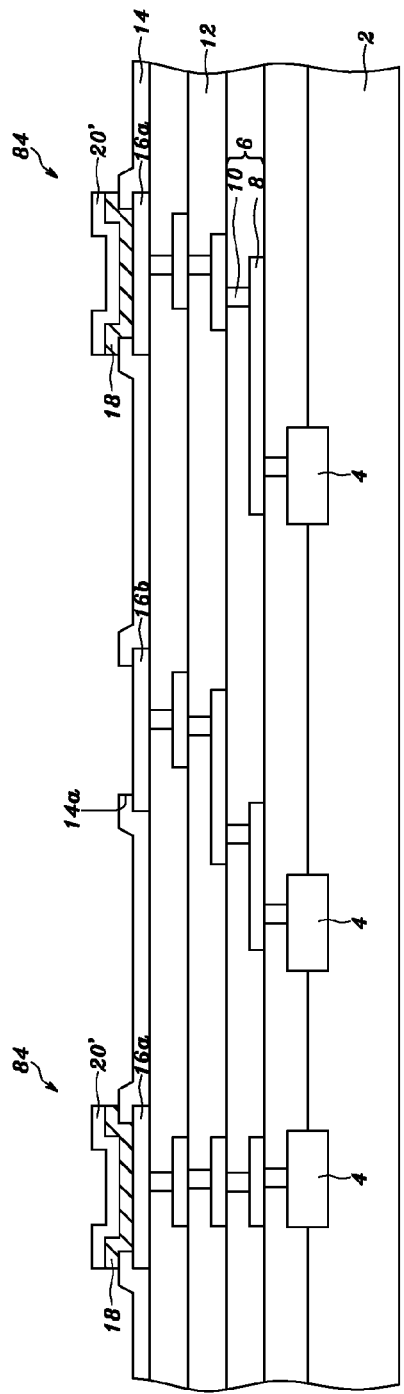

Referring to FIG. 5B, a photoresist layer 82 is formed on the seed layer 20', and the photoresist layer 82 is patterned with exposing and developing processes to form a patterned photoresist layer 82a on the seed layer 20' over the first bonding pad 16a. A 1X stepper or a 1X scanner is used to expose the photoresist layer 82. Next, with the patterned photoresist layer 82a being the mask, the seed layer 20' and the adhesion/barrier layer 18 not under the patterned photoresist layer 82a are removed. The adhesion/barrier layer 18 can be removed with a dry-etching method or a wet-etching method. The dry-etching method may be implemented with an argon sputter process. Alternatively, the adhesion/barrier layer 18 not under the patterned photoresist layer 82a is wet etched using an etchant containing an $H_2O_2$ liquid in case that the adhesion/barrier layer 18 is a titanium-tungsten alloy or titanium. If the seed layer 20' is made of gold, it can be removed with an iodine-containing etchant, such as a potassium iodine solution. Referring to FIG. 5C, the photoresist layer 82a is also removed after the seed layer 20' and the adhesion/barrier layer 18 not under the patterned photoresist layer 82a are removed.

Thus, a metal pad 84 is formed on the first bonding pad 16a exposed by the opening 14a in the passivation layer 14. The metal pad 84 comprises an adhesion/barrier layer 18 and a seed layer 20' on the adhesion/barrier layer 18. The metal pad 84 may have a bonding wire (such as a gold wire or a copper wire) bonded thereon by a wire-bonding process, may have a tape bonded thereon using a tape automated bonding (TAB) process, may be bonded with a metal bump (such as a gold bump) preformed on an external circuit, may be bonded with a tin-containing bump preformed on an external circuit, may be bonded with an external circuit using an anisotropic conductive film (ACF) or an anisotropic conductive paste (ACP). The external circuit may be a semiconductor chip, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, a glass substrate having circuit layers made of Indium Tin Oxide (ITO), or a discrete passive device, such as inductor, capacitor, resistor or filter.

For example, when the seed layer 20' is a gold layer, and when the metal pad 84 is bonded with a bonding wire (such as a gold wire), the gold layer has a thickness of between 0.05 and 5 µm with a preferred thickness of between 0.1 and 2 µm. When the seed layer 20' is a copper layer, and when the metal pad 84 is bonded with a bonding wire (such as a copper wire), the copper layer has a thickness of between 0.05 and 5 µm with a preferred thickness of between 0.1 and 2 µm.

Figure 5D:
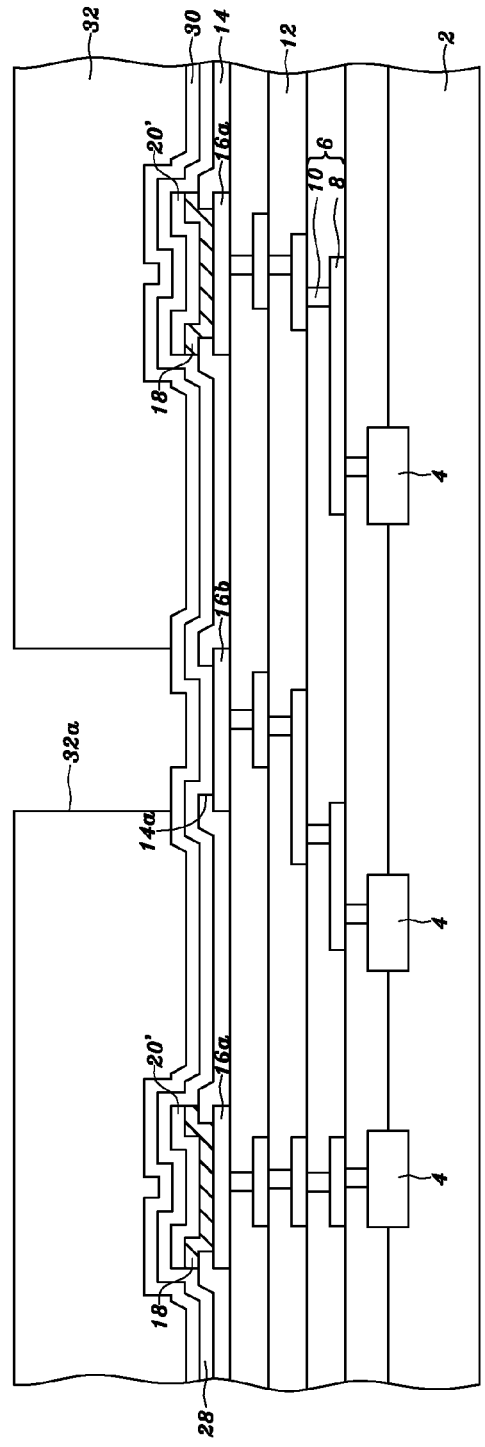

Referring to FIG. 5D, an adhesion/barrier layer 28 having a thickness of 0.01 and 3 µm is formed on the passivation layer 14, on the second bonding pad 16b exposed by the opening 14a, and on the metal pad 84. The thickness of the adhesion/barrier layer 28 is preferred to be between 0.01 and 1 µm. The material of the adhesion/barrier layer 28 may include titanium, tungsten, cobalt, nickel, titanium nitride, a titanium-tungsten alloy, a nickel-vanadium alloy, aluminum, chromium, copper, gold, protactinium, platinum, palladium, ruthenium, rhodium, silver, or a composite of the above mentioned materials. The adhesion/barrier layer 28 may be fabricated by a sputtering method or a vapor deposition method.

Next, a seed layer 30 having a thickness of 0.005 and 2 µm is formed on the adhesion/barrier layer 28 with a sputtering method, a vapor deposition method, an electroplating method, an electroless plating method or a PVD method. The thickness of the seed layer 30 is preferred to be between 0.01 and 0.7 µm. The seed layer 30 is beneficial to electroplating a metal layer thereon. Thus, the material of the seed layer 30 varies with the material of the succeeding metal layer formed on the seed layer 30. When a copper metal layer is to be electroplated on the seed layer 30, copper is a preferable material to the seed layer 30. When a gold metal layer is to be electroplated on the seed layer 30, gold is a preferable material to the seed layer 30.

When the adhesion/barrier layer 28 is formed by sputtering a titanium layer with a thickness of between 3000 and 8000 angstroms, the seed layer 30 can be formed by sputtering a copper layer with a thickness of between 100 and 3000 angstroms on the titanium layer. When the adhesion/barrier layer 28 is formed by sputtering a titanium-tungsten layer with a thickness of between 3000 and 8000 angstroms, the seed layer 30 can be formed by sputtering a copper layer with a thickness of between 100 and 3000 angstroms on the titanium-tungsten layer. When the adhesion/barrier layer 28 is formed by sputtering a chromium layer with a thickness of between 1000 and 8000 angstroms and then sputtering a chromium-copper-alloy layer with a thickness of between 100 and 5000 angstroms on the chromium layer, the seed layer 30 can be formed by sputtering a copper layer with a thickness of between 100 and 3000 angstroms on the chromium-copper-alloy layer. When the adhesion/barrier layer 28 is formed by sputtering an aluminum layer with a thickness of between 1000 and 8000 angstroms and then sputtering a nickel-vanadium-alloy layer with a thickness of between 100 and 5000 angstroms on the aluminum layer, the seed layer 30 can be formed by sputtering a copper layer with a thickness of between 100 and 3000 angstroms on the nickel-vanadium-alloy layer.

Next, a photoresist layer 32 is formed on the seed layer 30, and the photoresist layer 32 is patterned with exposing and developing processes to form an opening 32a in the photoresist layer 32, exposing the seed layer 30 over the second bonding pad 16b. A 1X stepper or a 1X scanner is used to expose the photoresist layer 32.

Figure 5E:
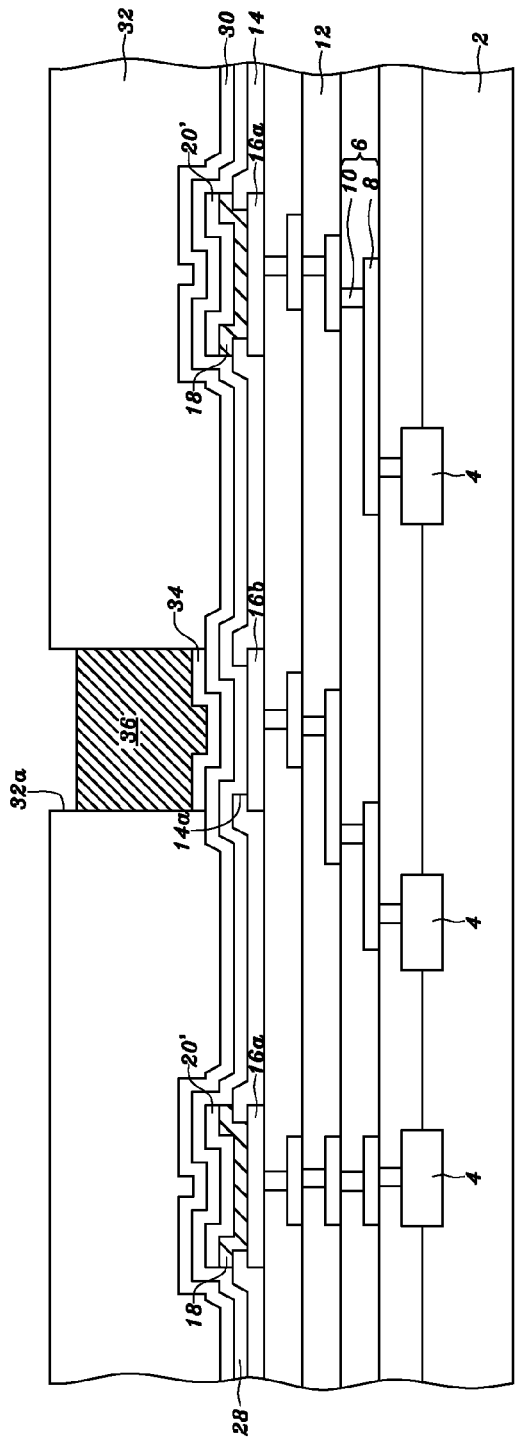

Referring to FIG. 5E, a diffusion barrier layer 34 is formed on the seed layer 30 exposed by the opening 32a. The diffusion barrier layer 34 is formed by, for example, first electroplating a copper layer with a thickness of between 0.5 and 10 µm on the seed layer 30 made of copper exposed by the opening 32a in the photoresist layer 32, next electroplating a nickel layer with a thickness of between 0.1 and 5 µm on the copper layer in the opening 32a in the photoresist layer 32. The diffusion barrier layer 34 is a copper-nickel composite layer.

Next, a tin-containing metal layer or bump 36 is electroplated on the diffusion barrier layer 34 in the opening 32a. The thickness of the tin-containing metal layer or bump 36 is between 1 and 500 µm, and preferably between 3 and 250 µm, for example. Alternatively, the tin-containing metal layer or bump 36 may be deposited by an electroless plating method or a screen printing process. The tin-containing metal layer or bump 36 is, for example, a tin-lead alloy, a tin-silver alloy, a tin-silver-copper alloy, a lead-free alloy. Using a tin-lead solder for illustration, the weight ratio of tin to lead can be adjusted accordingly. A typical weight ratio of lead to tin is 90/10, 95/5, 97/3 or 37/63, etc.

The embodiment may include forming a solder wettable layer (not shown) on the diffusion barrier layer 34 to increase the bonding ability between the subsequently formed the tin-containing metal layer or bump 36 and the diffusion barrier layer 34. The solder wettable layer is, for example, gold, copper, tin, a tin-lead alloy, a tin-silver alloy, a tin-silver-copper alloy, or a lead-free alloy etc. For example, after forming the nickel layer of the diffusion barrier layer 34, a solder wettable layer made of gold with a thickness of between 100 and 3000 angstroms is electroplated on the nickel layer of the diffusion barrier layer 34 in the opening 32a, followed by electroplating the tin-containing metal layer or bump 36 on the solder wettable layer.

Figure 5F:
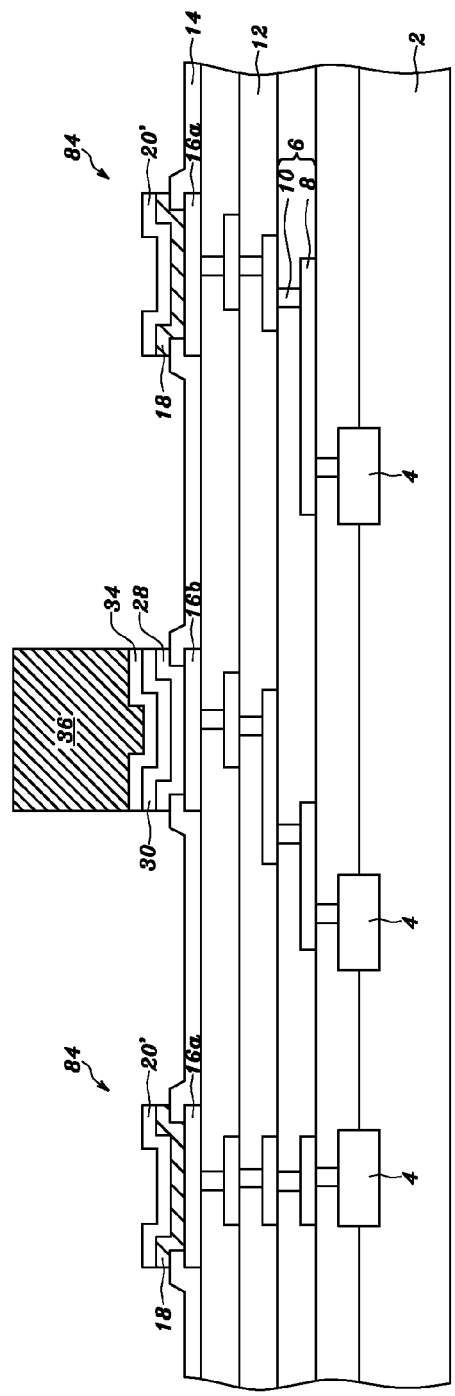

Referring to FIG. 5F, after forming the tin-containing metal layer or bump 36, the photoresist layer 32 is removed. Thereafter, the seed layer 30 and the adhesion/barrier layer 28 not under the tin-containing metal layer or bump 36 are removed. The adhesion/barrier layer 28 can be removed with a dry-etching method or a wet-etching method. The dry-etching method may be implemented with an argon sputter process. Alternatively, the adhesion/barrier layer 28 not under the tin-containing metal layer or bump 36 is wet etched using an etchant containing an $H_2O_2$ liquid in case that the adhesion/barrier layer 28 is a titanium-tungsten alloy or titanium.

Figure 5G:
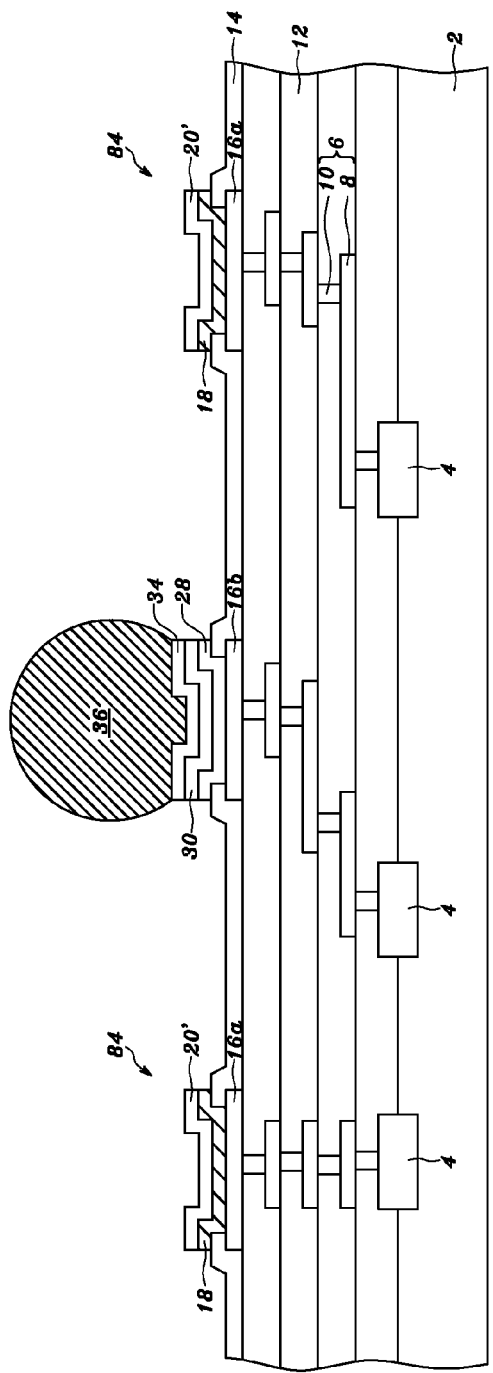

Referring to FIG. 5G, a reflow process is performed to lead the tin-containing metal layer or bump 36 to be formed like a global shape. Alternatively, a reflow method may be first performed to lead the tin-containing metal layer or bump 36 to be formed like a global shape, followed by removing the adhesion/barrier layer 28 and the seed layer 30 not under tin-containing metal layer or bump 36. Alternatively, the reflow process may be performed until the tin-containing metal layer or bump 36 is connected to an external circuit. The tin-containing metal layer or bump 36 may be joined with an external circuit, such as semiconductor chip, printed circuit board (PCB) comprising a glass fiber as a core, flexible tape comprising a polymer layer (such as polyimide) having a thickness of between 30 and 200 µm and not comprising any polymer layer with glass fiber, ceramic substrate comprising a ceramic material as insulating layers between circuit layers, glass substrate having circuit layers made of Indium Tin Oxide (ITO), or discrete passive device, such as inductor, capacitor, resistor or filter.

The present invention provides the metal pads 84 on the some of the bonding pads 16 exposed by the opening 14a in the passivation layer 14, and provides the tin-containing metal layer or bump 36 over some of the bonding pads 16 not having the metal pad 84 formed thereon. The metal pads 84 may be joined with a wire (such as a gold wire or a copper wire) by a wire-bonding process, joined with a tape by a TAB process, joined with a metal bump (such as a gold bump) preformed on an external circuit, joined with a tin-containing layer or bump preformed on an external circuit, or joined with an external circuit using an ACF or an ACP. The external circuit may be a semiconductor chip, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, a glass substrate having circuit layers made of Indium Tin Oxide (ITO), or a discrete passive device, such as inductor, capacitor, resistor or filter.

The metal pads 84 may have a topmost wettable layer, such as gold, used to be wirebonded there to. In some case, the tin-containing metal layer or bump 36 can be formed on a gold layer, serving as a wettable layer, on the diffusion barrier layer 34. Furthermore, the tin-containing metal layer or bump 36 in the present invention can be replaced by another kind of solder bump.

Figure 5H:
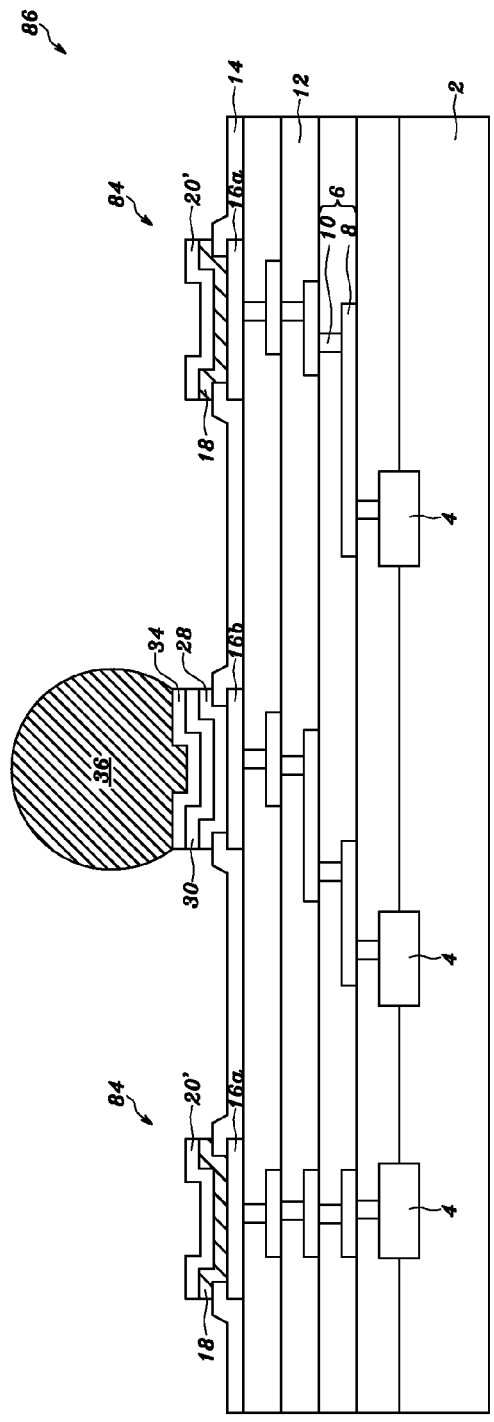

Referring to FIG. 5H, after completing the above-mentioned process, the semiconductor substrate 2 is diced into multiple semiconductor chips 86. Each of the semiconductor chips 86 comprises a semiconductor substrate 2, a circuit structure 6, multiple dielectric layers 12, a passivation layer 14, at least one metal pad 84, and at least one tin-containing metal layer or bump 36. Multiple semiconductor devices 4, such as transistors or MOS devices, are in or over the semiconductor substrate 2. Some of the semiconductor devices 4 may be under the metal pad 84 or the tin-containing metal layer or bump 36. Two of the semiconductor devices 4 are electrically connected to the metal pad 84 and the tin-containing metal layer or bump 36, respectively. The passivation layer 14 may include a topmost silicon-nitride layer of the individual semiconductor chip 86. Besides, the passivation layer 14 may include a topmost silicon-oxide layer of the individual semiconductor chip 86.

Each semiconductor chip 86 can be connected to an external circuit via the tin-containing metal layer or bump 36. The external circuit may be a semiconductor chip, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, or a discrete passive device, such as inductor, capacitor, resistor or filter.

Alternatively, the metal pad 84 of one semiconductor chip 86 can be bonded with a bonding wire (such as a gold wire or a copper wire) via a wirebonding process and then connected to an external circuit. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter.

Alternatively, the metal pad 84 of one semiconductor chip 86 can be bonded with a tape via a TAB technology and then connected to an external circuit. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter. The tape comprises at least one polymer layer, at least one metal trace made of copper on the polymer layer, and a tin layer or tin-silver-alloy layer on the metal trace. When the tape is bonded to the metal pad 84, the tin layer or tin-silver-alloy layer preformed on the metal trace of the tape can be joined with the metal pad 84.

Alternatively, the metal pad 84 of one semiconductor chip 86 can be pressed into ACF or ACP via a thermal-press process; thereby, the metallic particles in the ACF or ACP are clustered between the metal pad 84 and a ITO-containing pad of an external circuit (such as a glass substrate). By the way, the metal pad 84 and the ITO-containing pad of the external circuit are thus electrically connected to each other. Alternatively, the metal pad 84 of one semiconductor chip 86 can be bonded with other kinds of external circuit, such as semiconductor chip, printed circuit board (PCB) comprising a glass fiber as a core, flexible tape comprising a polymer layer (such as polyimide) having a thickness of between 30 and 200 μm and not comprising any polymer layer with glass fiber, ceramic substrate comprising a ceramic material as insulating layers between circuit layers, or a discrete passive device, such as inductor, capacitor, resistor or filter, using ACF (anisotropic conductive film) or ACP (anisotropic conductive paste).

Alternatively, the metal pad 84 of one semiconductor chip 86 can be bonded with a metal bump (such as a gold bump) preformed on an external circuit, such as semiconductor chip, printed circuit board (PCB) comprising a glass fiber as a core, flexible tape comprising a polymer layer (such as polyimide) having a thickness of between 30 and 200 μm and not comprising any polymer layer with glass fiber, ceramic substrate comprising a ceramic material as insulating layers between circuit layers, or a discrete passive device, such as inductor, capacitor, resistor or filter.

Alternatively, in this embodiment, the semiconductor chips 86 can be connected to external circuits via a tin-containing metal layer or bump 36 before the semiconductor substrate 2 is diced. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter. Next, the semiconductor substrate 2 is diced into multiple semiconductor chips. Then, the metal pad 84 of each semiconductor chip is bonded with a bonding wire (via a wireboning process), with a tape (via a TAB technology), with a metal bump (such as a gold bump) preformed on an external circuit, with a tin-containing metal layer or bump preformed on an external circuit, or with an external circuit via ACF or ACP.

Referring to FIG. 5T, in this embodiment, a polymer layer 39 may be beforehand formed on the passivation layer 14; multiple openings 39a and multiple openings 39b expose the first bonding pad 16a and the second bonding pad 16b. Next, according to the steps shown in from FIG. 5A to FIG. 5H, the metal pad 84 is formed on the first bonding pad 16a exposed by the opening 39a in the polymer layer 39, and the tin-containing metal layer or bump 36 is formed on the second bonding pad 16b exposed by the opening 39b in the polymer layer 39. The process for forming the metal pad 84 and the tin-containing metal layer or bump 36 on the bonding pads 16a and 16b can be referred to the above-mentioned process corresponding to FIGS. 5A-5H. During forming the metal pad 84, the above-mentioned adhesion/barrier layer 18 is sputtered on the polymer layer 39, on the bonding pads 16a exposed by the openings 39a in the polymer layer 39, and on the bonding pads 16b exposed by the openings 39b in the polymer layer 39. During forming the tin-containing metal layer or bump 36, the above-mentioned adhesion/barrier layer 28 is sputtered on the polymer layer 39, on the metal pad 84, and on the bonding pads 16b exposed by the openings 39b in the polymer layer 39.

Figure 5I:
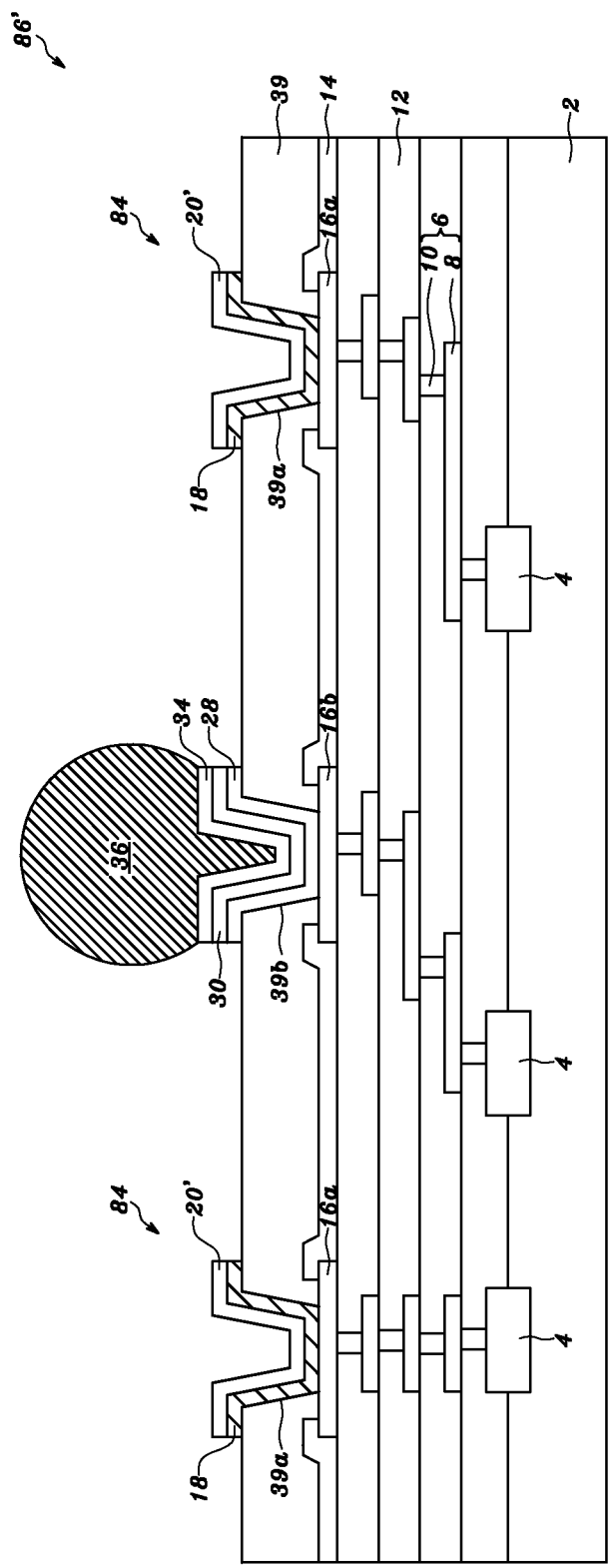

The material of the polymer layer 39 may include PI, BCB, polyurethane, epoxy, a parylene-based polymer, a solder-mask material, an elastomer, or a porous dielectric material. The polymer layer 39 can be fabricated by spin-coating, heat-pressing a dry film, or screen-printing. In a case, the polymer layer 39 can be formed by spin-on coating a photosensitive polyimide layer on the passivation layer 14 and on the bonding pads 16a and 16b, followed by exposing the polyimide layer using 1X stepper and scanner, followed by developing the polyimide layer, followed by curing the polyimide layer at the temperature of between 250 and 350 degrees C. in an nitrogen ambient. The polymer layer 39 has a thickness of between 1 and 30 μm. In a preferred case, the polymer layer 39 has a thickness of between 5 and 20 μm. Besides, those described above including the illustration for FIGS. 5A-5H may be referred to the applications of forming the semiconductor chip 86' shown in FIG. 5I. The process for forming the metal pad 84 on the bonding pad 16a can be referred to the above-mentioned process corresponding to FIGS. 5A-5C. During forming the metal pad 84, the above-mentioned adhesion/barrier layer 28 is sputtered on the polymer layer 39, and on the bonding pads 16a and 16b. The process for forming the tin-containing layer or bump 36 over the bonding pad 16b can be referred to the above-mentioned process corresponding to FIGS. 5D-5H. During forming the tin-containing layer or bump 36, the above-mentioned adhesion/barrier layer 28 is sputtered on the polymer layer 39, on the metal pad 84, and on the bonding pads 16b.

Alternatively, the tin-containing metal layer or bump 36 can be formed before forming the metal pad 84. The process for forming the tin-containing metal layer or bump 36 on the bonding pad 16b can be referred to the above-mentioned process corresponding to FIGS. 5D-5F. During forming the tin-containing metal layer or bump 36, the above-mentioned adhesion/barrier layer 28 is sputtered on the passivation layer 14 or polymer layer 39, and on the bonding pads 16a and 16b.

The process for forming the metal pad 84 on the bonding pad 16a can be referred to the above-mentioned process corresponding to FIGS. 5A-5C. During forming the metal pad 84, the above-mentioned adhesion/barrier layer 18 is sputtered on the passivation layer 14 or polymer layer 39, on the tin-containing metal layer or bump 36, and on the bonding pads 16a.

Figure 5J:
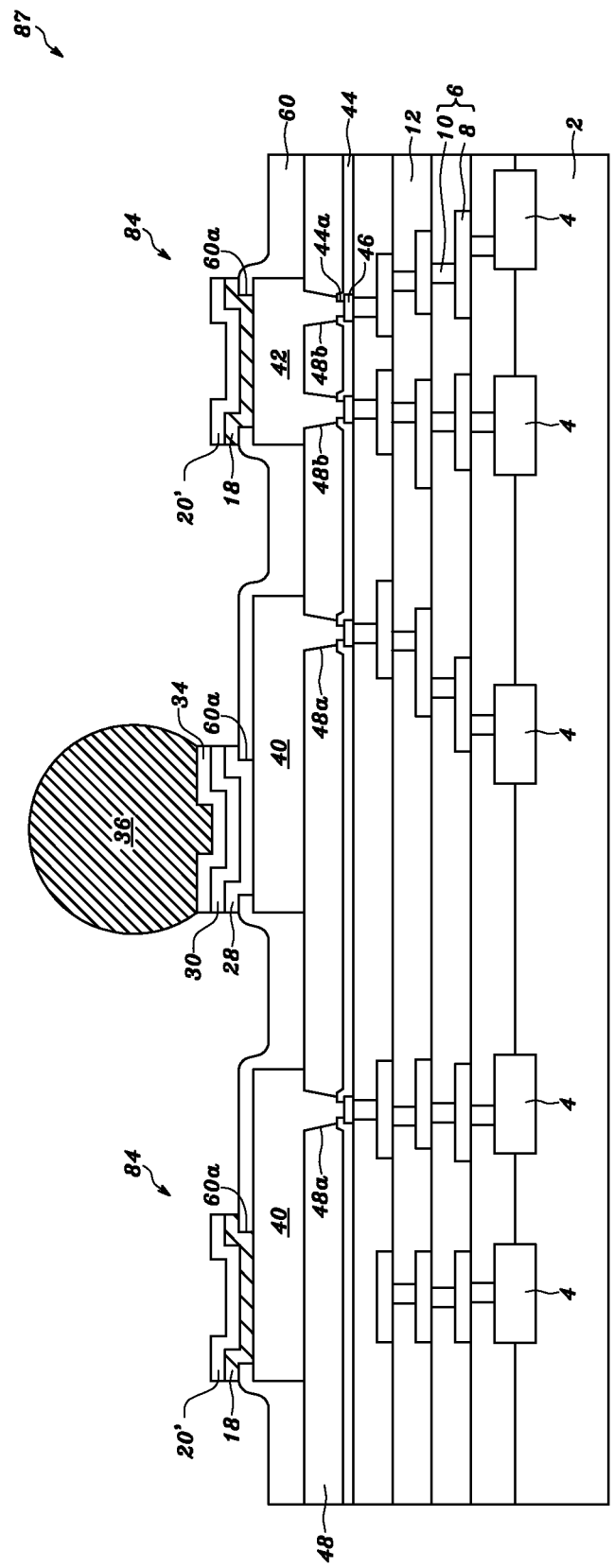
Figure 5K:
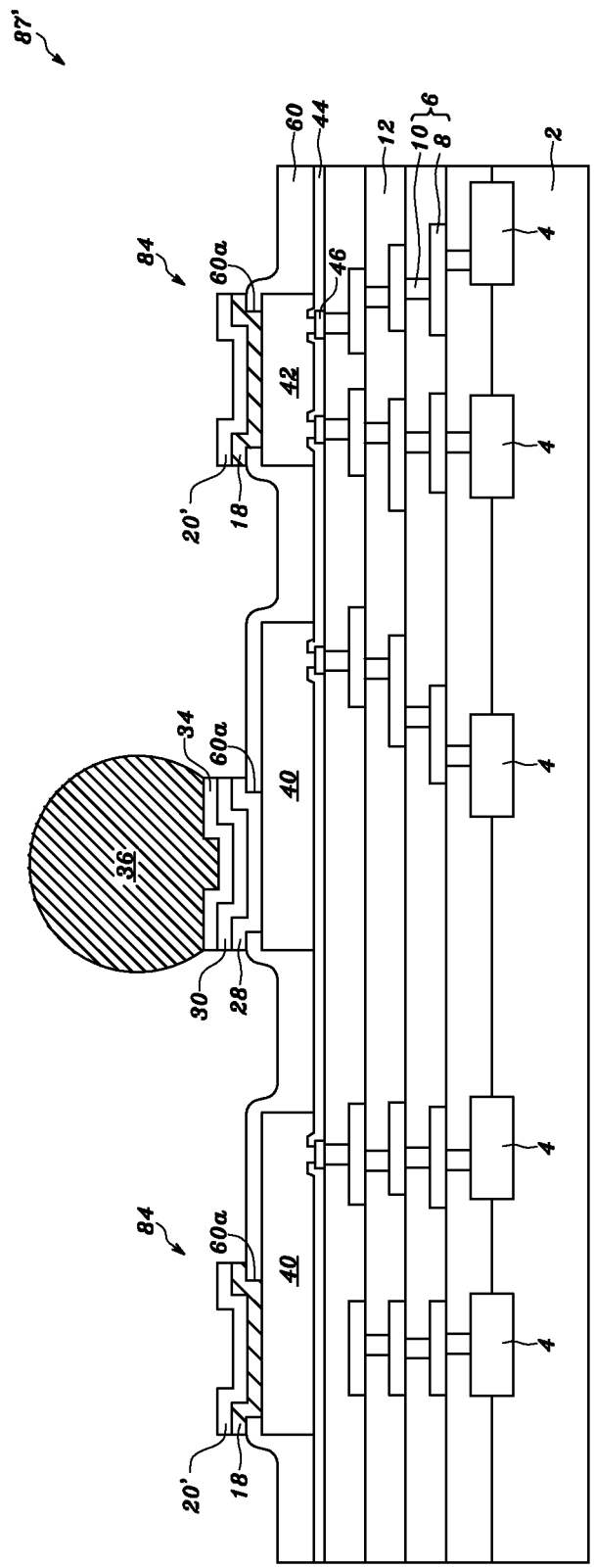

Similar to Embodiment 2, the concept of a RDL or an interconnecting trace can be applied to this embodiment. Referring to FIG. 5J and FIG. 5K, in this embodiment, a metal trace 40 functioning as a RDL and a meal trace 42 functioning as an interconnecting trace are simultaneously formed over the semiconductor substrate 2. The process for forming the metal traces 40 and 42 can be referred to as those shown in FIGS. 3A and 3B. Next, a metal pad 84 and a tin-containing metal layer or bump 36 are formed on the metal traces 40 and 42 exposed by the openings 60a according to the steps shown in from FIG. 5A to FIG. 5G The process for forming the metal pad 84 can be referred to the above-mentioned process corresponding to FIGS. 5A-5C. During forming the metal pad 84, the above-mentioned adhesion/barrier layer 18 is sputtered on the polymer layer 60, and on the pads exposed by the openings 60a. The process for forming the tin-containing layer or bump 36 can be referred to the above-mentioned process corresponding to FIGS. 5D-5H. During forming the tin-containing layer or bump 36, the above-mentioned adhesion/barrier layer 28 is sputtered on the polymer layer 60, on the metal pad 84, and on the bonding pads exposed by the openings 60a and not having the metal pad 84 formed thereon. According to the method described above, over the semiconductor chip 2 may be formed only a RDL or interconnecting trace, and the metal pad 84 and tin-containing metal layer or bump 36 are then formed on the RDL or interconnecting trace.

Embodiment 4

Figure 6A:
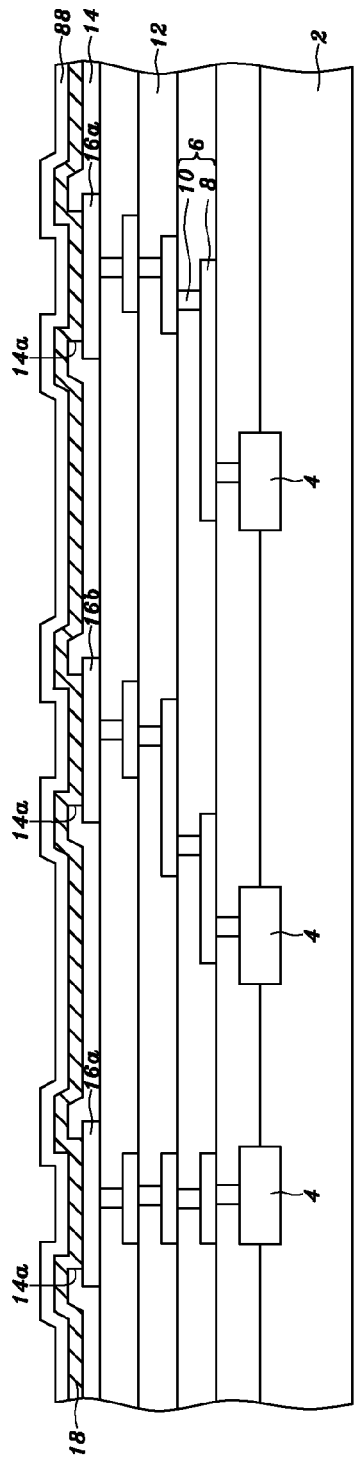
FIG. 6A to FIG. 6J are sectional views schematically showing the fabrication process according to one embodiment of the present invention.
Figure 6B:
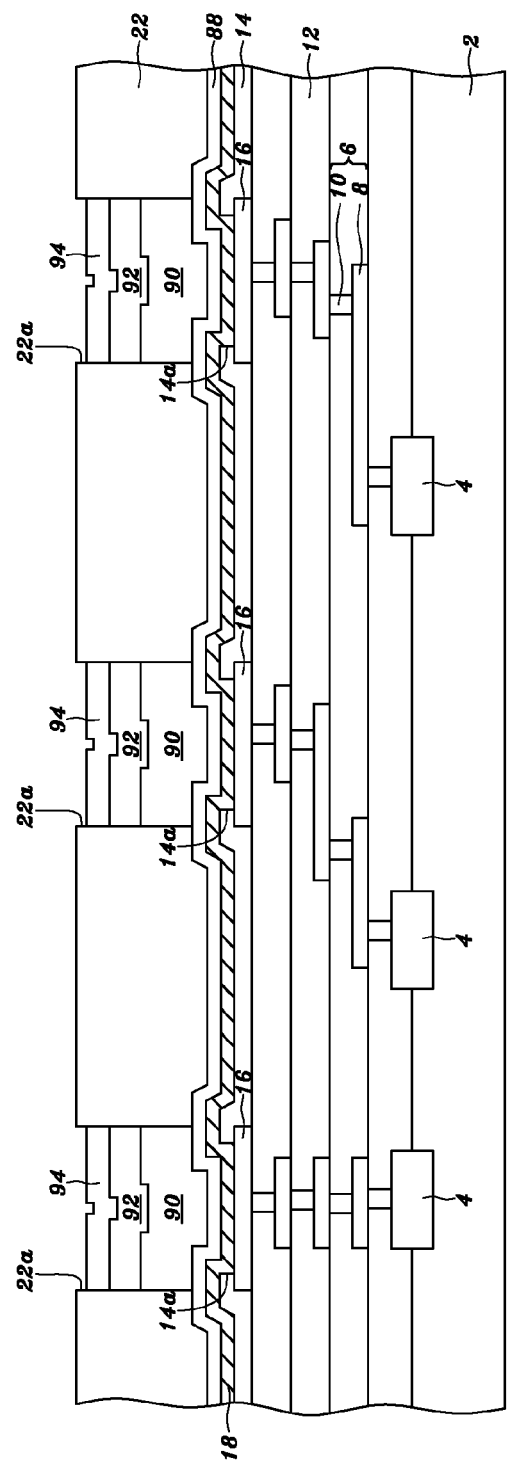
Figure 6C:
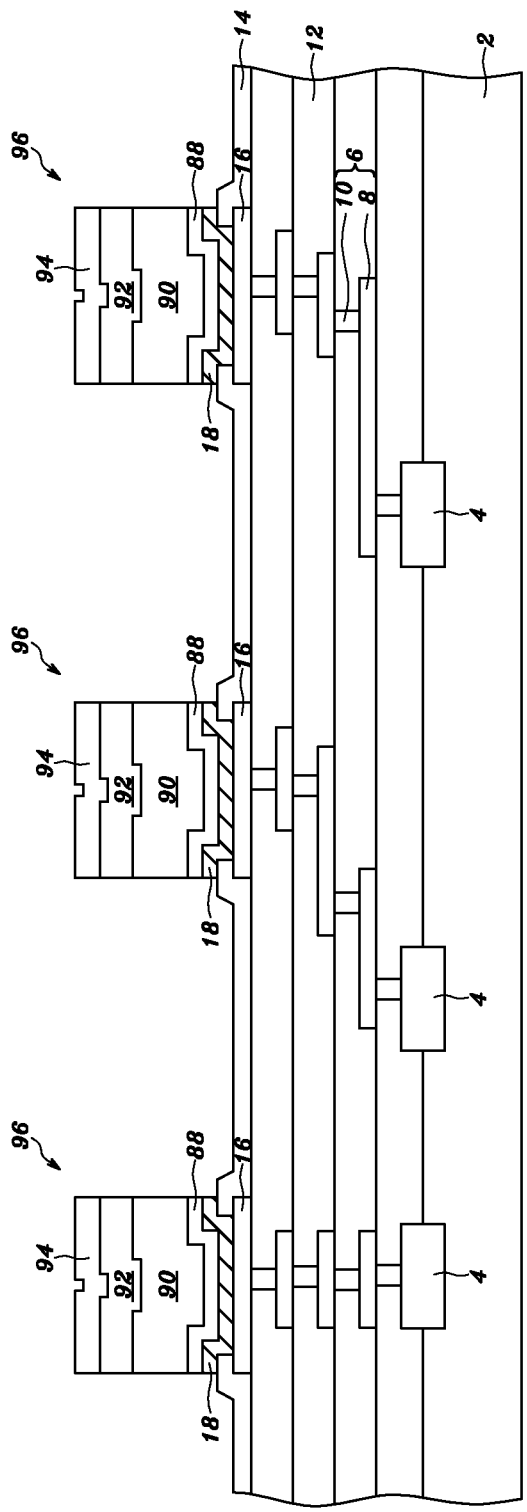

FIG. 6A to FIG. 6C are schematic cross-sectional views showing a method for forming multiple metal pads over a semiconductor wafer, wherein the metal pads may have wires (such as gold wires or copper wires) bonded thereon by a wire-bonding process, may have a tape bonded thereon using a tape automated bonding (TAB) process, may be bonded with metal bumps (such as gold bumps) preformed on an external circuit, may be bonded with tin-containing bumps preformed on an external circuit, or may be bonded with an external circuit using an ACF or an ACP.

Referring to FIG. 6A, an adhesion/barrier layer 18 having a thickness of 0.01 and 3 µm is formed on the passivation layer 14 and on the bonding pad 16 exposed by the opening 14a. The thickness of the adhesion/barrier layer 18 is preferred to be between 0.01 and 1 µm. The material of the adhesion/barrier layer 18 may include titanium, tungsten, cobalt, nickel, titanium nitride, a titanium-tungsten alloy, a nickel-vanadium alloy, aluminum, chromium, copper, gold, protactinium, platinum, palladium, ruthenium, rhodium, silver, or a composite of the above mentioned materials. The adhesion/barrier layer 18 may be fabricated by a sputtering method or a vapor deposition method.

Next, a copper layer 88 having a thickness of 0.005 and 2 µm is formed on the adhesion/barrier layer 18 with a sputtering method, a vapor deposition method, an electroplating method, an electroless plating method or a PVD method. The thickness of the copper layer 88 is preferred to be between 0.01 and 0.7 µm. When the adhesion/barrier layer 18 is formed by sputtering a titanium layer with a thickness of between 3000 and 8000 angstroms, the copper layer 88 can be sputtered with a thickness of between 100 and 3000 angstroms on the titanium layer. When the adhesion/barrier layer 18 is formed by sputtering a titanium-tungsten layer with a thickness of between 3000 and 8000 angstroms, the copper layer 88 can be sputtered with a thickness of between 100 and 3000 angstroms on the titanium-tungsten layer. When the adhesion/barrier layer 18 is formed by sputtering a chromium layer with a thickness of between 3000 and 8000 angstroms and then sputtering a chromium-copper-alloy layer with a thickness of between 500 and 3000 angstroms on the chromium layer, the copper layer 88 can be sputtered with a thickness of between 100 and 3000 angstroms on the chromium-copper-alloy layer. When the adhesion/barrier layer 18 is formed by sputtering an aluminum layer with a thickness of between 3000 and 8000 angstroms and then sputtering a nickel-vanadium-alloy layer with a thickness of between 3000 and 8000 angstroms on the aluminum, the copper layer 88 can be sputtered with a thickness of between 100 and 3000 angstroms on the nickel-vanadium-alloy layer.

Referring to FIG. 6B, a photoresist layer 22 is formed on the copper layer 88, and the photoresist layer 22 is patterned with exposingi and developing processes to form an opening 22a in the photoresist layer 22, exposing the copper layer 88 over the first bonding pad 16a. A 1X stepper or a 1X scanner is used to expose the photoresist layer 22.

Next, a copper layer 90 is electroplated on the copper layer 88 exposed by the opening 22a. The copper layer 90 has a thickness of between 1 and 35 µm, and preferably between 8 and 35 µm, for example. Alternatively, the copper layer 90 may be deposited by an electroless plating method. Next, a nickel layer 92 with a thickness of between 0.1 and 10 µm is electroplated on the copper layer 90 in the opening 22a in the photoresist layer 22. The thickness of the nickel layer 92 is preferred to be between 0.1 and 5 µm. Alternatively, the nickel layer 92 may be deposited by an electroless plating method. Next, a gold layer 94 with a thickness of between 0.01 and 10 µm is electroplated on the nickel layer 92 in the opening 22a. The thickness of the gold layer 94 is preferred to be between 0.1 and 2 µm. Alternatively, the gold layer 94 may be deposited by an electroless plating method.

Referring to FIG. 6C, after the gold layer 94 is formed, the photoresist layer 22 is removed. Next, the copper layer 88 and the adhesion/barrier layer 18 not under the copper layer 90 are removed. The adhesion/barrier layer 18 can be removed with a dry-etching method or a wet-etching method. The dry-etching method may be implemented with an argon sputter process. Alternatively, the adhesion/barrier layer 18 not under the copper layer 90 is wet etched using an etchant containing an $H_2O_2$ liquid in case that the adhesion/barrier layer 18 is a titanium-tungsten alloy or titanium.

Thus, multiple metal pads or bumps 96 are formed on multiple bonding pads 16 exposed by multiple openings 14a of the passivation layer 14. The metal pad or bump 96 comprises an adhesion/barrier layer 18, a copper layer 88 on the adhesion/barrier layer 18, a copper layer 90 on the copper layer 88, a nickel layer 92 on the copper layer 90 and a gold layer 94 on the nickel layer 92. The metal pad or bump 96 may have a bonding wire (such as a gold wire) bonded thereon by a wire-bonding process, may have a tape bonded thereon using a TAB process, may be bonded with a tin-containing bump preformed on an external circuit, may be bonded with a metal bump (such as a gold bump) preformed on an external circuit, or may be bonded with an external circuit via an ACP or an ACF.

Figure 6D:
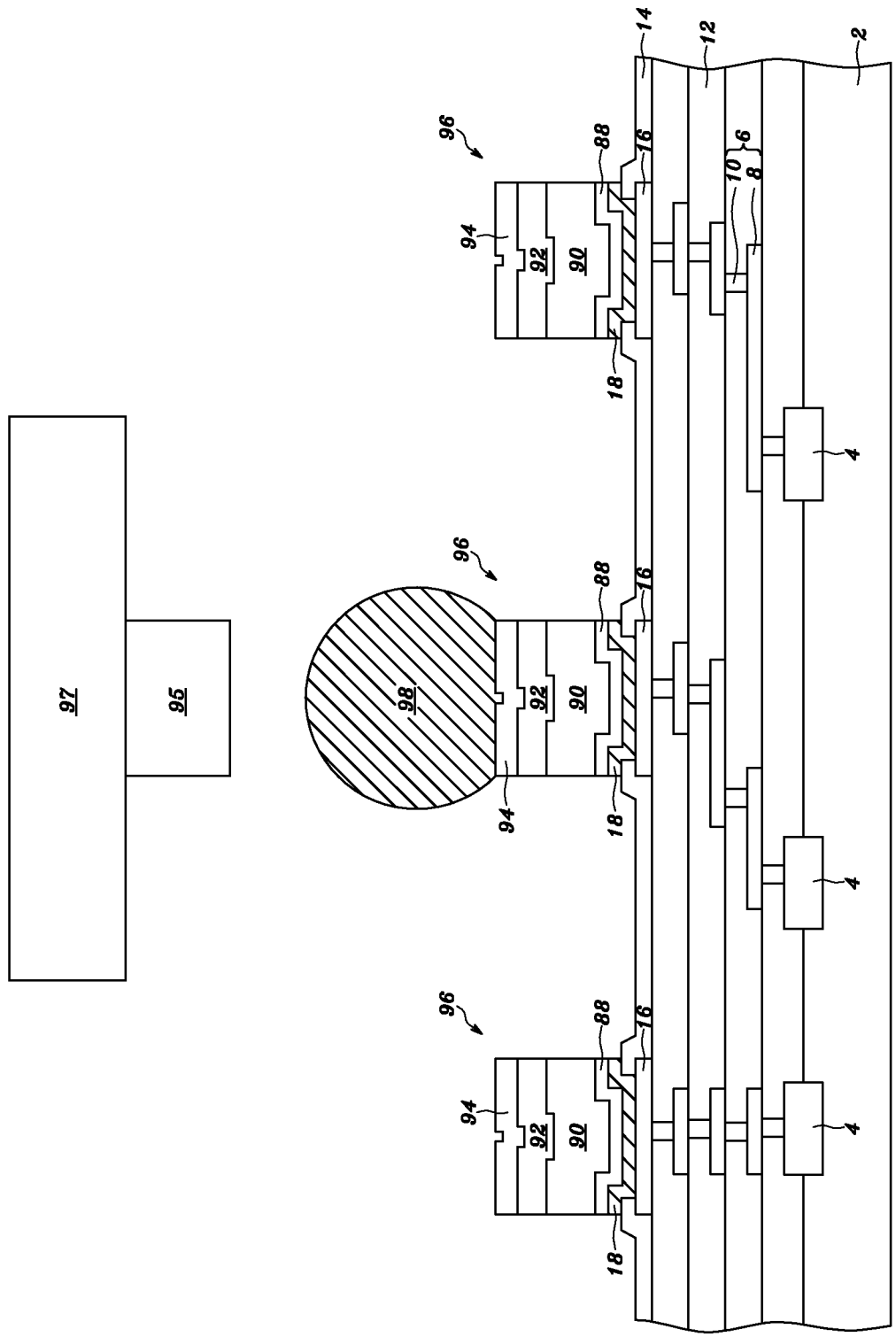

Referring to FIG. 6D, via a ball planting process, a tin-containing metal ball 98 is bonded to the gold layer 94 provided by some of the metal pads or bumps 96, wherein the tin-containing metal ball 98 has a diameter of between 1 and 500 µm, and preferably between 3 and 250 µm, for example.

Figure 6E:
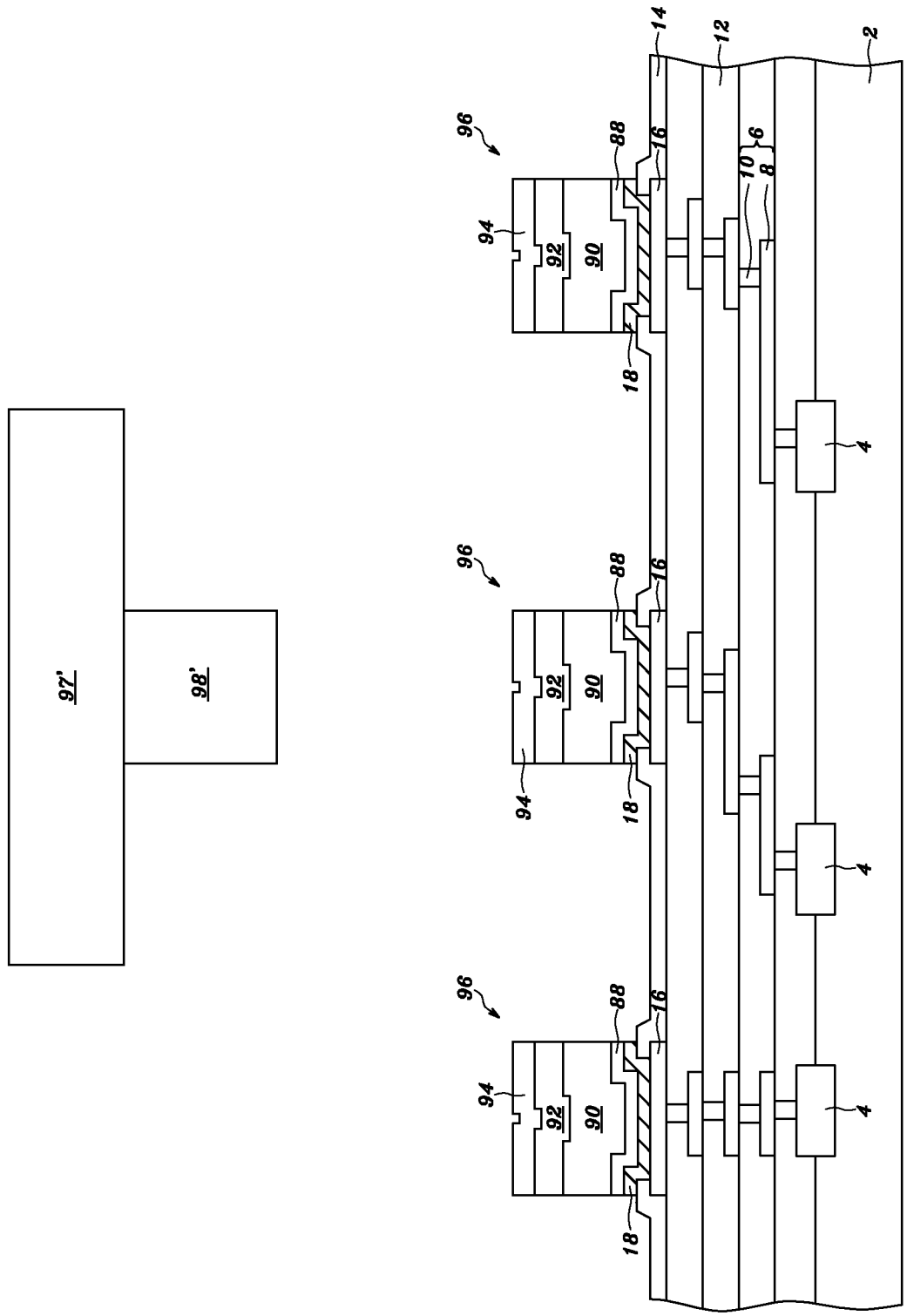
Figure 6F:
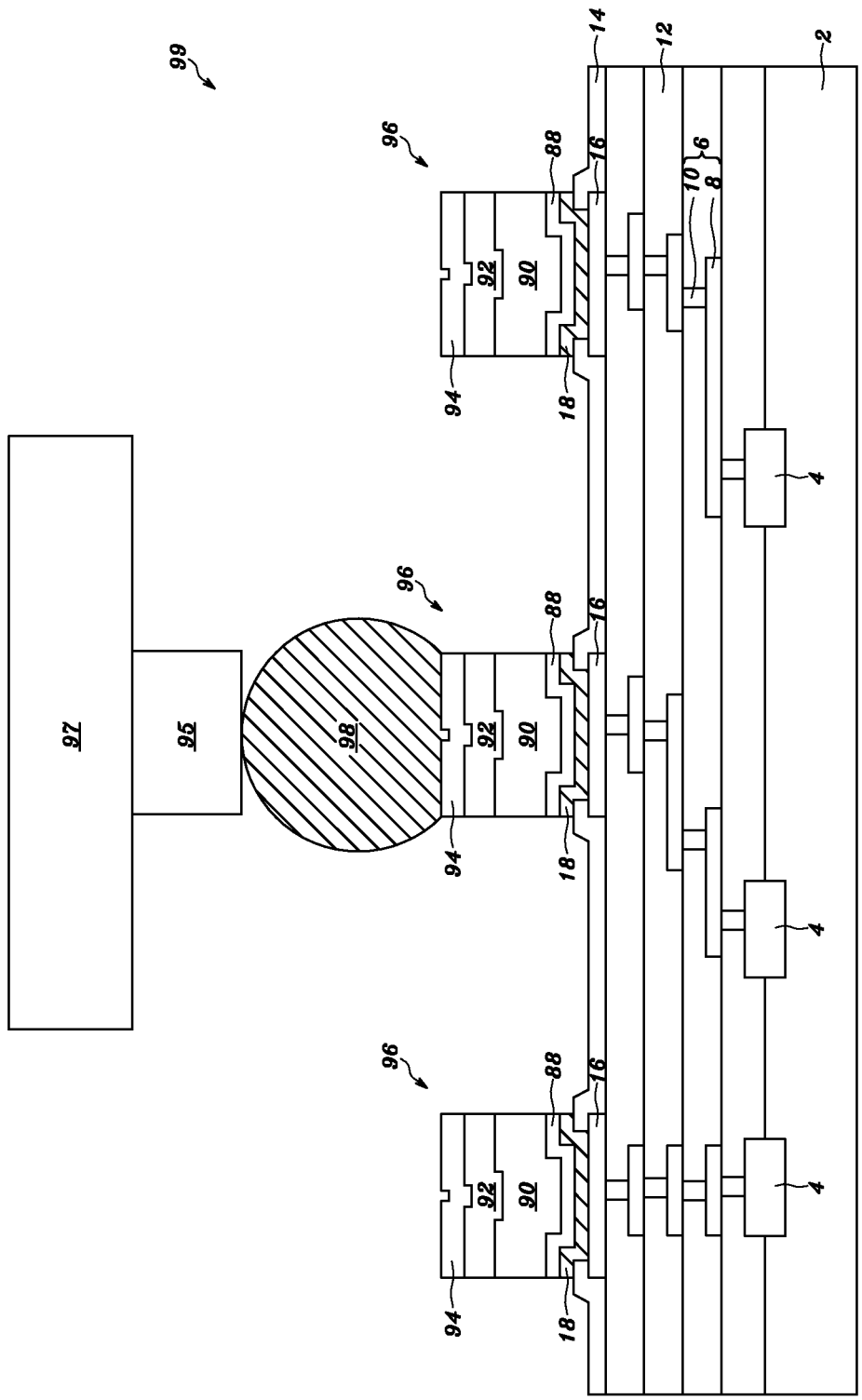

After the semiconductor substrate 2 is diced into multiple semiconductor chips 99, via a reflow process, the tin-containing metal ball 98 is bonded to a bonding pad 95 of an external circuit 97, as shown in FIG. 6F. The external circuit 97 may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a discrete passive device, such as inductor, capacitor, resistor or filter. The tin-containing metal ball 98 is, for example, a tin-lead alloy, a tin-silver alloy, a tin-silver-copper alloy, a lead-free alloy. Using a tin-lead solder for illustration, the weight ratio of tin to lead can be adjusted accordingly. A typical weight ratio of lead to tin is 90/10, 95/5, 97/3 or 37/63, etc.

Referring to FIG. 6E, alternatively, a tin-containing metal layer or bump 98' may be beforehand formed on an external circuit 97'. Then, via a reflow process, the tin-containing metal layer 98' is connected to the gold layer 94 of the metal pad or bump 96. Thereby, the metal pad or bump 96 is connected to the external circuit 97'.

Referring to FIG. 6F, after completing the above-mentioned process, the semiconductor substrate 2 is diced into multiple semiconductor chips 99. Each of the semiconductor chips 99 comprises a semiconductor substrate 2, a circuit structure 6, multiple dielectric layers 12, a passivation layer 14 and multiple metal pads or bumps 96. Multiple semiconductor devices 4, such as transistors or MOS devices, are in or over the semiconductor substrate 2. Some of the semiconductor devices 4 may be under the metal pad or bump 96. The semiconductor devices 4 are electrically connected to the metal pads or bumps 96, respectively. The passivation layer 14 may include a topmost silicon-nitride layer of the individual semiconductor chip 99. Besides, the passivation layer 14 may include a topmost silicon-oxide layer of the individual semiconductor chip 99.

Therefore, some of the metal pads or bumps 96 of each semiconductor chip 99 may have the tin-containing metal ball 98 formed thereon to be connected with an external circuit or may be bonded with the tin-containing metal layer 98' preformed on an external circuit to be connected with the external circuit. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter.

Alternatively, some of the metal pads or bumps 96 of each semiconductor chip 99 may be bonded with a metal bump (such as a gold bump) preformed on an external circuit. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter.

Figure 6G:
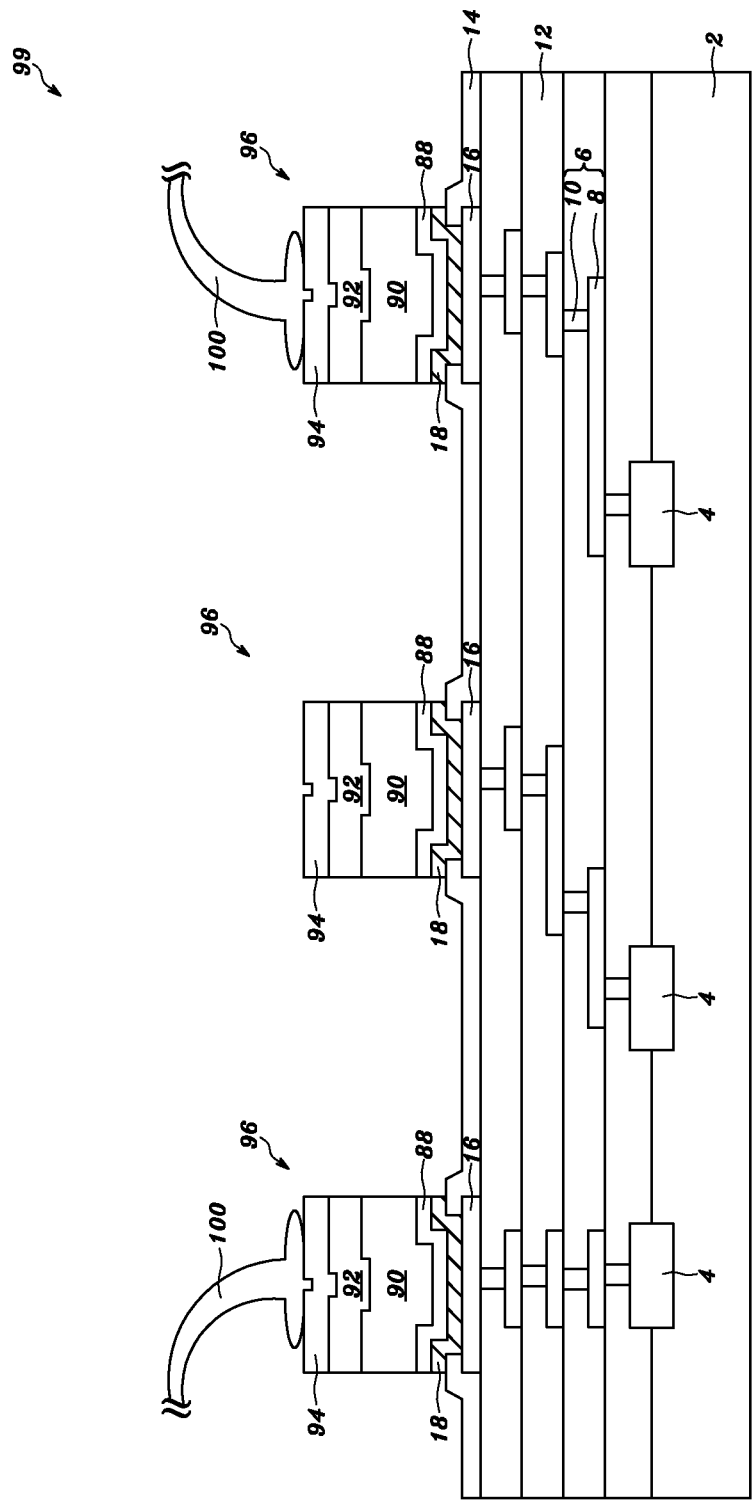

Referring to FIG. 6G, alternatively, some of the metal pads or bumps 96 of each semiconductor chip 99 may be bonded with a bonding wire 100 (such as a gold wire or a copper wire) using a wirebonding process to be connected with an external circuit. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter.

Alternatively, some of the metal pads or bumps 96 of each semiconductor chip 99 may be bonded with a tape to be connected with an external circuit. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter. The tape comprises at least one polymer layer, at least one metal trace made of copper on the polymer layer, and a tin layer or tin-silver-alloy layer on the metal trace. When the tape is bonded to the metal pad or bump 96, the tin layer or tin-silver-alloy layer preformed on the metal trace of the tape can be joined with the metal pad or bump 96.

Alternatively, the metal pad or bump 96 of one semiconductor chip 99 can be pressed into ACF or ACP via a thermal-press process; thereby, the metallic particles in the ACF or ACP are clustered between the metal pad or bump 96 and a ITO-containing pad of an external circuit (such as a glass substrate). By the way, the metal pad or bump 96 and the ITO-containing pad of the external circuit are thus electrically connected to each other. Alternatively, the metal pad or bump 96 of one semiconductor chip 99 can be bonded with other kinds of external circuit, such as semiconductor chip, printed circuit board (PCB) comprising a glass fiber as a core, flexible tape comprising a polymer layer (such as polyimide) having a thickness of between 30 and 200 μm and not comprising any polymer layer with glass fiber, ceramic substrate comprising a ceramic material as insulating layers between circuit layers, or a discrete passive device, such as inductor, capacitor, resistor or filter, using ACF or ACP.

From those described above, it is known that this embodiment has the following ten aspects:

1. Some of the metal pads or bumps 96 of the semiconductor chip 99 are bonded with the tin-containing metal balls 98 or the tin-contain metal layers 98', and the rest of the metal pads or bumps 96 not having the tin-containing metal ball 98 or tin-contain metal layer 98' bonded therewith are bonded with the bonding wires 100 using a wirebonding process.

2. Some of the metal pads or bumps 96 of the semiconductor chip 99 are bonded with the tin-containing metal balls 98 or the tin-contain metal layers 98', and the rest of the metal pads or bumps 96 not having the tin-containing metal balls 98 or tin-contain metal layers 98' bonded therewith are bonded with the above-mentioned tape using a tape automated bonding (TAB) technology.

3. Some of the metal pads or bumps 96 of the semiconductor chip 99 are bonded with the tin-containing metal balls 98 or the tin-contain metal layers 98', and the rest of the metal pads or bumps 96 not having the tin-containing metal ball 98 or tin-contain metal layer 98' bonded therewith ate connected with an external circuit via ACP or ACF.

4. Some of the metal pads or bumps 96 of the semiconductor chip 99 are bonded with the above-mentioned tape using a tape automated bonding (TAB) technology to be connected with an external circuit, and the rest of the metal pads or bumps 96 not having the tape bonded thereon are connected with an external circuit via ACP or ACF.

5. Some of the metal pads or bumps 96 of the semiconductor chip 99 are bonded with a tape to be connect with an external circuit, and the rest of the metal pads or bump 96 not having the tape bonded thereon are bonded with bonding wires using a wirebonding process.

6. Some the metal pads or bumps 96 of the semiconductor chip 99 are bonded with bonding wires using a wirebonding process, and the rest of the metal pads or bumps 96 not having bonding wires formed thereon are connected with an external circuit via ACP or ACF.

7. Some of the metal pads or bumps 96 of the semiconductor chip 99 are bonded with metal bumps preformed on an external circuit, and the rest of the metal pads or bumps 96 not having the metal bumps bonded therewith are bonded with bonding wires.

8. Some of the metal pads or bumps 96 of the semiconductor chip 99 are bonded with metal bumps preformed on an external circuit, and the rest of the metal pads or bumps 96 not having the metal bumps bonded therewith are bonded with the above-mentioned tape using a tape automated bonding (TAB) technology.

9. Some of the metal pads or bumps 96 of the semiconductor chip 99 are bonded with metal bumps, such as gold bump having a gold layer with a thickness of between 8 and 35 microns, preformed on an external circuit, and the rest of the metal pads or bumps 96 not having the metal bumps bonded therewith are bonded with the tin-containing metal balls 98 or the tin-contain metal layers 98'.

10. Some of the metal pads or bumps 96 of the semiconductor chip 99 are bonded with metal bumps preformed on an external circuit, and the rest of the metal pads or bumps 96 not having the metal bumps bonded therewith are connected with an external circuit via ACP or ACF.

Alternatively, the tin-containing metal ball 98 can be planted on the metal pad 96 after the semiconductor substrate 2 is diced into multiple semiconductor chips. Alternatively, the metal bump or the tin-containing layer or bump 98' preformed on an external circuit can be joined with the metal pad 96 after the semiconductor substrate 2 is diced into multiple semiconductor chips. The external circuit may be a semiconductor chip, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, or a discrete passive device, such as inductor, capacitor, resistor or filter. After some of the metal pads 94 are bonded with the tin-containing ball 98 or with the tin-containing layer or metal bump preformed on an external circuit, the rest of the metal pads can be bonded with a bonding wire (gold wire or copper wire) using a wirebonding process, with the above-mentioned tape using a TAB process, or with an external circuit using ACF or ACP.

Therefore, in the present invention, on some of the bonding pad exposed by the opening of the passivation layer can be formed metal pads or bumps 96 to be bonded with tin-containing metal balls, with tin-containing metal layers preformed on an external circuit, with bonding wires (such as gold wires) using a wirebonding process, with a tape (via a TAB technology), with metal bumps (such as gold bumps) preformed on an external circuit, or with an external circuit via ACF or ACP.

Figure 6H:
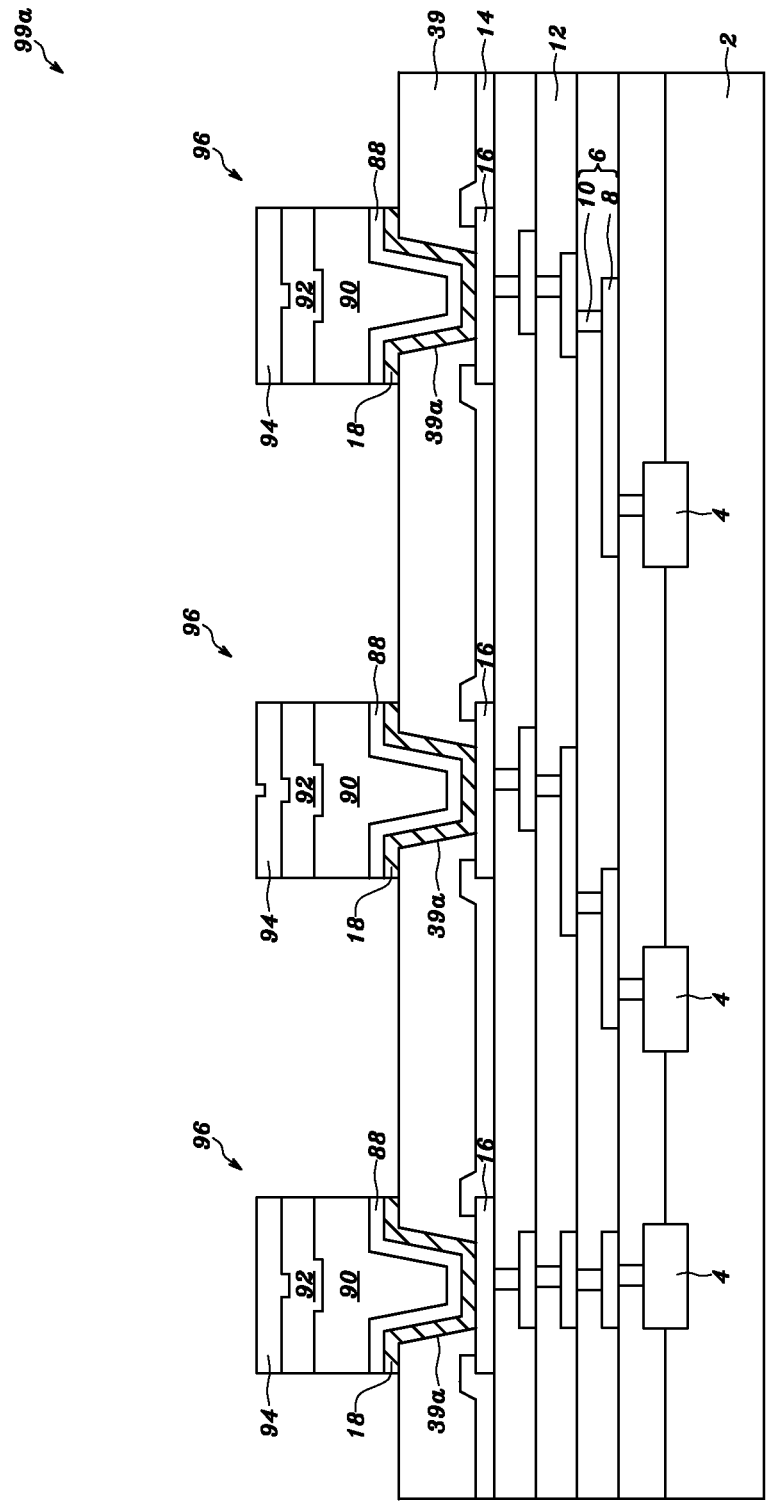

Referring to FIG. 6H, in this embodiment, a polymer layer 39 may be beforehand formed on the passivation layer 14; multiple openings 39 in the polymer layer 39 expose multiple the bonding pads 16. Next, according to the steps shown in from FIG. 6A to FIG. 6C, the metal pad or bump 96 is formed on the bonding pad 16 exposed by the opening 39a in the polymer layer 39. The process for forming the metal pad or bump 96 on the bonding pads 16 can be referred to the above-mentioned process corresponding to FIGS. 6A-6C. During forming the metal pad or bump 96, the above-mentioned adhesion/barrier layer 18 is sputtered on the polymer layer 39, and on the bonding pads 16 exposed by the openings 39a in the polymer layer 39.

The material of the polymer layer 39 may include PI, BCB, polyurethane, epoxy, a parylene-based polymer, a solder-mask material, an elastomer, or a porous dielectric material. The polymer layer 39 can be fabricated by spin-coating, heat-pressing a dry film, or screen-printing. In a case, the polymer layer 39 can be formed by spin-on coating a photosensitive polyimide layer on the passivation layer 14 and on the bonding pads 16, followed by exposing the polyimide layer using 1X stepper and scanner, followed by developing the polyimide layer, followed by curing the polyimide layer at the temperature of between 250 and 350 degrees C. in an nitrogen ambient. The polymer layer 39 has a thickness of between 1 and 30 µm. In a preferred case, the polymer layer 39 has a thickness of between 5 and 20 µm. Besides, those described above including the illustration for FIGS. 6A-6G may be referred to the applications of forming the semiconductor chip 99a shown in FIG. 6H. The process for forming the metal pad 96 on the bonding pad or bump 16 can be referred to the above-mentioned process corresponding to FIGS. 6A-6G During forming the metal pad or bump 96, the above-mentioned adhesion/barrier layer 18 is sputtered on the polymer layer 39, and on the bonding pads or bumps 16.

Figure 6I:
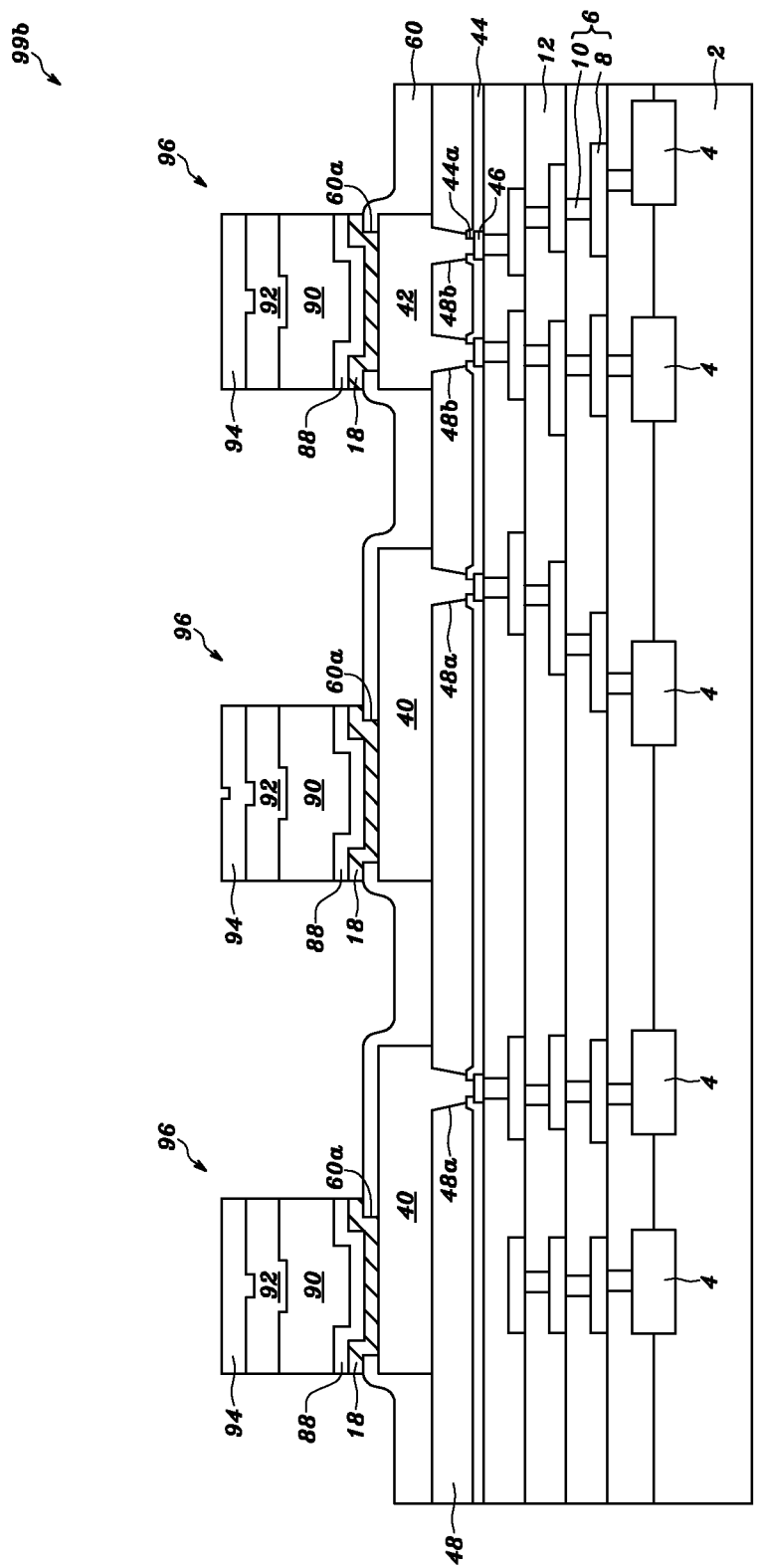
Figure 6J:
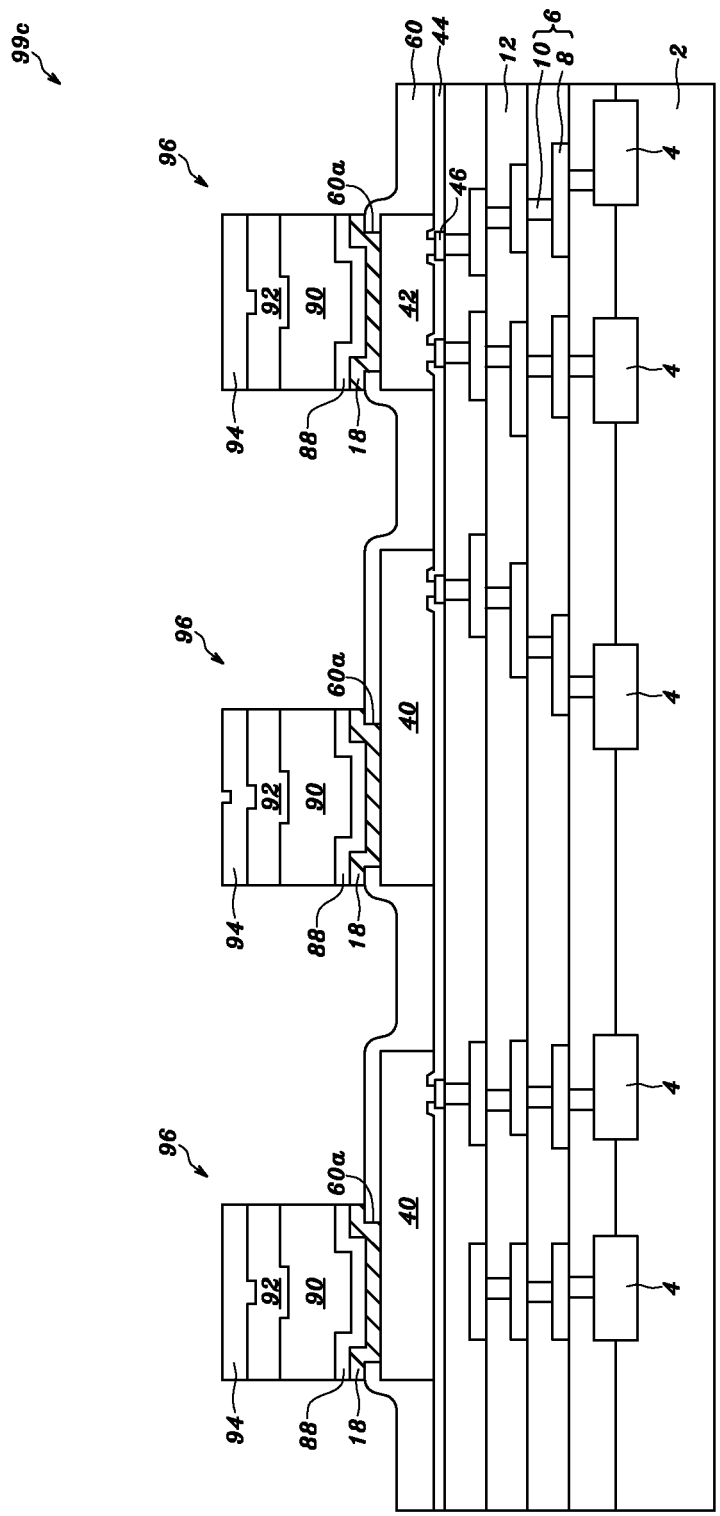

Similar to Embodiment 2, the concept of a RDL or an interconnecting trace can be applied to this embodiment. Referring to FIG. 6I and FIG. 6J, in this embodiment, a metal trace 40 functioning as a RDL and a meal trace 42 functioning as an interconnecting trace are simultaneously formed over the semiconductor substrate 2. The process for forming the metal traces 40 and 42 can be referred to as those shown in FIGS. 3A and 3B. Next, multiple metal pads or bumps 96 are formed on the metal traces 40 and 42 exposed by the openings 60a according to the steps shown in from FIG. 6A to FIG. 6C. During forming the metal pad or bump 96, the above-mentioned adhesion/barrier layer 18 is sputtered on the polymer layer 60, and on the pads exposed by the openings 60a. According to the method described above, over the semiconductor chip 2 may be formed only a RDL or interconnecting trace, and the metal pads or bumps 96 are then formed on the RDL or interconnecting trace.

Embodiment 5

Figure 7A:
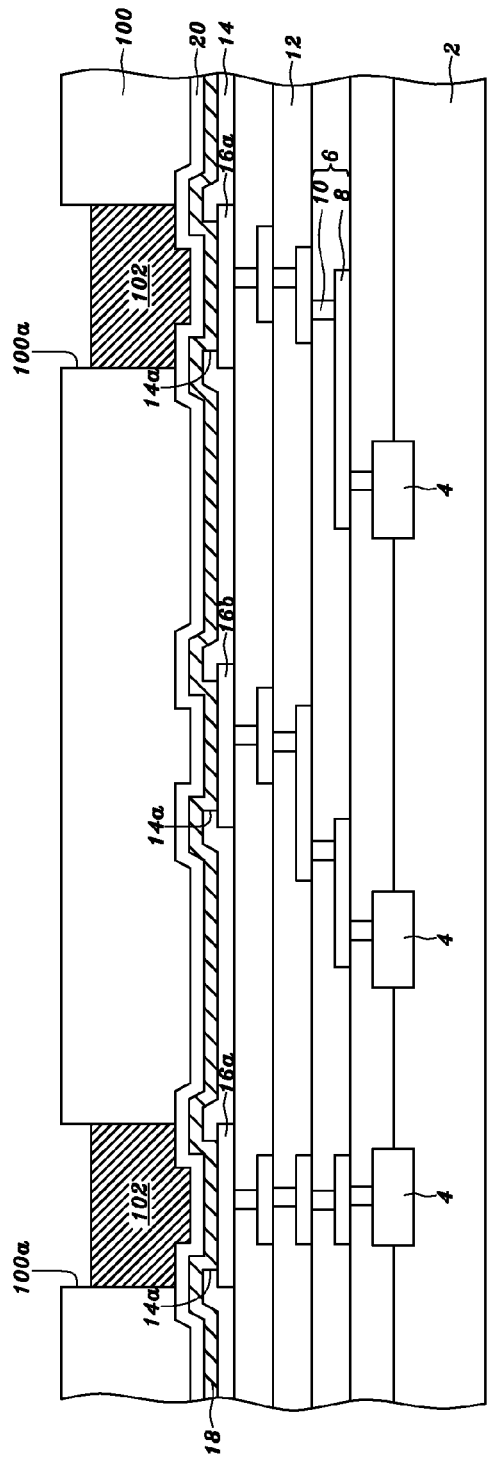

Referring to FIG. 7A, after the step shown in FIG. 2A is completed, a photoresist layer 100 is formed on the seed layer 20, and the photoresist layer 100 is patterned with exposing and developing processes to form an opening 100a in the photoresist layer 100, exposing the seed layer 20 over the first bonding pad 16a. A 1X stepper or a 1X scanner is used to expose the photoresist layer 100.

Next, a metal layer 102 is formed on the seed layer 20 exposed by the opening 100a. The metal layer 102 has a thickness of between 1 and 200 µm and, for example, a thickness of between 1 and 50 µm. The thickness of the metal layer 102 is preferred to be between 2 and 30 µm. The metal layer 102 may be deposited by an electroplating method or an electroless plating method. The metal layer 102 may be a single layer made of gold, copper, silver, palladium, platinum, rhodium, ruthenium, rhenium, or nickel. The metal layer 102 may also be a composite layer made of the above mentioned metals.

For example, the metal layer 102 may be deposited by electroplating a gold layer with a thickness of between 8 and 35 μm on the seed layer 20 made of gold exposed by the opening 100a. Alternatively, the metal layer 102 may be deposited by electroplating a copper layer with a thickness of between 8 and 35 μm on the seed layer 20 made of copper exposed by the opening 100a. Alternatively, the metal layer 102 is formed by electroplating a copper layer with a thickness of between 8 and 35 μm on the seed layer 20 made of copper exposed by the opening 100a in the photoresist layer 100, next electroplating a nickel layer with a thickness of between 0.1 and 10 μm, and preferably with a thickness of between 0.1 and 5 μm, on the copper layer in the opening 100a, next electroplating a gold layer with a thickness of between 0.01 and 10 μm, and preferably with a thickness of between 0.1 and 2 μm, on the nickel layer in the opening 100a.

Figure 7B:
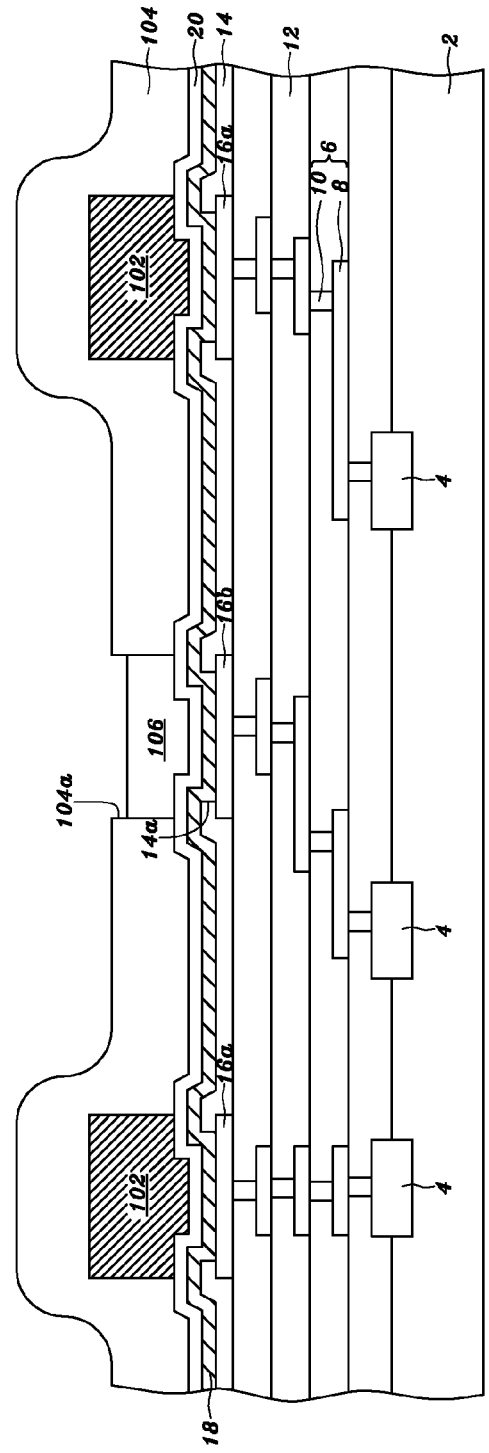

Referring to FIG. 7B, after the metal layer 102 is formed, the photoresist layer 100 is removed. Next, a photoresist layer 104 is formed on the seed layer 20 and metal layer 102, and the photoresist layer 104 is patterned with exposing and developing processes to form an opening 104a in the photoresist layer 104, exposing the seed layer 20 over the second bonding pad 16b. A 1X stepper or a 1X scanner is used to expose the photoresist layer 104.

Next, a metal layer 106 is formed on the seed layer 20 exposed by the opening 104a. The metal layer 106 has a thickness of between 1 and 20 μm, and preferably between 2 and 10 μm, for example. The metal layer 106 may be deposited by an electroplating method or an electroless plating method. The metal layer 106 may be a single layer made of gold, copper, silver, palladium, platinum, rhodium, ruthenium, rhenium, or nickel. The metal layer 106 may also be a composite layer made of the above mentioned metals.

For example, the metal layer 106 may be deposited by electroplating a gold layer with a thickness of between 1 and 20 μm on the seed layer 20 made of gold exposed by the opening 104a. Alternatively, the metal layer 106 may be deposited by electroplating a copper layer with a thickness of between 1 and 20 μm on the seed layer 20 made of copper exposed by the opening 104a. Alternatively, the metal layer 106 is formed by electroplating a copper layer with a thickness of between 1 and 15 μm on the seed layer 20 made of copper exposed by the opening 104a in the photoresist layer 104, next electroplating a nickel layer with a thickness of between 0.1 and 5 μm on the copper layer in the opening 104a, next electroplating a gold layer with a thickness of between 0.01 and 3 μm on the nickel layer in the opening 104a.

Therefore, the metal layer 102 or the metal layer 106 may be one of the following structures:

1. Both of the metal layer 102 and the metal layer 106 are a single gold layer mentioned above.
2. Both of the metal layer 102 and the metal layer 106 are a copper/nickel/gold structure mentioned above.
3. The metal layer 102 is a single gold layer mentioned above, and the metal layer 106 is a copper/nickel/gold structure mentioned above.
4. The metal layer 102 is a copper/nickel/gold structure mentioned above, and the metal layer 106 is a single gold layer mentioned above.

Referring to FIG. 7C, after the metal layer 106 is formed, the photoresist layer 104 is removed. Next, the seed layer 20 and the adhesion/barrier layer 18 not under the metal layer 102 and the metal layer 106 are removed. The adhesion/barrier layer 18 can be removed with a dry-etching method or a wet-etching method. The dry-etching method may be implemented with an argon sputter process. Alternatively, the adhesion/barrier layer 18 not under the metal layer 102 and the metal layer 106 is wet etched using an etchant containing an $H_2O_2$ liquid in case that the adhesion/barrier layer 18 is a titanium-tungsten alloy or titanium. If the seed layer 20 is made of gold, it can be removed with an iodine-containing etchant, such as a potassium iodine solution.

A metal pad 108 and a metal pad 110 are formed on the first bonding pad 16a exposed by the opening 14a in the passivation layer 14 and on the second bonding pad 16b exposed by the opening 14a in the passivation layer 14, respectively. The metal pad 108 comprises an adhesion/barrier layer 18, a seed layer 20 over the adhesion/barrier layer 18 and a metal layer 102 over the seed layer 20. The metal pad 108 may have a wire (such as a gold wire or a copper wire) bonded thereon by a wire-bonding process, may have a tape bonded thereon using a tape automated bonding (TAB) process, may be bonded with a metal bump (such as a gold bump) preformed on an external circuit, may be bonded with a tin-containing bump preformed on an external circuit, may be bonded with a tin-containing metal ball by a ball planting process, or may be bonded with an external circuit using an ACF or an ACP. The metal pad 110 comprises an adhesion/barrier layer 18, a seed layer 20 over the adhesion/barrier layer 18 and a metal layer 106 over the seed layer 20. The metal pad 110 may have a wire (such as a gold wire or a copper wire) bonded thereon by a wire-bonding process, may have a tape bonded thereon using a TAB process, may be bonded with a metal bump (such as a gold bump) preformed on an external circuit, may be bonded with a tin-containing bump preformed on an external circuit, may be bonded with a tin-containing metal ball by a ball planting process, or may be bonded with an external circuit using an ACF or an ACP.

For example, when the metal pad 110 is bonded with a bonding wire by a wirebonding process, the metal pad 108 is bonded with a tape by a TAB process. Alternatively, when the metal pad 110 is bonded with a bonding wire (such as a gold wire or a copper wire) by a wirebonding process, the metal pad 108 is also bonded with a bonding wire (such as a gold wire or a copper wire) by a wirebonding process. Alternatively, when the metal pad 110 is bonded with a bonding wire (such as a gold wire or a copper wire) by a wirebonding process, the metal pad 108 is bonded with a metal bump (such as a gold bump) preformed on an external circuit. Alternatively, when the metal pad 110 is bonded with a bonding wire (such as a gold wire or a copper wire) by a wirebonding process, the metal pad 108 is bonded with a tin-containing metal layer or a tin-containing metal ball preformed on an external circuit. Alternatively, when the metal pad 110 is bonded with a bonding wire (such as a gold wire or a copper wire) by a wirebonding process, the metal pad 108 is bonded with an external circuit using an ACF or an ACP.

For example, when the metal pad 110 is bonded with a metal bump (such as a gold bump) preformed on an external circuit, the metal pad 108 is bonded with a tape via a TAB process. Alternatively, when the metal pad 110 is bonded with a metal bump (such as a gold bump) preformed on an external circuit, the metal pad 108 is bonded with a bonding wire (such as a gold wire or a copper wire) by a wirebonding process. Alternatively, when the metal pad 110 is bonded with a metal bump (such as a gold bump) preformed on an external circuit, the metal pad 108 is also bonded with a metal bump (such as a gold bump) preformed on an external circuit. Alternatively, when the metal pad 110 is bonded with a metal bump (such as a gold bump) preformed on an external circuit, the metal pad 108 is bonded with a tin-containing metal layer or a tin-containing metal ball preformed on an external circuit. Alternatively, when the metal pad 110 is bonded with a metal bump (such as a gold bump) preformed on an external circuit, the metal pad 108 is bonded with an external circuit using an ACF or an ACP.

For example, when the metal pad 110 is bonded with a tin-containing metal layer or a tin-containing metal ball preformed on an external circuit, the metal pad 108 is bonded with a metal bump (such as a gold bump) preformed on an external circuit. Alternatively, when the metal pad 110 is bonded with a tin-containing metal layer or a tin-containing metal ball preformed on an external circuit, the metal pad 108 is bonded with a tape by a TAB process. Alternatively, when the metal pad 110 is bonded with a tin-containing metal layer or a tin-containing metal ball preformed on an external circuit, the metal pad 108 is bonded with a bonding wire (such as a gold wire or a copper wire) by a wirebonding process. Alternatively, when the metal pad 110 is bonded with a tin-containing metal layer or a tin-containing metal ball preformed on an external circuit, the metal pad 108 is also bonded with a tin-containing metal layer or a tin-containing metal ball preformed on an external circuit. Alternatively, when the metal pad 110 is bonded with a tin-containing metal layer or a tin-containing metal ball preformed on an external circuit, the metal pad 108 is bonded with an external circuit using an ACF or an ACP.

Alternatively, the above-mentioned types of bonding the metal pad 110 to an external circuit and of bonding the metal pad 108 to an external circuit may be switched to each other.

This embodiment is further exemplified with the case that the top layers of the metal layer 102 and the metal layer 106 are gold layers. (For example, the top layers of the above mentioned four structures of the metal layer 102 and the metal layer 106 are all gold layers.) When the metal layer 106 of the metal pad 110 is bonded with a gold wire by a wirebonding process, the metal layer 102 of the metal pad 108 is bonded with a tape by a TAB process. Alternatively, when the metal layer 106 of the metal pad 110 is bonded with a gold wire by a wirebonding process, the metal layer 102 of the metal pad 108 is also bonded with a gold wire by a wirebonding process. Alternatively, when the metal layer 106 of the metal pad 110 is bonded with a metal bump (such as a gold bump) preformed on an external circuit, the metal layer 102 of the metal pad 108 is bonded with a tape by a TAB process. Alternatively, when the metal layer 106 of the metal pad 110 is bonded with a metal bump (such as a gold bump) preformed on an external circuit, the metal layer 102 of the metal pad 108 is bonded with a gold wire by a wirebonding process. Alternatively, when the metal layer 106 of the metal pad 110 is bonded with a metal bump (such as a gold bump) preformed on an external circuit, the metal layer 102 of the metal pad 108 is also bonded with a metal bump (such as a gold bump) preformed on an external circuit.

Thus, in this embodiment, on the bonding pads exposed by the opening in the passivation layer can be respectively formed different-thickness metal pad 108 and metal pad 110, which are to be bonded with a bonding wire (via a wireboning process), with a tape (via a TAB technology), with a metal bump (such as a gold bump) preformed on an external circuit, with a tin-containing metal layer preformed on an external circuit, with a tin-containing metal ball (via a ball planting process), or with an external circuit via ACF or ACP. The metal pads 108 and the metal pads 110 may have a topmost wettable layer, such as gold, used to be wirebonded there to.

Referring to FIG. 7D, after completing the above-mentioned process, the semiconductor substrate 2 is diced into multiple semiconductor chips 112. Each of the semiconductor chips 112 comprises a semiconductor substrate 2, a circuit structure 6, multiple dielectric layers 12, a passivation layer 14, at least one metal pad 108, and at least one metal pad 110. Multiple semiconductor devices 4, such as transistors or MOS devices, are in or over the semiconductor substrate 2. Some of the semiconductor devices 4 may be under the metal pad 108 or the metal pad 110. Two of the semiconductor devices 4 are electrically connected to the metal pad 108 and the metal pad 110, respectively. The passivation layer 14 may include a topmost silicon-nitride layer of the individual semiconductor chip 112. Besides, the passivation layer 14 may include a topmost silicon-oxide layer of the individual semiconductor chip 112.

Each semiconductor chip 112 can be connected to an external circuit via the metal pads 108 and 110. The external circuit may be a semiconductor chip, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, or a discrete passive device, such as inductor, capacitor, resistor or filter. The connection methods include: 1. a metal pad 108 or 110 of a semiconductor chip 112 is bonded with a bonding wire (such as a gold wire or a copper wire) by a wirebonding process to be connected with the external circuit; 2. a metal pad 108 or 110 of a semiconductor chip 112 is bonded with a tape by a TAB processs to be connected to the external circuit, wherein the tape comprises at least one polymer layer, at least one metal trace made of copper on the polymer layer, and a tin layer or tin-silver-alloy layer on the metal trace. When the tape is bonded to the metal pad 108 or 110, the tin layer or tin-silver-alloy layer preformed on the metal trace of the tape can be joined with the metal pad 108 or 110; 3. a metal pad 108 or 110 of a semiconductor chip 112 is bonded with a metal bump, such as a gold bump, preformed on the external circuit, to be connected to the external circuit; 4. a metal pad 108 or 110 of a semiconductor chip 112 can be pressed into ACF or ACP via a thermal-press process; thereby, the metallic particles in the ACF or ACP are clustered between the metal pad 108 or 110 and an ITO-containing pad of the external circuit (such as a glass substrate), thereby, the metal pad 108 or 110 being electrically connected to the ITO-containing pad of the external circuit; 5. a metal pad 108 or 110 of a semiconductor chip 112 is bonded with a tin-containing metal layer or a tin-containing metal ball, preformed on the external circuit, to be connected with the external circuit.

Alternatively, in this embodiment, the metal pad 110 can be connected to external circuits via a tin-containing metal layer, a tin-containing metal ball, or metal bump (such as gold bump) before the semiconductor substrate 2 is diced. The external circuit may be a semiconductor chip, a printed circuit board (PCB) comprising a glass fiber as a core, a glass substrate, a flexible tape comprising a polymer layer (such as polyimide) having a thickness of between 30 and 200 µm and not comprising any polymer layer with glass fiber, a ceramic substrate comprising a ceramic material as insulating layers between circuit layers, or a discrete passive device, such as inductor, capacitor, resistor or filter. Next, the semiconductor substrate 2 is diced into multiple semiconductor chips. Then, the metal pad 108 of each semiconductor chip is bonded with a bonding wire (via a wireboning process), with a tape (via a TAB technology), with a metal bump (such as a gold bump)

preformed on an external circuit, with a tin-containing metal layer preformed on an external circuit, or with an external circuit via ACF or ACP.

Figure 7E:
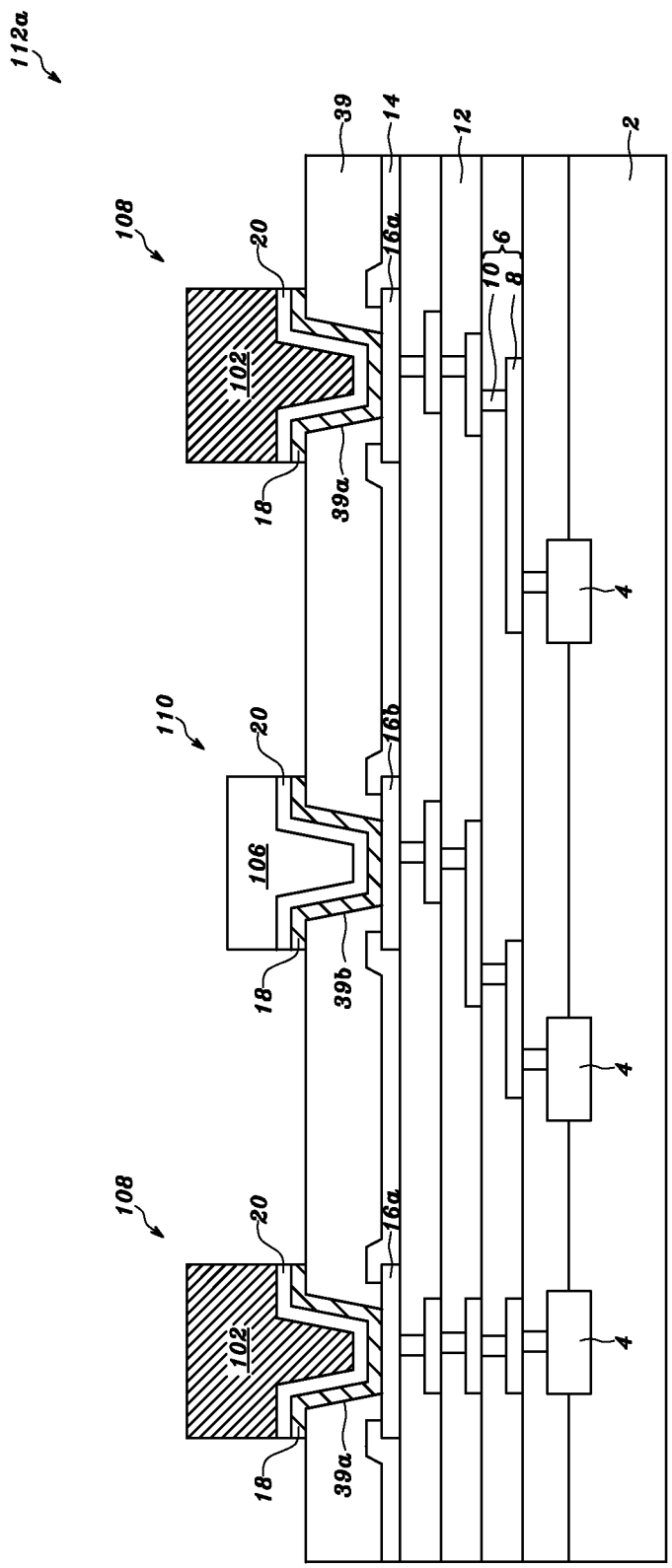

Referring to FIG. 7E, in this embodiment, a polymer layer 39 may be beforehand formed on the passivation layer 14; multiple openings 39a and multiple openings 39b expose the first bonding pad 16a and the second bonding pad 16b. Next, according to the steps shown in from FIG. 7A to FIG. 7D, the metal pad 108 is formed on the first bonding pad 16a exposed by the opening 39a in the polymer layer 39, and the metal pad 110 is formed on the second bonding pad 16b exposed by the opening 39b in the polymer layer 39. The process for forming the metal pad 108 and the metal pad 110 on the bonding pads 16a and 16b can be referred to the above-mentioned process corresponding to FIGS. 7A-7C. During forming the metal pad 108 and the metal pad 110, the above-mentioned adhesion/barrier layer 18 is sputtered on the polymer layer 39, on the bonding pads 16a exposed by the openings 39a in the polymer layer 39, and on the bonding pads 16b exposed by the openings 39b in the polymer layer 39.

The material of the polymer layer 39 may include PI, BCB, polyurethane, epoxy, a parylene-based polymer, a solder-mask material, an elastomer, or a porous dielectric material. The polymer layer 39 can be fabricated by spin-coating, heat-pressing a dry film, or screen-printing. In a case, the polymer layer 39 can be formed by spin-on coating a photosensitive polyimide layer on the passivation layer 14 and on the bonding pads 16a and 16b, followed by exposing the polyimide layer using 1X stepper and scanner, followed by developing the polyimide layer, followed by curing the polyimide layer at the temperature of between 250 and 350 degrees C. in an nitrogen ambient. The polymer layer 39 has a thickness of between 1 and 30 μm. In a preferred case, the polymer layer 39 has a thickness of between 5 and 20 μm. Besides, those described above including the illustration for FIGS. 7A-7D may be referred to the applications of forming the semiconductor chip 112a shown in FIG. 7E. The process for forming the metal pads or bumps 108 and 110 on the bonding pads 16a and 16b can be referred to the above-mentioned process corresponding to FIGS. 7A-7D. During forming the metal pads or bumps 108 and 110, the above-mentioned adhesion/barrier layer 18 is sputtered on the polymer layer 39, and on the bonding pads 16a and 16b.

Figure 7F:
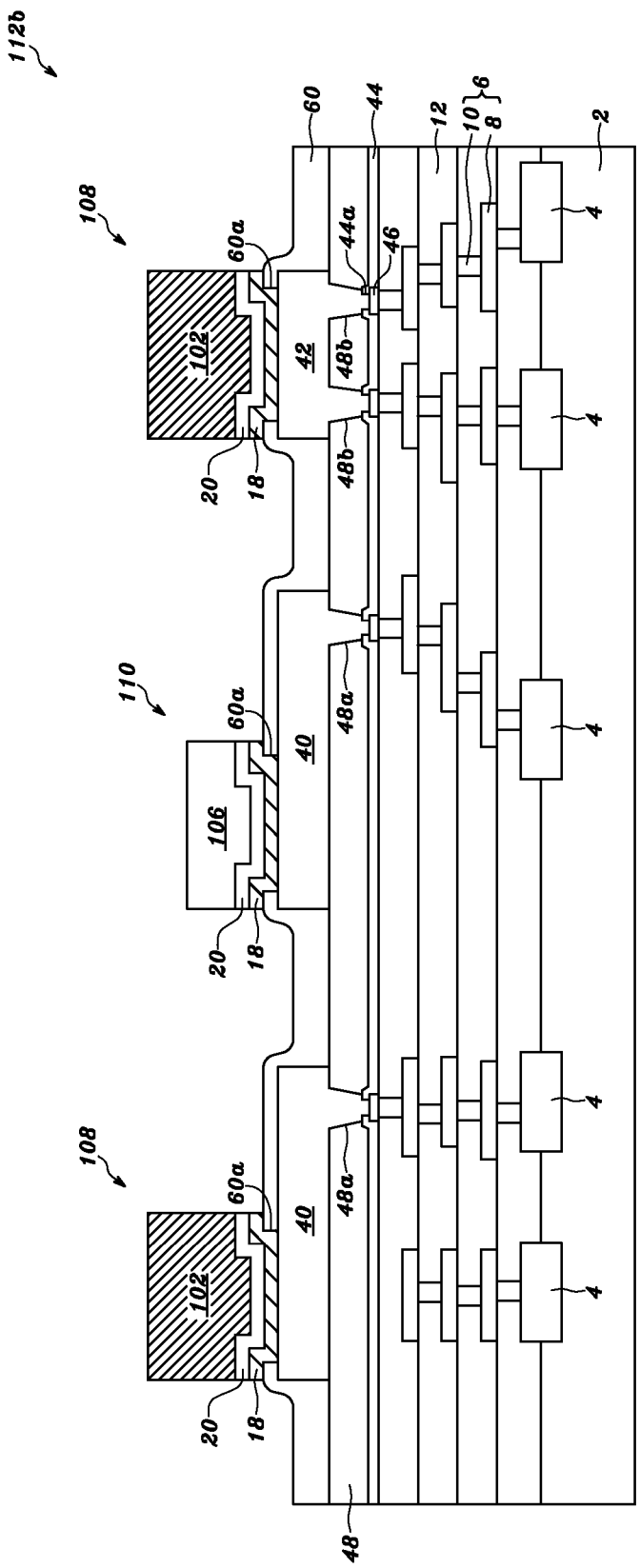
Figure 7G:
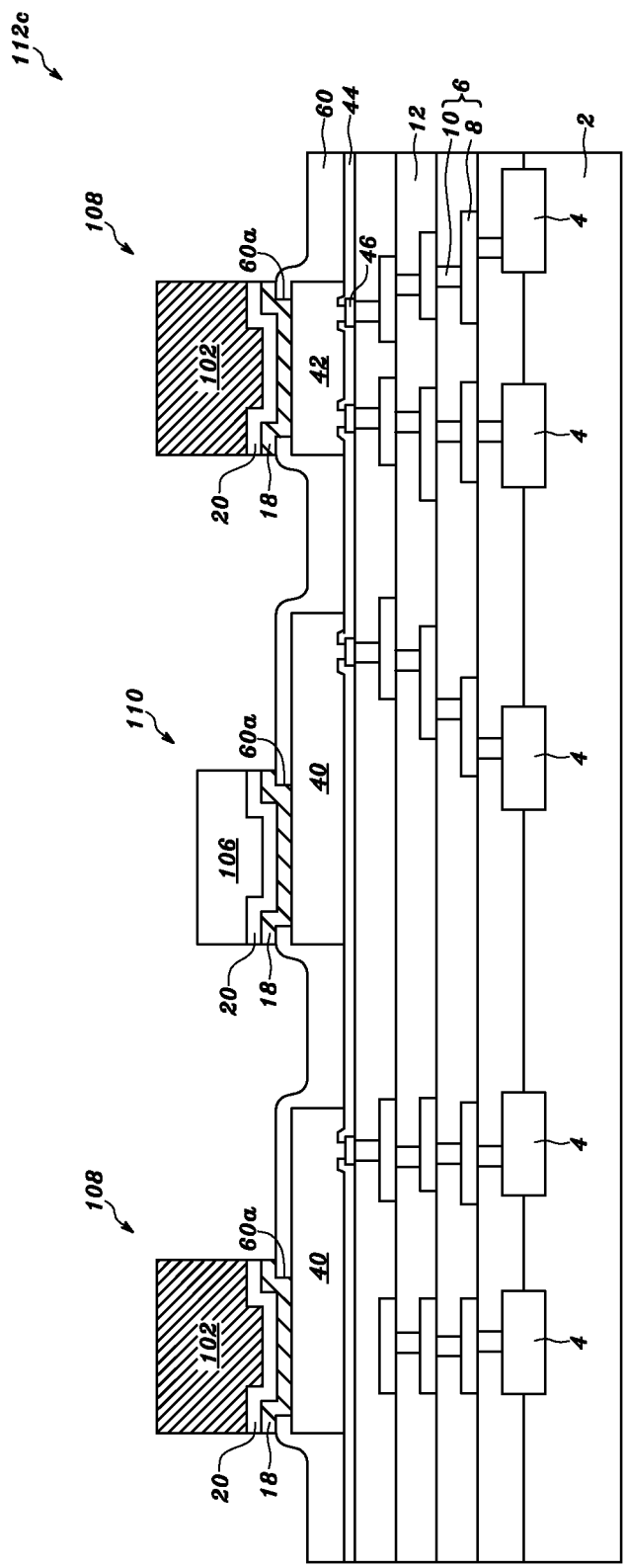

Similar to Embodiment 2, the concept of a RDL or an interconnecting trace can be applied to this embodiment. Referring to FIG. 7F and FIG. 7G, in this embodiment, a metal trace 40 functioning as a RDL and a meal trace 42 functioning as an interconnecting trace are simultaneously formed over the semiconductor substrate 2. The process for forming the metal traces 40 and 42 can be referred to as those shown in FIGS. 3A and 3B. Next, the metal pads 108 and the metal pads 110 are formed on the metal traces 40 and 42 exposed by the openings 60a according to the steps shown in from FIG. 7A to FIG. 7C. The process for forming the metal pads 108 and 110 can be referred to the above-mentioned process corresponding to FIGS. 7A-7D. During forming the metal pads 108 and 110, the above-mentioned adhesion/barrier layer 18 is sputtered on the polymer layer 60, and on the pads exposed by the openings 60a. According to the method described above, over the semiconductor chip 2 may be formed only a RDL or interconnecting trace, and the metal pad 108 and the metal pad 110 are then formed on the RDL or interconnecting trace.

Embodiment 6

Referring to FIG. 8A, after the step shown in FIG. 2A is completed, a photoresist layer 114 is formed on the seed layer 20, and the photoresist layer 114 is patterned with exposing and developing processes to form an opening 114a in the photoresist layer 114, exposing the seed layer 20 over the bonding pad 16. A 1X stepper or a 1X scanner is used to expose the photoresist layer 114.

Next, a metal layer 116 is formed on the seed layer 20 exposed by the opening 144a. The metal layer 116 has a thickness of between 1 and 200 μm and, for example, a thickness of between 1 and 50 μm. The thickness of the metal layer 116 is preferred to be between 2 and 30 μm. The metal layer 116 may be deposited by an electroplating method or an electroless plating method. The metal layer 116 may be a single layer made of gold, copper, silver, palladium, platinum, rhodium, ruthenium, rhenium, or nickel. The metal layer 116 may also be a composite layer made of the above mentioned metals.

For example, the metal layer 116 may be deposited by electroplating a gold layer with a thickness of between 8 and 35 μm on the seed layer 20 made of gold exposed by the opening 144a. Alternatively, the metal layer 116 may be deposited by electroplating a copper layer with a thickness of between 8 and 35 μm on the seed layer 20 made of copper exposed by the opening 144a. Alternatively, the metal layer 116 is formed by electroplating a copper layer with a thickness of between 8 and 35 μm on the seed layer 20 made of copper exposed by the opening 114a in the photoresist layer 114, next electroplating a nickel layer with a thickness of between 0.1 and 10 μm, and preferably with a thickness of between 0.1 and 5 μm, on the copper layer in the opening 144a, next electroplating a gold layer with a thickness of between 0.01 and 10 μm, and preferably with a thickness of between 0.1 and 2 μm, on the nickel layer in the opening 144a.

Figure 8C:
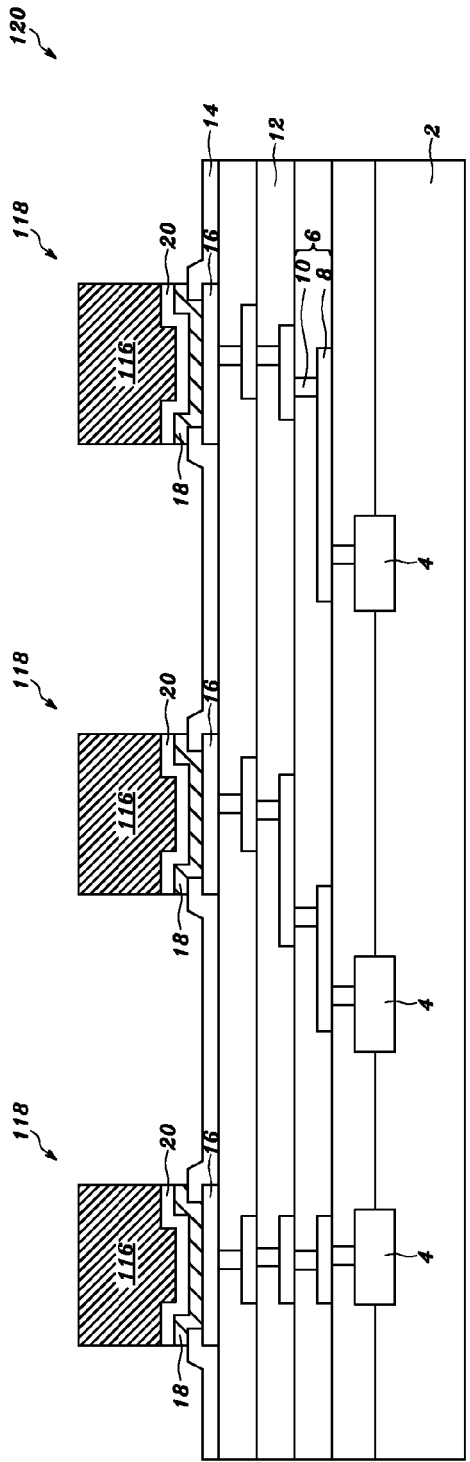
Figure 8D:
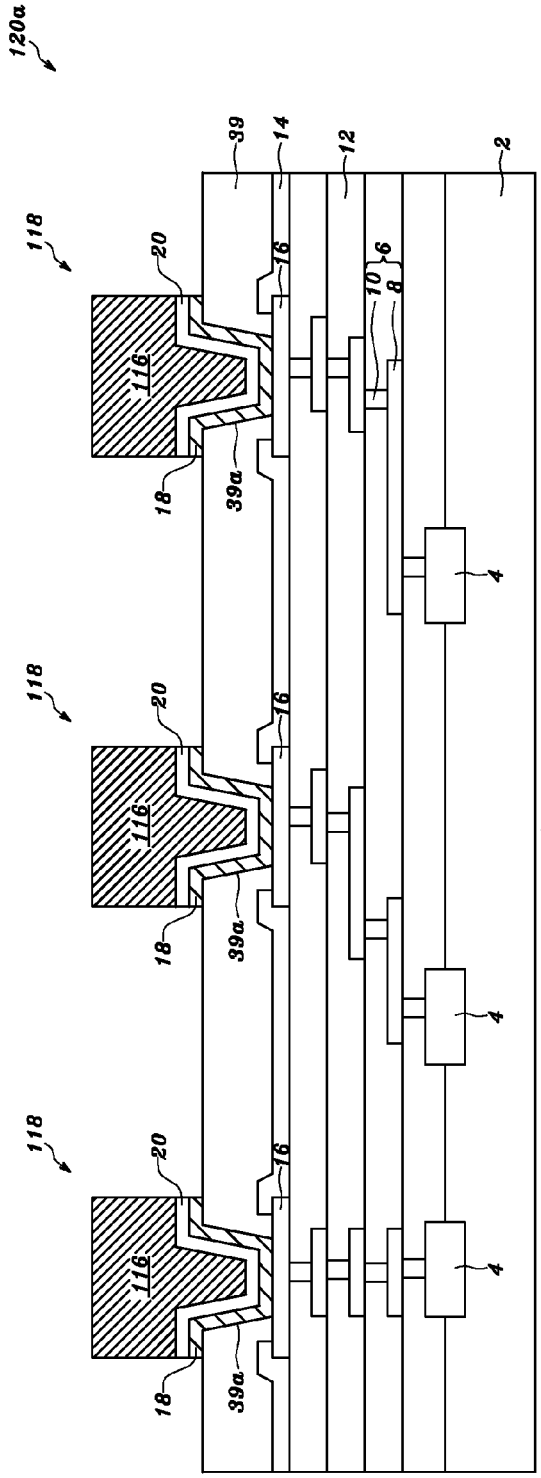

Referring to FIG. 8D, after the metal layer 116 is formed, the photoresist layer 114 is removed. Next, the seed layer 20 and the adhesion/barrier layer 18 not under the metal layer 116 are removed. The adhesion/barrier layer 18 can be removed with a dry-etching method or a wet-etching method. The dry-etching method may be implemented with an argon sputter process. Alternatively, the adhesion/barrier layer 18 not under the metal layer 116 is wet etched using an etchant containing an H2O2 liquid in case that the adhesion/barrier layer 18 is a titanium-tungsten alloy or titanium. If the seed layer 20 is made of gold, it can be removed with an iodine-containing etchant, such as a potassium iodine solution.

Thus, multiple metal pads 118 with the same thickness are formed on multiple bonding pads 16 exposed by multiple openings 14a in the passivation layer 14. The metal pad 118 comprises an adhesion/barrier layer 18, a seed layer 20 on the adhesion/barrier layer 18 and a metal layer 116 on the seed layer 20. The metal pad 118 may have a wire (such as a gold wire or a copper wire) bonded thereon by a wire-bonding process, may have a tape bonded thereon using a TAB process, may be bonded with a metal bump (such as a gold bump) preformed on an external circuit, may be bonded with a tin-containing layer bump preformed on an external circuit, may be bonded with a tin-containing metal ball by a ball planting process, or may be bonded with an external circuit using an ACF or an ACP.

For example, when some of metal pads 118 are bonded with bonding wires (such as gold wires or copper wires) via a wirebonding process, the rest of the metal pads 118 are bonded with a tape via a TAB technology. Alternatively, when some of metal pads 118 are bonded with bonding wires (such as gold wires or copper wires) via a wirebonding process, the rest of the metal pads 118 are bonded with metal bumps (such as gold bumps) preformed on an external circuit. Alternatively, when some of metal pads 118 are bonded with bonding wires (such as gold wires or copper wires) via a wirebonding process, the rest of the metal pads 118 are bonded with tin-containing metal layers or bumps preformed on an external circuit or tin-containing metal balls. Alternatively, when some of metal pads 118 are bonded with bonding wires (such as gold wires or copper wires) via a wirebonding process, the rest of the metal pads 118 are bonded with an external circuit via an ACP or an ACF.

For example, when some of metal pads 118 are bonded with metal bumps (such as gold bumps) preformed on an external circuit, the rest of the metal pads 118 are bonded with a tape via a TAB technology. Alternatively, when some of metal pads 118 are bonded with metal bumps (such as gold bumps) preformed on an external circuit, the rest of the metal pads 118 are bonded with bonding wires (such as gold wires or copper wires) via a wirebonding process. Alternatively, when some of metal pads 118 are bonded with metal bumps (such as gold bumps) preformed on an external circuit, the rest of the metal pads 118 are bonded with tin-containing metal layers or bumps preformed on an external circuit or tin-containing metal balls. Alternatively, when some of metal pads 118 are bonded with metal bumps (such as gold bumps) preformed on an external circuit, the rest of the metal pads 118 are bonded with an external circuit via an ACP or an ACF.

For example, when some of metal pads 118 are bonded with tin-containing metal layers or bumps preformed on an external circuit or tin-containing metal balls, the rest of the metal pads 118 are bonded with metal bumps (such as gold bumps) preformed on an external circuit. Alternatively, when some of metal pads 118 are bonded with tin-containing metal layers or bumps preformed on an external circuit or tin-containing metal balls, the rest of the metal pads 118 are bonded with a tape via a TAB technology. Alternatively, when some of metal pads 118 are bonded with tin-containing metal layers or bumps preformed on an external circuit or tin-containing metal balls, the rest of the metal pads 118 are bonded with bonding wires (such as gold wires or copper wires) via a wirebonding process. Alternatively, when some of metal pads 118 are bonded with tin-containing metal layers or bumps preformed on an external circuit or tin-containing metal balls, the rest of the metal pads 118 are bonded with an external circuit via an ACP or an ACF.

This embodiment is further exemplified with the case that the top layer of the metal layer 116 is a gold layer; for example, the top layers of the above mentioned single gold layer structure and copper/nickel/gold structure are both gold layers. In this embodiment, the metal layers 116 provided by all or some of the metal pads 118 can be bonded with gold bumps preformed on an external circuit. Alternatively, the metal layers 116 provided by all or some of metal pads 118 can be bonded with gold wires via a wirebonding process.

Thus, on the bonding pads exposed by the openings in the passivation layer can be formed multiple metal pads 118 with the same thickness. The metal pads 118 can be bonded with an external circuit via an ACP or an ACF, with bonding wires, with a tape (via a TAB technology), with tin-containing metal balls (via a ball planting process), with tin-containing metal layers preformed on an external circuit, or with metal bumps preformed on an external circuit. The metal pads 118 may have a topmost wettable layer, such as gold, used to be wire-bonded there to.

Referring to FIG. 8C, after completing the above-mentioned process, the semiconductor substrate 2 is diced into multiple semiconductor chips 120. Each of the semiconductor chips 120 comprises a semiconductor substrate 2, a circuit structure 6, multiple dielectric layers 12, a passivation layer 14, and multiple metal pads 118. Multiple semiconductor devices 4, such as transistors or MOS devices, are in or over the semiconductor substrate 2. Some of the semiconductor devices 4 may be under the metal pad 118. The semiconductor devices 4 are electrically connected to the metal pads 118, respectively. The passivation layer 14 may include a topmost silicon-nitride layer of the individual semiconductor chip 120. Besides, the passivation layer 14 may include a topmost silicon-oxide layer of the individual semiconductor chip 120.

Each semiconductor chip 120 can be connected to an external circuit via the metal pads 118. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a glass substrate, a ceramic substrate comprising a ceramic material as insulating layers between circuit layers, or a discrete passive device, such as inductor, capacitor, resistor or filter.

The ways to connect the metal pads 118 include:

1. A metal pad 118 of a semiconductor chip 120 is bonded with a bonding wire (such as a gold wire or a copper wire) via a wirebonding process to be connected with an external circuit.

2. A metal pad 118 of a semiconductor chip 120 is bonded with a tape via a TAB technology to be connected with an external circuit, wherein the tape comprises at least one polymer layer, at least one metal trace made of copper on the polymer layer, and a tin layer or tin-silver-alloy layer on the metal trace. When the tape is bonded to the metal pad 118, the tin layer or tin-silver-alloy layer preformed on the metal trace of the tape can be joined with the metal pad 118.

3. A metal pad 118 of a semiconductor chip 120 is bonded with a metal bump, such as a gold bump, to be connected with an external circuit.

4. A metal pad 118 of a semiconductor chip 120 is pressed into ACP or ACF via a thermal-press process; thereby, the metallic particles in the ACP or ACF are clustered between the metal pad 118 and an ITO-containing pad of an external circuit (such as a glass substrate). By the way, the metal pad 118 is electrically connected to the ITO-containing pad of the external circuit.

5. A metal pad 118 of a semiconductor chip 120 is bonded with a tin-containing metal bump preformed on an external circuit or a tin-containing metal ball to be connected with an external circuit.

Alternatively, in this embodiment, all or some of the metal pads 118 can be connected to an external circuit via all or some of tin-containing metal layers, all or some of tin-containing metal balls, or all or some of metal bumps (such as gold bumps) before the semiconductor substrate 2 is diced. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter.

Next, the semiconductor substrate 2 is diced into multiple semiconductor chips. Then, the metal pads 118 of each semiconductor chip are bonded with bonding wires (such as gold wires or copper wires) by a wireboning process, with a tape (via a TAB technology), with metal bumps (such as gold bumps) preformed on an external circuit, with tin-containing metal layers or bumps preformed on an external circuit, or with an external circuit via an ACP or an ACF.

Referring to FIG. 8D, in this embodiment, a polymer layer 39 may be beforehand formed on the passivation layer 14;

multiple openings 39a expose multiple the bonding pads 16. Next, according to the steps shown in from FIG. 8A to FIG. 8B, multiple the metal pads 118 are formed on the bonding pads 16 exposed by the openings 39a in polymer layer 39. The process for forming the metal pads 118 on the bonding pads 16 can be referred to the above-mentioned process corresponding to FIGS. 8A-8B. During forming the metal pads 118, the above-mentioned adhesion/barrier layer 18 is sputtered on the polymer layer 39, on the bonding pads 16 exposed by the openings 39a in the polymer layer 39.

The material of the polymer layer 39 may include PI, BCB, polyurethane, epoxy, a parylene-based polymer, a solder-mask material, an elastomer, or a porous dielectric material. The polymer layer 39 can be fabricated by spin-coating, heat-pressing a dry film, or screen-printing. In a case, the polymer layer 39 can be formed by spin-on coating a photosensitive polyimide layer on the passivation layer 14 and on the bonding pads 16, followed by exposing the polyimide layer using 1X stepper and scanner, followed by developing the polyimide layer, followed by curing the polyimide layer at the temperature of between 250 and 350 degrees C. in an nitrogen ambient. The polymer layer 39 has a thickness of between 1 and 30 μm. In a preferred case, the polymer layer 39 has a thickness of between 5 and 20 μm. Besides, those described above may be referred to for the applications of the semiconductor chip 120a shown in FIG. 8D, which will not repeat herein.

Figure 8E:
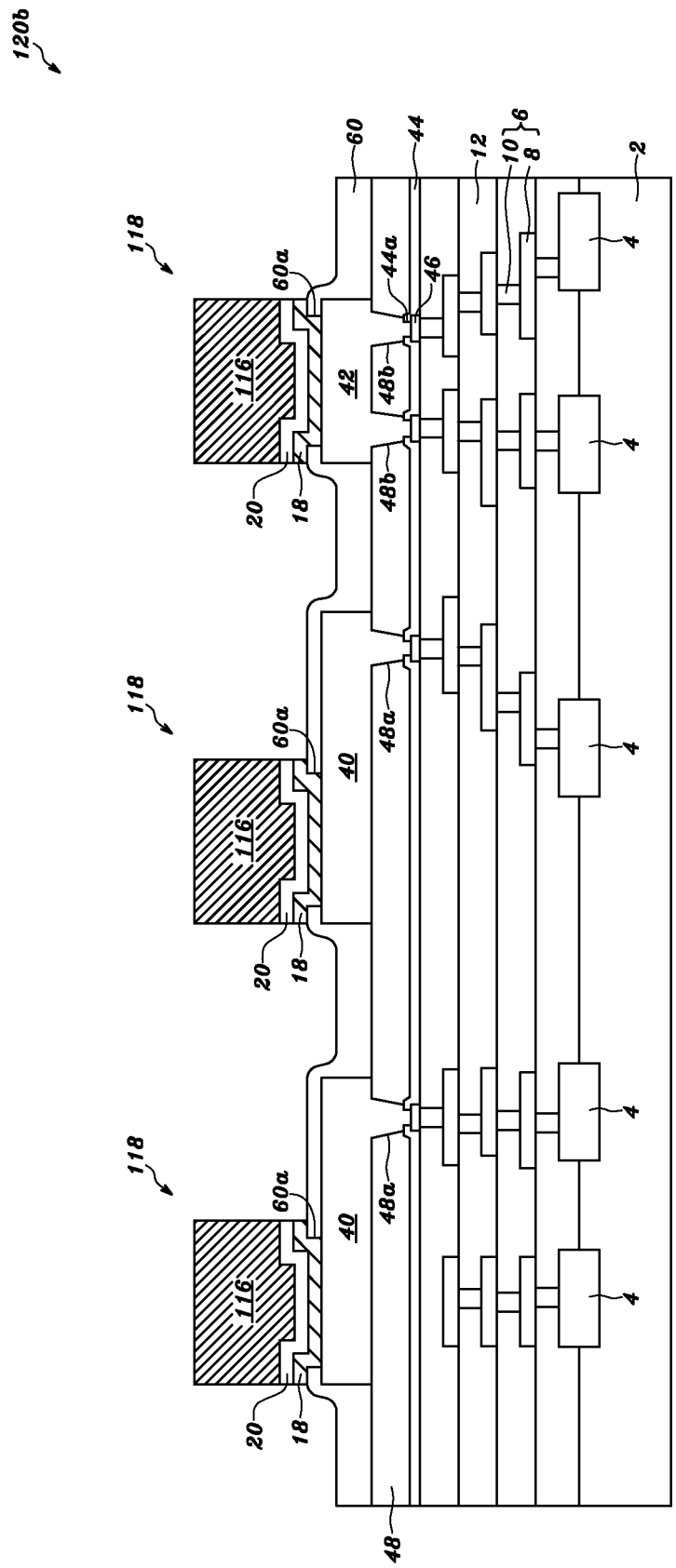
Figure 8F:
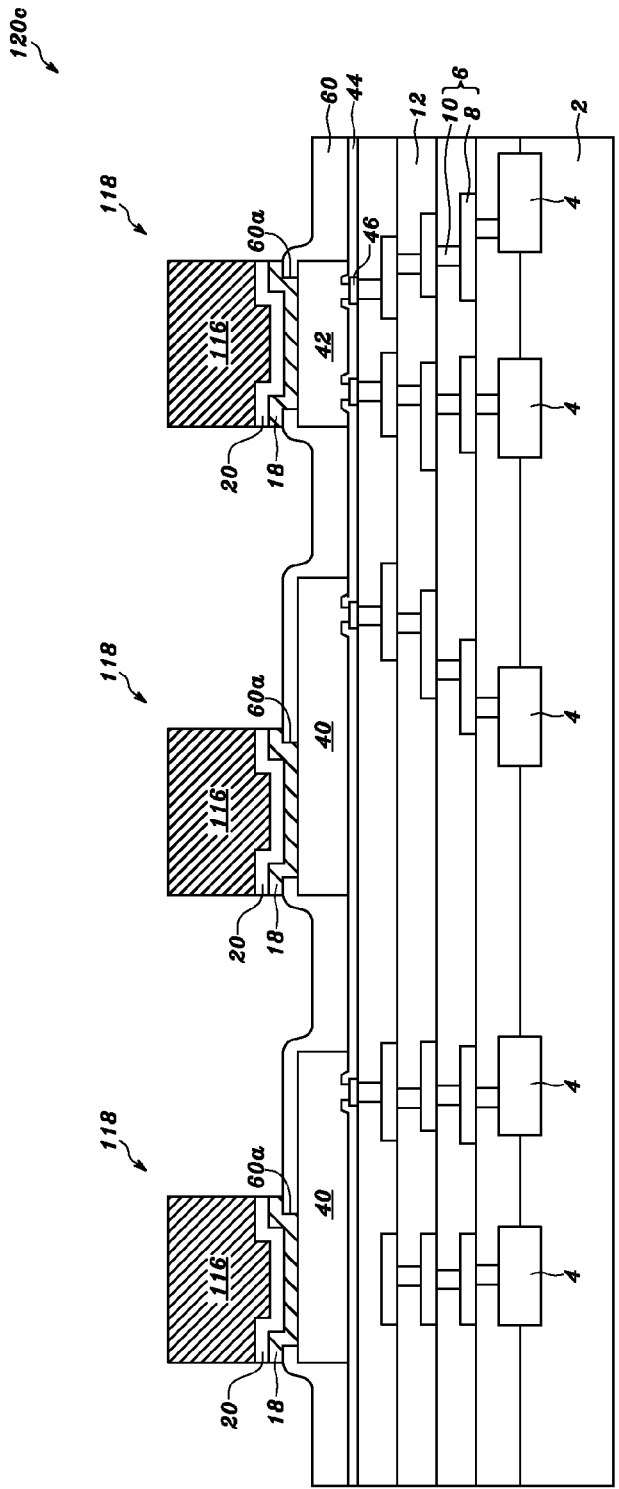

Similar to Embodiment 2, this embodiment can apply to a RDL or an interconnecting trace. Referring to FIG. 8E and FIG. 8F, in this embodiment, a metal trace 40 functioning as a RDL and a meal trace 42 functioning as an interconnecting trace are simultaneously formed over the semiconductor substrate 2; refer to the related description in Embodiment 2 for the method thereof. Next, the metal pads 118 are formed on the metal traces 40 and 42 exposed by the openings 60a according to the steps shown in from FIG. 8A to FIG. 8B. Refer to the foregoing description for the applications of the semiconductor chip 120b shown in FIG. 8E and the semiconductor chip 120c shown in FIG. 8F, which will not repeat herein. According to the method described above, over the semiconductor chip 2 may be formed only a RDL or interconnecting trace, and the metal pads 118 are then formed on the RDL or interconnecting trace.

Figure 9:
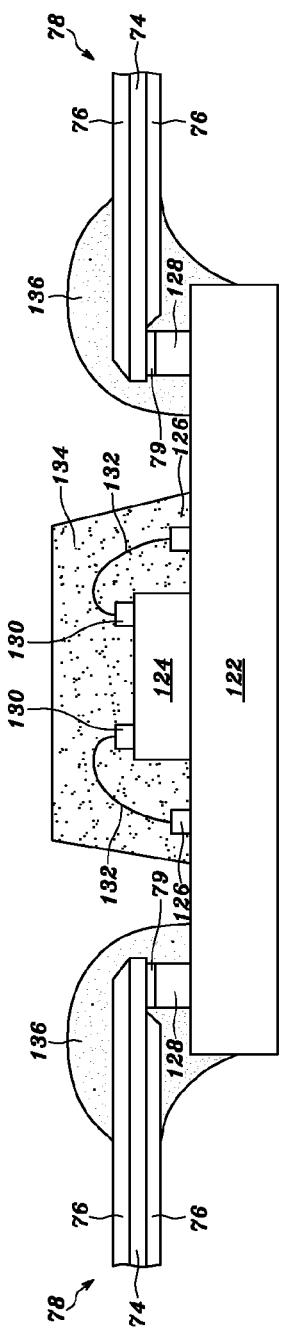
FIG. 9 is a sectional view schematically showing a multichip package according to one embodiment of the present invention.

FIG. 9 is a schematic cross-sectional view showing the structure of a multi-chip package. As shown in FIG. 9, the semiconductor chip 122 may be the semiconductor chip 112, 112a, 112b, or 112c formed according to Embodiment 5. Alternatively, the semiconductor chip 122 may be the semiconductor chip 120, 120a, 120b, or 120c formed according to Embodiment 6. Thus, the semiconductor chip 122 has the metal pads or bumps 126 for a bonding wire and the metal pads or bumps 128 for a tape. The semiconductor chip 124 has metal pads 130 for bonding wires, and the material and structure of the metal pad 130 may be the same as that of the metal pad 118 described in Embodiment 6. Besides, a bonding wire 132 is used to connect the metal pad 126 and the metal pad 130 via a wirebonding process.

A polymer 134 is formed to cover the metal pads 126 of the semiconductor chip 122, the semiconductor chip 124 and the bonding wires 132. The material of the polymer 134 may include PI, BCB, polyurethane, epoxy, a parylene-based polymer, a solder-mask material, an elastomer, or a porous dielectric material.

After the semiconductor chips 122 and 124 are bonded with each other, via a thermal-press process, at least one metal trace 74 of a flexible tape 78 is bonded on the metal pad or bump 128 having a gold layer with a thickness of between 8 and 35 μm, for example, via a metal layer 79 made of tin metal, a tin-silver alloy, or the like preformed on the metal trace 74. The tape 78 further comprises a polymer layer 76 having the metal trace 74 formed thereon. The material of the polymer layer 76 may include PI, BCB, polyurethane, epoxy, a parylene-based polymer, a solder-mask material, an elastomer, or a porous dielectric material. Next, a polymer 136 is formed to covers the metal pads 128 and a portion of flexible tape 78. The material of the polymer 136 may include PI, BCB, polyurethane, epoxy, a parylene-based polymer, a solder-mask material, an elastomer, or a porous dielectric material.

Thus, as described above, the metal pad 128 can be connected with an external circuit via a tape. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter.

Embodiment 7

Figure 10A:
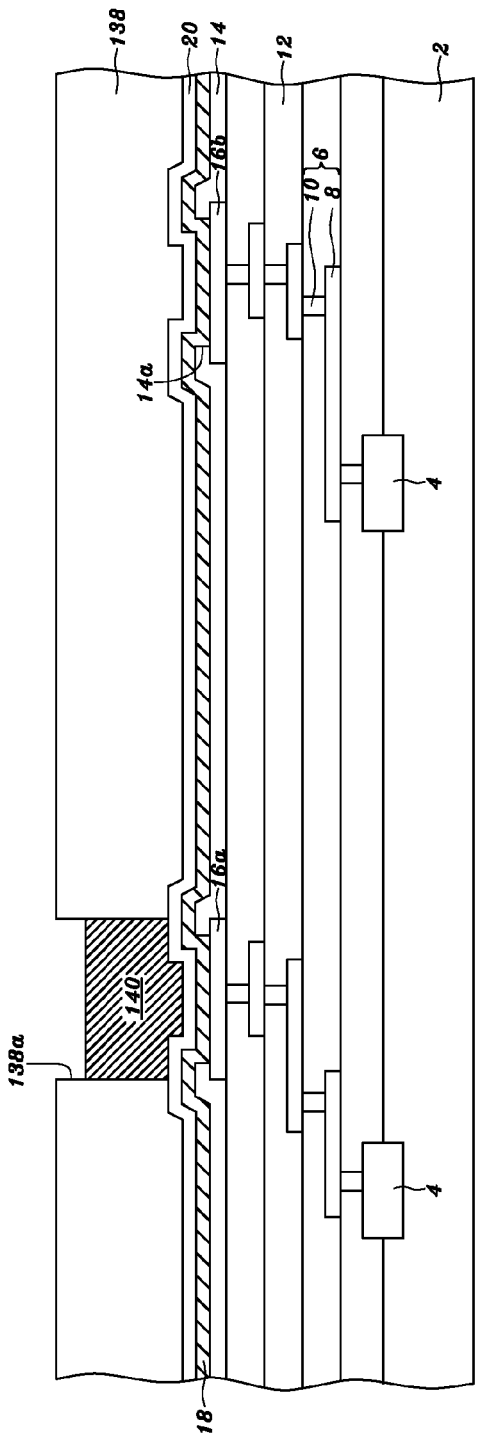
FIG. 10A to FIG. 10F are sectional views schematically showing the fabrication process according to one embodiment of the present invention.

Referring to FIG. 10A, after the step shown in FIG. 2A is completed, a photoresist layer 138 is formed on the seed layer 20, and the photoresist layer 138 is patterned with exposing and developing processes to form an opening 138a in the photoresist layer 138, exposing the seed layer 20 over the first bonding pad 16a. A 1X stepper or a 1X scanner is used to expose the photoresist layer 138.

Next, a metal layer 140 is formed on the seed layer 20 exposed by the opening 138a. The metal layer 140 has a thickness of between 1 and 500 μm, for example, a thickness of between 1 and 200 μm. The thickness of the metal layer 140 is preferred to be between 2 and 30 μm. The metal layer 140 may be deposited by an electroplating method or an electroless plating method. The metal layer 140 may be a single layer made of gold, copper, silver, palladium, platinum, rhodium, ruthenium, rhenium, or nickel. The metal layer 140 may also be a composite layer made of the above mentioned metals.

For example, the metal layer 140 may be deposited by electroplating a gold layer with a thickness of between 8 and 35 μm on the seed layer 20 made of gold exposed by the opening 138a. Alternatively, the metal layer 140 may be deposited by electroplating a copper layer with a thickness of between 8 and 35 μm on the seed layer 20 made of copper exposed by the opening 138a. Alternatively, the metal layer 140 is formed by electroplating a copper layer with a thickness of between 8 and 35 μm on the seed layer 20 made of copper exposed by the opening 138a in the photoresist layer 138, next electroplating a nickel layer with a thickness of between 0.1 and 10 μm, and preferably with a thickness of between 0.1 and 5 μm, on the copper layer in the opening 138a, next electroplating a gold layer with a thickness of between 0.01 and 10 μm, and preferably with a thickness of between 0.1 and 2 μm, on the nickel layer in the opening 138a.

The metal layer 140 may also be made of a tin-containing material. The tin-containing material may include a tin-lead alloy, a tin-silver alloy, a tin-silver-copper alloy or a lead-free alloy. The metal layer 140 mad of tin-containing metal has a thickness of between 3 and 250 μm. Before the metal layer 140 mad of tin-containing metal is to be formed, a diffusion barrier layer may be formed on the seed layer 20 exposed by the opening 138a. The diffusion barrier layer is formed by, for example, first electroplating a copper layer with a thickness of between 0.5 and 10 μm on the seed layer 20 made of copper exposed by the opening 138a in the photoresist layer 138, next electroplating a nickel layer with a thickness of between 0.1 and 5 μm on the copper layer in the opening 138a. The diffusion barrier layer is a copper-nickel composite layer. Next, the metal layer 140 mad of tin-containing metal is formed on the diffusion barrier layer in the opening 138a.

Figure 10B:
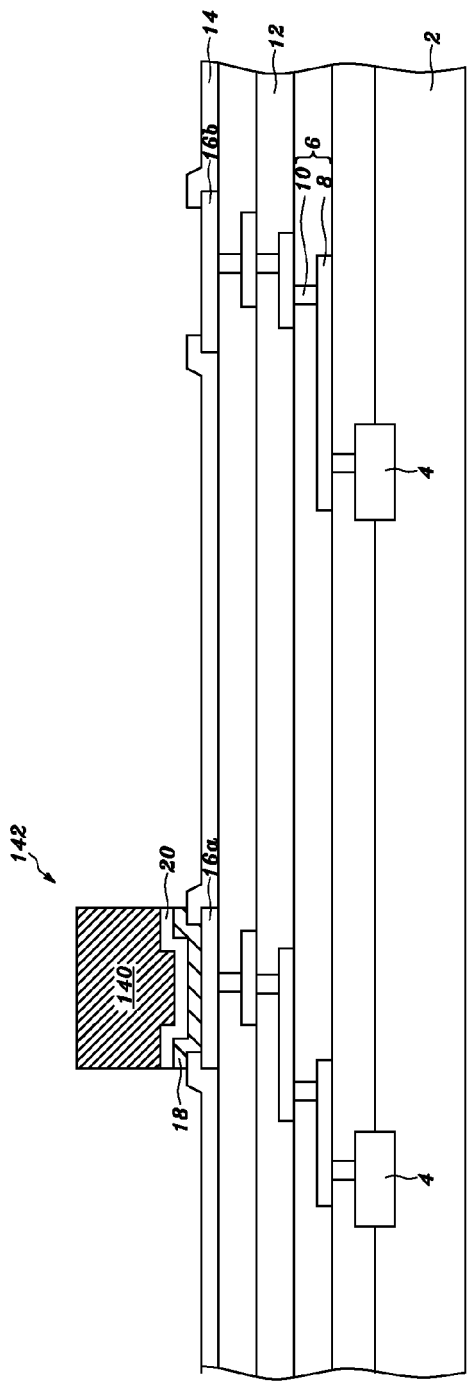

Referring to FIG. 10B, after the metal layer 140 is formed, the photoresist layer 138 is removed. Next, the seed layer 20 and the adhesion/barrier layer 18 not under the metal layer 140 are removed. The adhesion/barrier layer 18 can be removed with a dry-etching method or a wet-etching method. The dry-etching method may be implemented with an argon sputter process. Alternatively, the adhesion/barrier layer 18 not under the metal layer 140 is wet etched using an etchant containing an H2O2 liquid in case that the adhesion/barrier layer 18 is a titanium-tungsten alloy or titanium. If the seed layer 20 is made of gold, it can be removed with an iodine-containing etchant, such as a potassium iodine solution.

A metal pad 142 is formed on the first bonding pad 16a exposed by the opening 14a in the passivation layer 14. The metal pad 142 comprises an adhesion/barrier layer 18, a seed layer 20 on the adhesion/barrier layer 18 and a metal layer 140 on the seed layer 20. The metal pad 142 may have a wire (such as a gold wire or a copper wire) bonded thereon by a wire-bonding process, may have a tape bonded thereon using a TAB process, may be bonded with a metal bump (such as a gold bump) preformed on an external circuit, may be bonded with a tin-containing bump preformed on an external circuit, may be bonded with a tin-containing metal ball by a ball planting process, or may be bonded with an external circuit using an ACF or an ACP.

Figure 10C:
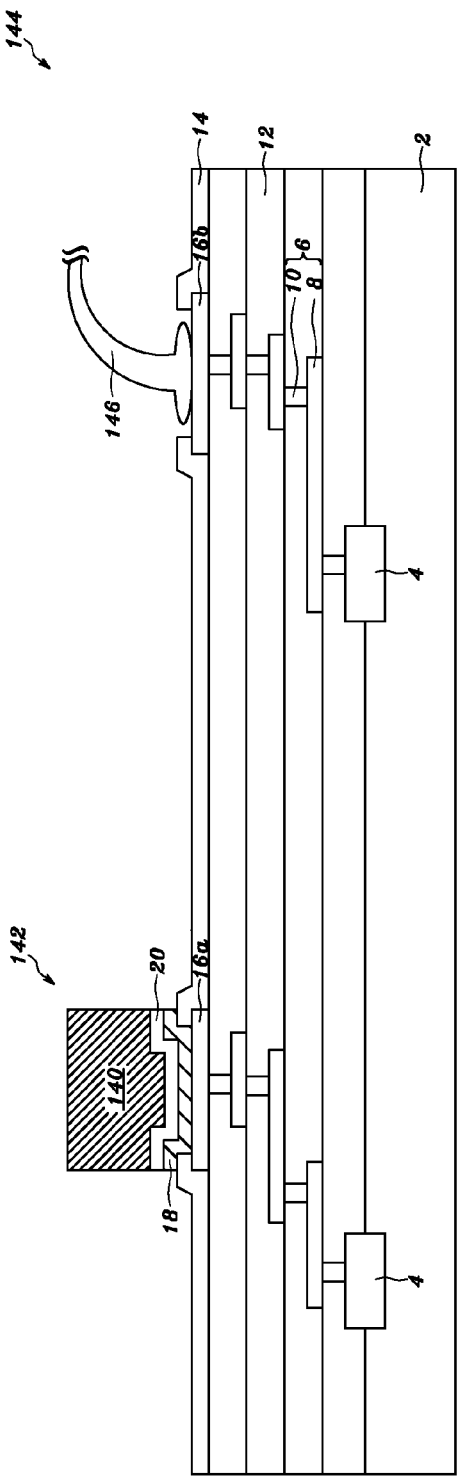

Referring to FIG. 10C, after completing the above-mentioned process, the semiconductor substrate 2 is diced into multiple semiconductor chips 144. Each of the semiconductor chips 144 comprises a semiconductor substrate 2, a circuit structure 6, multiple dielectric layers 12, a passivation layer 14, and at least one metal pad 142. Multiple semiconductor devices 4, such as transistors or MOS devices, are in or over the semiconductor substrate 2. Some of the semiconductor devices 4 may be under the metal pad 142. One of the semiconductor devices 4 is electrically connected to the metal pad 142. The passivation layer 14 may include a topmost silicon-nitride layer of the individual semiconductor chip 144. Besides, the passivation layer 14 may include a topmost silicon-oxide layer of the individual semiconductor chip 144. Next, after dicing the semiconductor substrate 2 into the semiconductor chips 144, a second bonding pad 16b of one semiconductor chip 144 not having the metal pad 142 formed thereon can be bonded with a bonding wire 146 (such as a gold wire or a copper wire) via a wirebonding process.

Each semiconductor chip 144 can be connected to an external circuit via the metal pad 142, and the second bonding pad 16b not having the metal pad 142 formed thereon can be bonded with a bonding wire (such as a gold wire or a copper wire) via a wirebonding process. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter.

The ways to connect the metal pad 142 to an external circuit include:

1 The metal pad 142 is bonded with a bonding wire (such as a gold wire or a copper wire) via a wirebonding process to be connected with an external circuit.

2. The metal pad 142 is bonded with a tape via a TAB technology to be connected with an external circuit, wherein the tape comprises at least one polymer layer, at least one metal trace made of copper on the polymer layer, and a tin layer or tin-silver-alloy layer on the metal trace. When the tape is bonded to the metal pad 142, the tin layer or tin-silver-alloy layer preformed on the metal trace of the tape can be joined with the metal pad 142.

3. The metal pad 142 is bonded with a metal bump, such as a gold bump, to be connected with an external circuit.

4. The metal pad 142 is pressed into ACP or ACF via a thermal-press process; thereby, the metallic particles in the ACP or ACF are clustered between the metal pad 142 and an ITO-containing pad of an external circuit (such as a glass substrate). By the way, the metal pad 142 is electrically connected to the ITO-containing pad of the external circuit.

5. The metal pad 142 is bonded with a tin-containing metal layer or a tin-containing metal ball to be connected with an external circuit.

Alternatively, in this embodiment, the metal pad 142 can be connected to an external circuit via a tin-containing metal layer, a tin-containing metal ball, or a metal bump (such as a gold bump) before the semiconductor substrate 2 is diced. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter.

Next, the semiconductor substrate 2 is diced into multiple semiconductor chips. Then, the second bonding pad 16b not having the metal pad 142 formed thereon of each semiconductor chip 144 is bonded with a bonding wire 146 via a wireboning process.

Figure 10D:
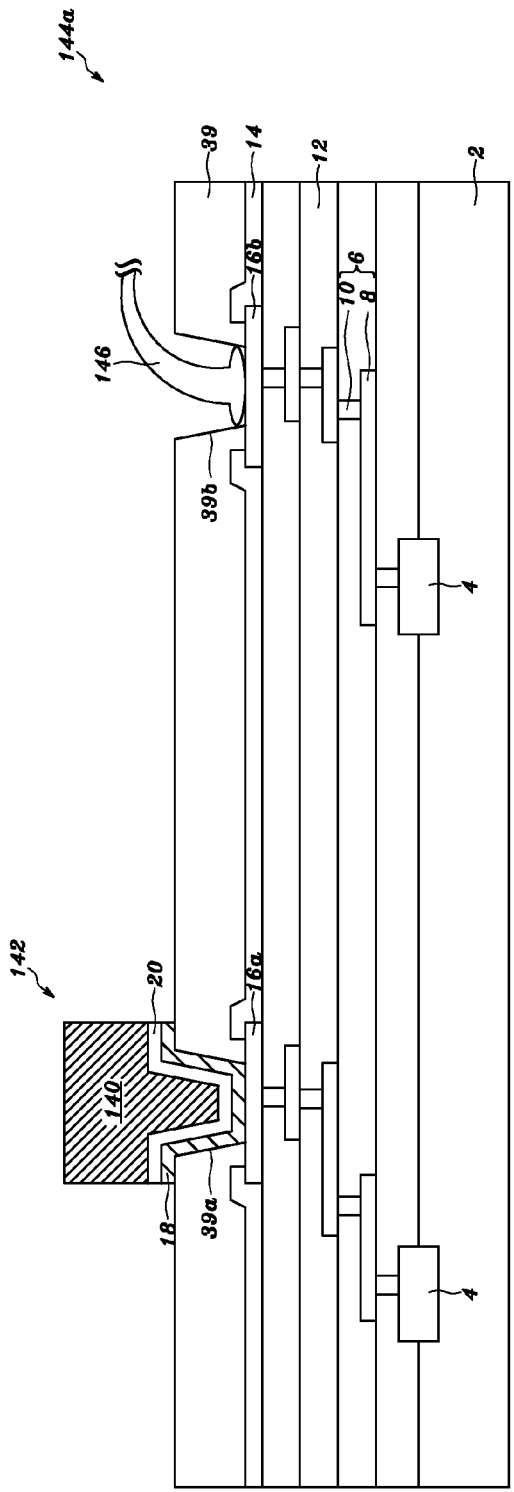

Referring to FIG. 10D, in this embodiment, a polymer layer 39 may be beforehand formed on the passivation layer 14; multiple openings 39a and multiple openings 39b expose the first bonding pads 16a and the second bonding pads 16b. Next, the semiconductor chips 144 can be formed according to the steps shown in FIGS. 10A-10C.

The material of the polymer layer 39 may include PI, BCB, polyurethane, epoxy, a parylene-based polymer, a solder-mask material, an elastomer, or a porous dielectric material. The polymer layer 39 can be fabricated by spin-coating, heat-pressing a dry film, or screen-printing. In a case, the polymer layer 39 can be formed by spin-on coating a photosensitive polyimide layer on the passivation layer 14 and on the bonding pads 16a and 16b, followed by exposing the polyimide layer using 1X stepper and scanner, followed by developing the polyimide layer, followed by curing the polyimide layer at the temperature of between 250 and 350 degrees C. in an nitrogen ambient. The polymer layer 39 has a thickness of between 1 and 30 μm. In a preferred case, the polymer layer 39 has a thickness of between 5 and 20 μm. Each semiconductor chip 144 can be connected to an external circuit via the metal pads 142, and the second bonding pads 16b not having the metal pad 142 formed thereon can be bonded with a bonding wire (such as a gold wire or a copper wire) via a wirebonding process. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter.

Figure 10E:
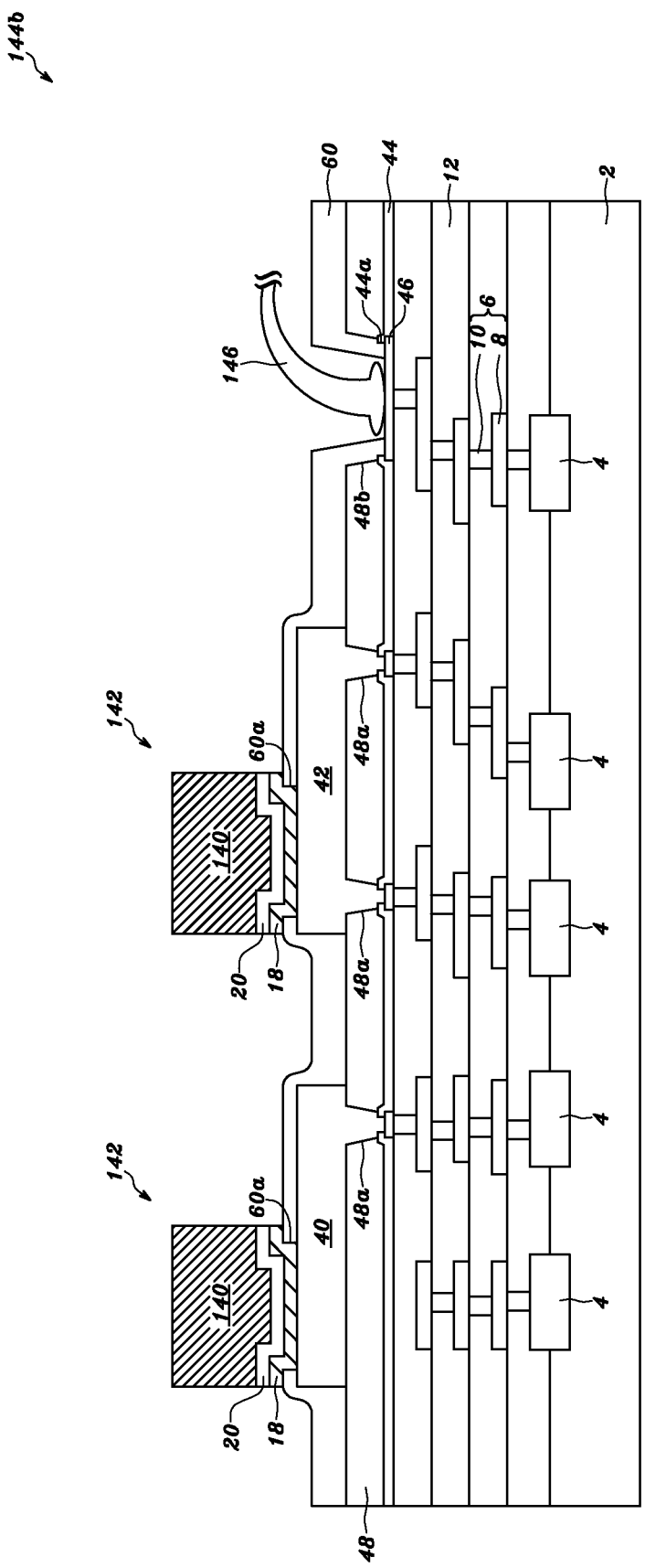
Figure 10F:
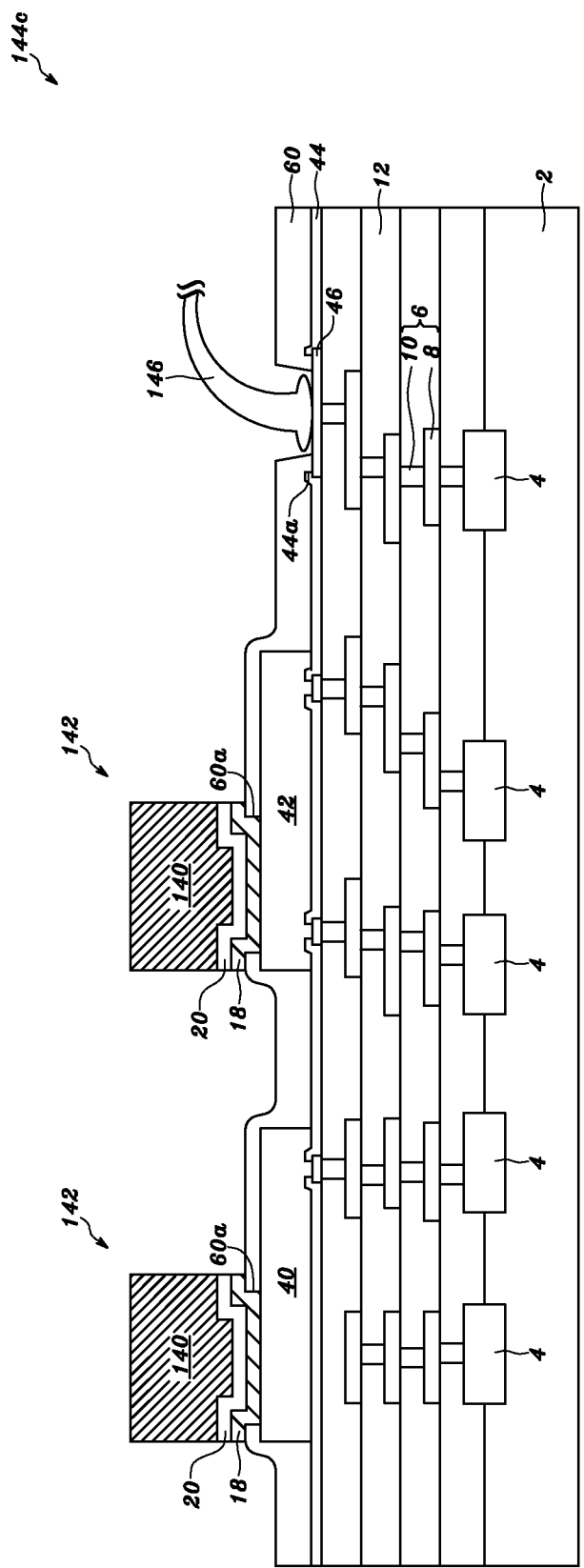

Similar to Embodiment 2, this embodiment can apply to a RDL or an interconnecting trace. Referring to FIG. 10E and FIG. 10F, in this embodiment, a metal trace 40 functioning as a RDL and a meal trace 42 functioning as an interconnecting trace are simultaneously formed over the semiconductor substrate 2; refer to the related description in Embodiment 2 for the method thereof. Next, the metal pads 142 are formed on the metal traces 40 and 42 exposed by the openings 60a according to the steps shown in from FIG. 10A to FIG. 10B. Refer to the foregoing description for the applications of the semiconductor chip 144b shown in FIG. 10E and the semiconductor chip 144c shown in FIG. 10F, which will not repeat herein.

However, via the method described above, over the semiconductor substrate 2 may be formed a RDL or an interconnecting trace only, and a metal pad 142 is formed on the RDL or the interconnecting trace. After the semiconductor substrate 2 is diced into semiconductor chips, the bonding pad 46 not connected to the metal traces 40 or 42 over the passivation layer 44 is bonded with a bonding wire 146 via a wirebonding process and the metal pad 142 can be bonded to an external circuit.

Embodiment 8

Referring to FIG. 1A, after the step shown in FIG. 2A is completed, a photoresist layer 148 is formed on the seed layer 20, and the photoresist layer 148 is patterned with exposing and developing processes to form an opening 148a in the photoresist layer 148, exposing the seed layer 20 over the first bonding pad 16a. A 1X stepper or a 1X scanner is used to expose the photoresist layer 148.

Figure 11A:
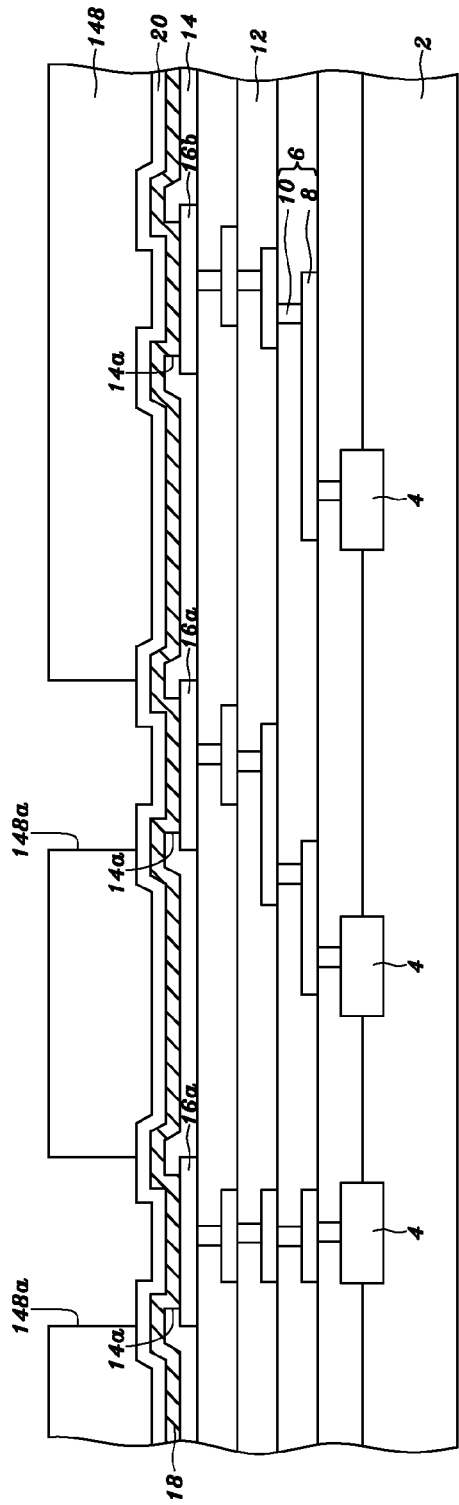
Figure 11B:
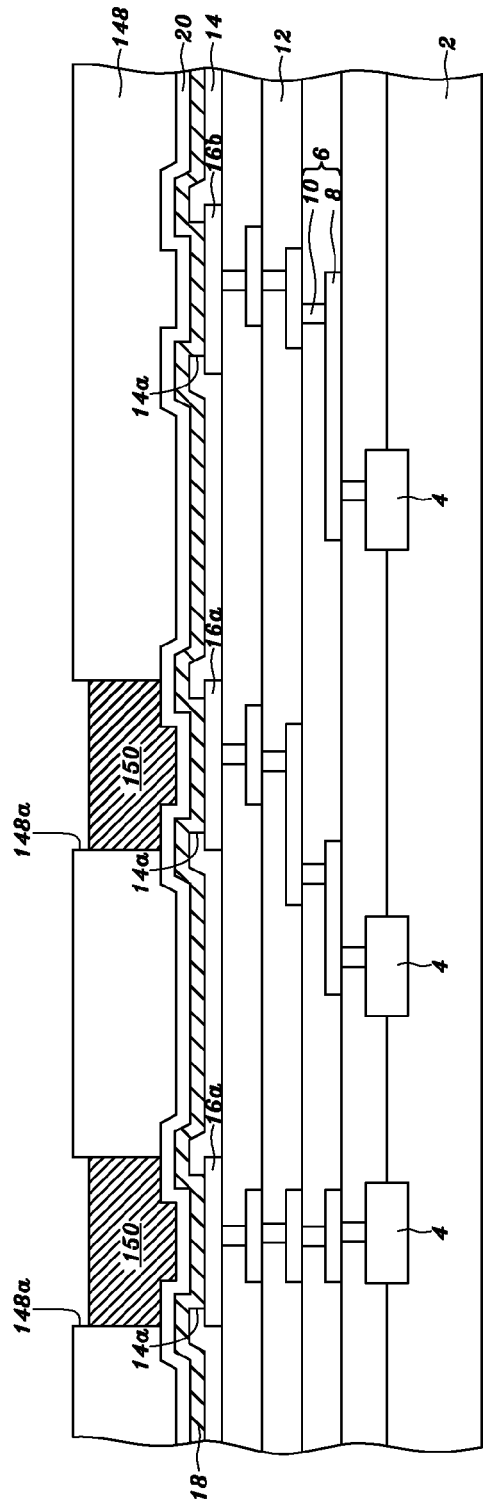

Referring to FIG. 11B, a metal layer 150 is formed on the seed layer 20 exposed by the opening 148a. The metal layer 150 has a thickness of between 1 and 500 μm, for example, a thickness of between 1 and 200 μm. The thickness of the metal layer 150 is preferred to be between 2 and 30 μm. The metal layer 150 may be deposited by an electroplating method or an electroless plating method. The metal layer 150 may be a single layer made of gold, copper, silver, palladium, platinum, rhodium, ruthenium, rhenium, or nickel. The metal layer 150 may also be a composite layer made of the above mentioned metals.

For example, the metal layer 150 may be deposited by electroplating a gold layer with a thickness of between 8 and 35 μm on the seed layer 20 made of gold exposed by the opening 148a. Alternatively, the metal layer 150 may be deposited by electroplating a copper layer with a thickness of between 8 and 35 μm on the seed layer 20 made of copper exposed by the opening 148a. Alternatively, the metal layer 150 is formed by electroplating a copper layer with a thickness of between 8 and 35 μm on the seed layer 20 made of copper exposed by the opening 148a in the photoresist layer 148, next electroplating a nickel layer with a thickness of between 0.1 and 10 μm, and preferably with a thickness of between 0.1 and 5 μm, on the copper layer in the opening 148a, next electroplating a gold layer with a thickness of between 0.01 and 10 μm, and preferably with a thickness of between 0.1 and 2 μm, on the nickel layer in the opening 148a.

The metal layer 150 may also be made of a tin-containing material. The tin-containing material may include a tin-lead alloy, a tin-silver alloy, a tin-silver-copper alloy or a lead-free alloy. The metal layer 150 mad of tin-containing metal has a thickness of between 3 and 250 μm. Before the metal layer 150 mad of tin-containing metal is to be formed, a diffusion barrier layer may be formed on the seed layer 20 exposed by the opening 148a. The diffusion barrier layer is formed by, for example, first electroplating a copper layer with a thickness of between 0.5 and 10 μm on the seed layer 20 made of copper exposed by the opening 148a in the photoresist layer 148, next electroplating a nickel layer with a thickness of between 0.1 and 5 μm on the copper layer in the opening 148a in the photoresist layer 148. The diffusion barrier layer is a copper-nickel composite layer. Next, a metal layer 150 mad of tin-containing metal is formed on the diffusion barrier layer in the opening 148a.

Referring to FIG. 11C, after the metal layer 150 is formed, the photoresist layer 148 is removed. Referring to FIG. 11D, a photoresist layer 152 is formed on the seed layer 20, and the photoresist layer 152 is patterned with exposing and developing processes to form a photoresist layer 152a on the seed layer 20 over the second bonding pad 16b. A 1X stepper or a 1X scanner is used to expose the photoresist layer 152.

Referring to FIG. 11E, the seed layer 20 and the adhesion/barrier layer 18 not under the metal layer 150 and photoresist layer 152a are removed. The adhesion/barrier layer 18 can be removed with a dry-etching method or a wet-etching method. The dry-etching method may be implemented with an argon sputter process. Alternatively, the adhesion/barrier layer 18 not under the metal layer 150 and photoresist layer 152a is wet etched using an etchant containing an H2O2 liquid in case that the adhesion/barrier layer 18 is a titanium-tungsten alloy or titanium. If the seed layer 20 is made of gold, it can be removed with an iodine-containing etchant, such as a potassium iodine solution. Referring to FIG. 11F, after the seed layer 20 and the adhesion/barrier layer 18 not under the metal layer 150 and photoresist layer 152a are removed, the photoresist layer 152a is removed.

A metal pad 154 is formed on the first bonding pad 16a exposed by the opening 14a in the passivation layer 14. The metal pad 154 comprises an adhesion/barrier layer 18, a seed layer 20 on the adhesion/barrier layer 18, and a metal layer 150 on the seed layer 20. The metal pad 154 may have a bonding wire (such as a gold wire or a copper wire) bonded thereon by a wire-bonding process, may be bonded with a metal bump (such as a gold bump) preformed on an external circuit, may be bonded with a tin-containing metal bump preformed on an external circuit, may be bonded with a tin-containing metal ball (via a ball planting technology), may have a tape bonded thereon using a TAB process, or may be bonded with an external circuit via an ACP or an ACF.

A metal pad 156 is formed on the second bonding pad 16b exposed by the opening 14a in the passivation layer 14. The metal pad 156 comprises an adhesion/barrier layer 18 and a seed layer 20 on the adhesion/barrier layer 18. The metal pad 156 may have a bonding wire (such as a gold wire or a copper wire) bonded thereon by a wire-bonding process, may be bonded with a metal bump (such as a gold bump) preformed on an external circuit, may be bonded with a tin-containing metal layer bump preformed on an external circuit, may be bonded with a tin-containing metal ball (via a ball planting technology), may have a tape bonded thereon using a TAB process, or may be bonded with an external circuit via an ACP or an ACF.

Figure 11G:
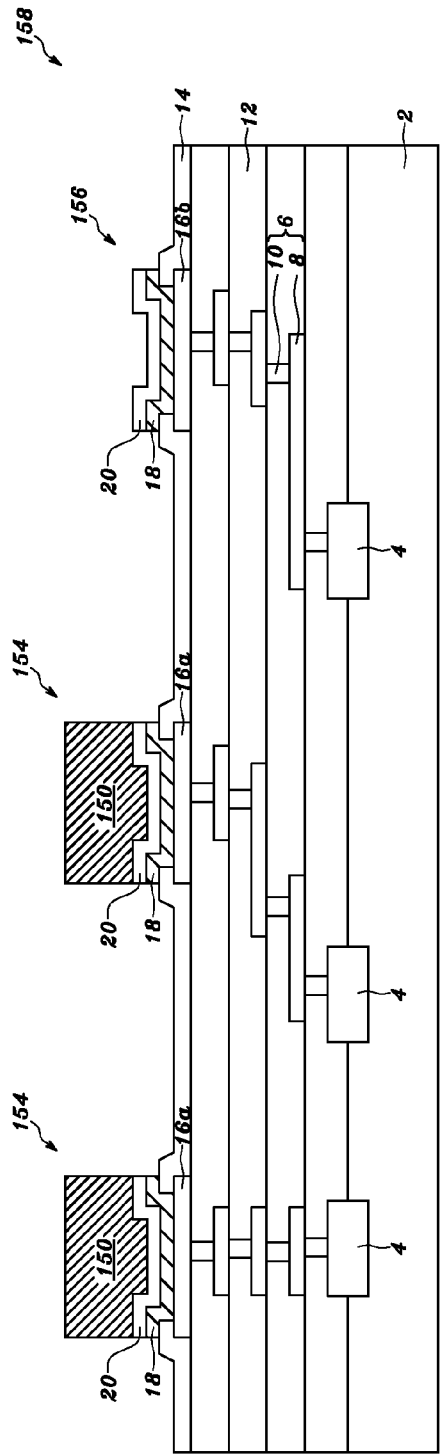

Referring to FIG. 11G, after completing the above-mentioned process, the semiconductor substrate 2 is diced into multiple semiconductor chips 158. Each of the semiconductor chips 158 comprises a semiconductor substrate 2, a circuit structure 6, multiple dielectric layers 12, a passivation layer 14, at least one metal pad 154, and at least one metal pad 156. Multiple semiconductor devices 4, such as transistors or MOS devices, are in or over the semiconductor substrate 2. Some of the semiconductor devices 4 may be under the metal pad 154 or the metal pad 156. Two of the semiconductor devices 4 are electrically connected to the metal pad 154 or the metal pad 156, respectively. The passivation layer 14 may include a topmost silicon-nitride layer of the individual semiconductor chip 158. Besides, the passivation layer 14 may include a topmost silicon-oxide layer of the individual semiconductor chip 158.

After the semiconductor substrate 2 is diced into semiconductor chips 158, a bonding wire (such as a gold wire or a copper wire) can be bonded with the metal pad 156 of the semiconductor chip 158 via a wirebonding process. Thus, the metal pad 156 of each semiconductor chip 158 can be bonded with a bonding wire via a wirebonding process, and the semiconductor chip 158 can be connected to an external circuit via the metal pad 154. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a glass substrate, a ceramic substrate comprising a ceramic material as insulating layers between circuit layers, or a discrete passive device, such as inductor, capacitor, resistor or filter.

The ways to connect the metal pad 154 include:

1. The metal pad 154 is bonded with a bonding wire (such as a gold wire or a copper wire) via a wirebonding process to be connected with an external circuit.

2. The metal pad 154 is bonded with a tape via a TAB process to be connected with an external circuit, wherein the tape comprises at least one polymer layer, at least one metal trace made of copper on the polymer layer, and a tin layer or tin-silver-alloy layer on the metal trace. When the tape is bonded to the metal pad 154, the tin layer or tin-silver-alloy layer preformed on the metal trace of the tape can be joined with the metal pad 154.

3. The metal pad 154 is bonded with a metal bump, such as a gold bump, to be connected with an external circuit.

4. The metal pad 154 is pressed into ACP or ACF via a thermal-press process; thereby, the metallic particles in the ACP or ACF are clustered between the metal pad 154 and an ITO-containing pad of an external circuit (such as a glass substrate). By the way, the metal pad 154 is electrically connected to the ITO-containing pad of the external circuit.

5. The metal pad 154 is bonded with a tin-containing metal bump preformed on an external circuit or a tin-containing metal ball to be connected with an external circuit.

Besides, before the semiconductor substrate 2 is diced, the metal pad 154 may be bonded with a tin-containing metal layer, a tin-containing metal ball or a metal bump (such as a gold bump) to be connected with an external circuit. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, or a discrete passive device, such as inductor, capacitor, resistor or filter. Next, the semiconductor substrate 2 is diced into multiple semiconductor chips 158. Then, the metal pad 156 of each semiconductor chips 158 is bonded with a bonding wire (such as a gold wire or a copper wire) via a wirebonding process.

Figure 11H:
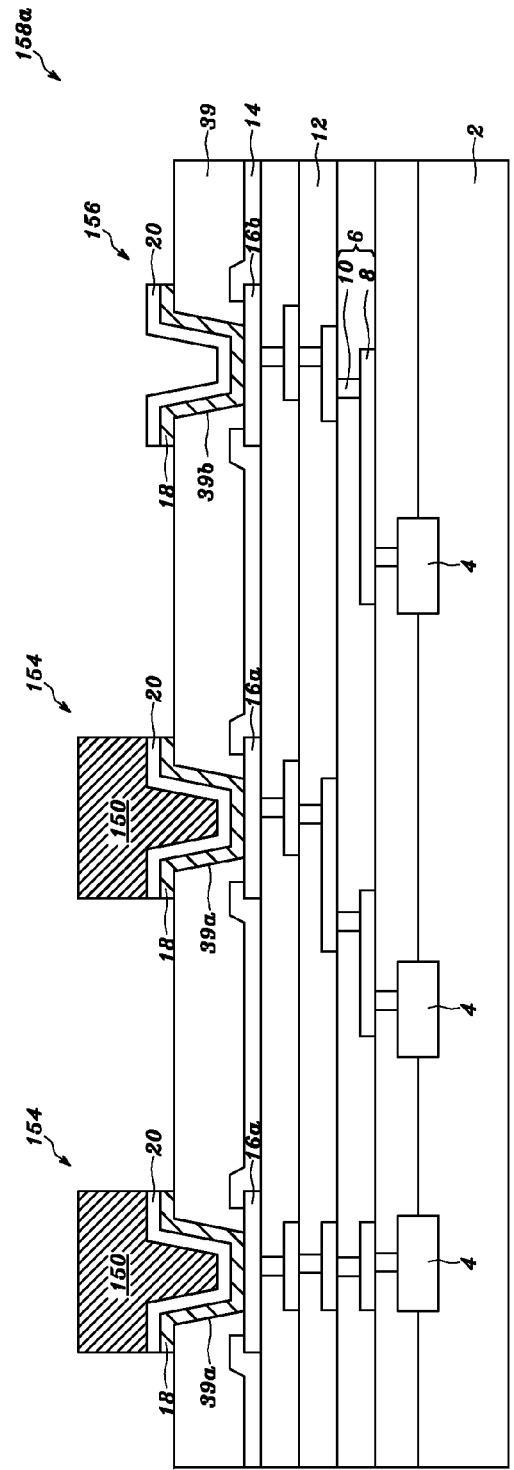

Referring to FIG. 11H, alternatively, in this embodiment, a polymer layer 39 may be beforehand formed on the passivation layer 14. In the polymer layer 39, multiple openings 39a and multiple openings 39b expose the first bonding pads 16a and the second bonding pads 16b. Next, according to the steps shown in from FIG. 11A to FIG. 11F, the metal pad 154 is formed on the first bonding pad 16a exposed by the opening 39a in the polymer layer 39, and the metal pad 156 is formed on the second bonding pad 16b exposed by the opening 39b in the polymer layer 39. The process for forming the metal pads 154 and 156 on the bonding pads 16a and 16b can be referred to the above-mentioned process corresponding to FIGS. 11A-11F. During forming the metal pads 154 and 156, the above-mentioned adhesion/barrier layer 18 is sputtered on the polymer layer 39, on the bonding pads 16a exposed by the openings 39a in the polymer layer 39, and on the bonding pads 16b exposed by the openings 39b in the polymer layer 39.

The material of the polymer layer 39 may include PI, BCB, polyurethane, epoxy, a parylene-based polymer, a solder-mask material, an elastomer, or a porous dielectric material. The polymer layer 39 can be fabricated by spin-coating, heat-pressing a dry film, or screen-printing. In a case, the polymer layer 39 can be formed by spin-on coating a photosensitive polyimide layer on the passivation layer 14 and on the bonding pads 16a and 16b, followed by exposing the polyimide layer using 1X stepper and scanner, followed by developing the polyimide layer, followed by curing the polyimide layer at the temperature of between 250 and 350 degrees C. in an nitrogen ambient. The polymer layer 39 has a thickness of between 1 and 30 μm. In a preferred case, the polymer layer 39 has a thickness of between 5 and 20 μm. Refer to the foregoing description for the applications of the semiconductor chip 158a shown in FIG. 11H, which will not repeat herein.

Figure 11I:
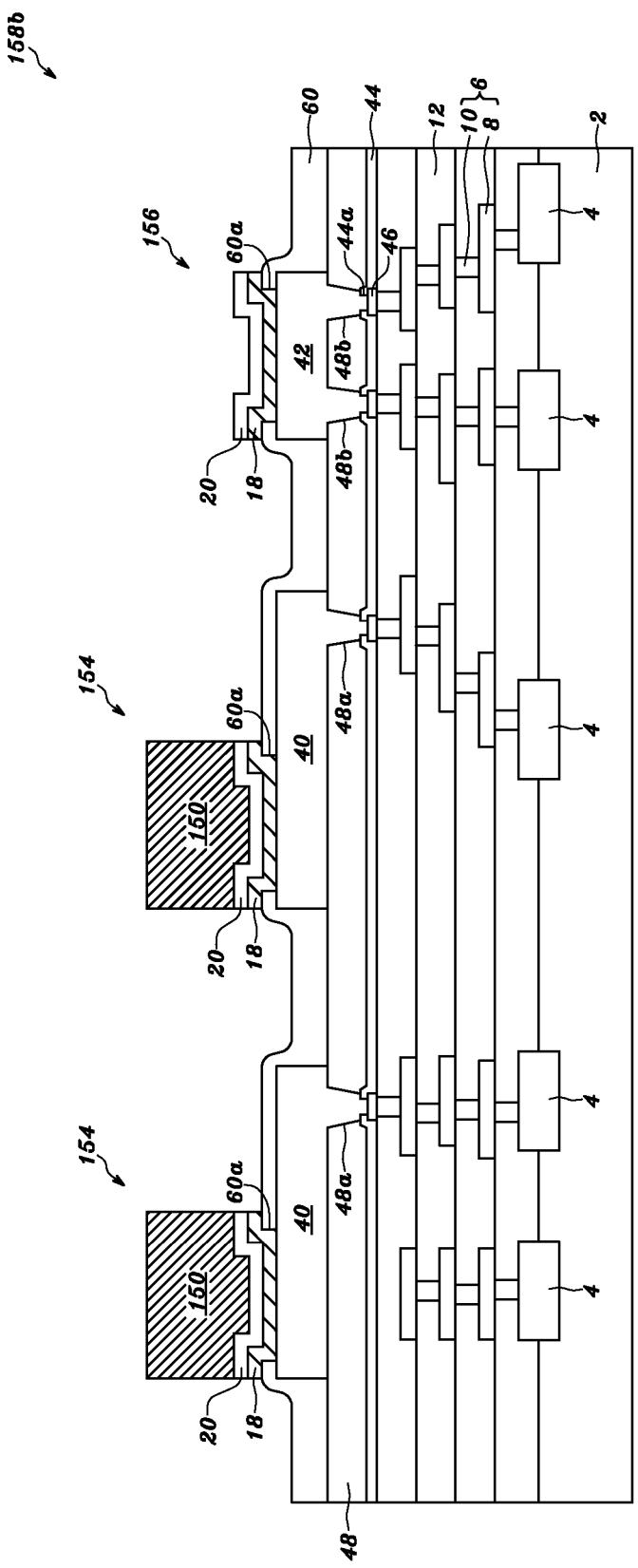
Figure 11J:
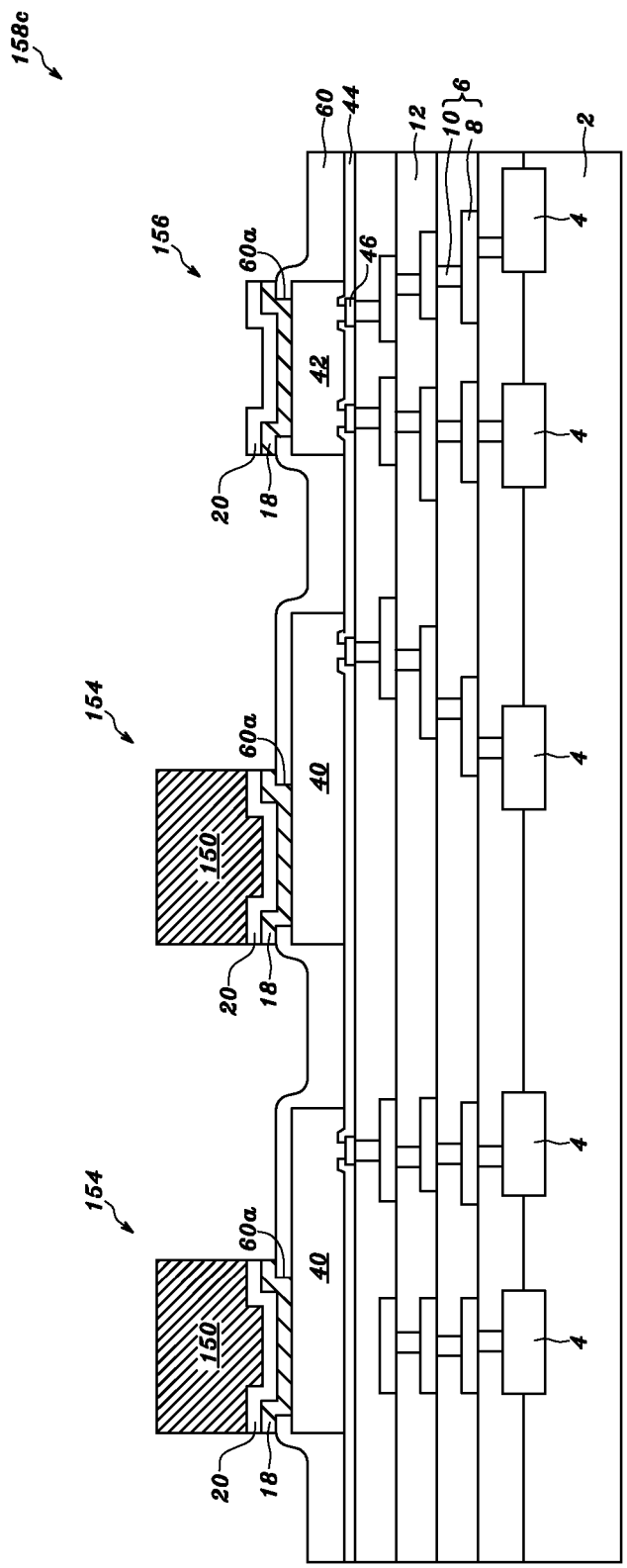

Similar to Embodiment 2, this embodiment can apply to a RDL or an interconnecting trace. Referring to FIG. 11I and FIG. 11J, in this embodiment, a metal trace 40 functioning as a RDL and a metal trace 42 functioning as an interconnecting trace may be simultaneously formed over the semiconductor substrate 2; refer to the related description in Embodiment 2 for the forming method thereof. Next, according to the steps shown in from FIG. 11A to FIG. 11F, the metal pad 154 is formed on the metal trace 40 exposed by the opening 60a, and the metal pad 156 is formed on the metal trace 42 exposed by the opening 60a; refer to the foregoing description for the details thereof, which will not repeat herein. Also refer to the foregoing description for the cases: the metal pad 156 of the semiconductor chip 158b or 158c (respectively shown in FIG. 11I and FIG. 11J) is bonded with a bonding wire via a wire-bonding process, and the semiconductor chip 158b or 158c connects an external circuit via the metal pad 154. According to the method described above, over the semiconductor substrate 2 may also be formed only a RDL or an interconnecting trace. Next, the metal pads 154 and 156 are formed on the RDL or the interconnecting trace. After the semiconductor substrate 2 is diced into semiconductor chips, the metal pad 156 is bonded with a bonding wire via a wirebonding process, and the semiconductor chip is connected to an external circuit via the metal pad 154.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:

1. A semiconductor chip comprising:
   a semiconductor substrate;
   a MOS device in or on said semiconductor substrate;
   a first patterned circuit layer over said semiconductor substrate, wherein said first patterned circuit layer comprises a copper portion and a first conductive layer at a bottom and a sidewall of said copper portion;

a first dielectric layer over said first patterned circuit layer and said semiconductor substrate, wherein a first opening in said first dielectric layer is over a first contact point of a first conductive interconnect of said first patterned circuit layer, and said first contact point is at a bottom of said first opening, and wherein a second opening in said first dielectric layer is over a second contact point of a second conductive interconnect of said first patterned circuit layer, and said second contact point is at a bottom of said second opening, wherein said first conductive interconnect has a portion spaced apart from said second conductive interconnect;

a second patterned circuit layer over said first dielectric layer and on said first and second contact points, wherein said first contact point is connected to said second contact point through said second patterned circuit layer, wherein said second patterned circuit layer comprises an aluminum-containing layer;

a second dielectric layer on said second patterned circuit layer and over said first dielectric layer, wherein a third opening in said second dielectric layer is over a third contact point of said second patterned circuit layer, and said third contact point is at a bottom of said third opening, wherein said third contact point is connected to said first contact point through said first opening, and said third contact point is connected to said second contact point through said second opening; and a conductive bump on said third contact point and a first surface of said second dielectric layer and vertically over said first and second contact points.

2. The semiconductor chip of claim 1, wherein said conductive bump comprises a titanium-containing layer on said third contact point and said first surface of said second dielectric layer and a gold layer having a thickness between 2 and 30 micrometers coupled to said titanium-containing layer.

3. The semiconductor chip of claim 1 further comprising a polymer layer on said first dielectric layer, wherein a fourth opening in said polymer layer is coupled to said first contact point, and a fifth opening in said polymer layer is coupled to said second contact point, wherein said second patterned circuit layer is further on said polymer layer.

4. The semiconductor chip of claim 1, wherein said conductive bump comprises a second conductive layer on said third contact point and said first surface of said second dielectric layer and a copper layer having a thickness between 2 and 30 micrometers coupled to said second conductive layer.

5. The semiconductor chip of claim 1 further comprising a polymer layer on said first dielectric layer, wherein said polymer layer has a thickness between 5 and 20 micrometers, wherein a fourth opening in said polymer layer is coupled to said first contact point, and a fifth opening in said polymer layer is coupled to said second contact point, wherein said second patterned circuit layer is further on said polymer layer.

6. The semiconductor chip of claim 1, wherein said conductive bump comprises a second conductive layer on said third contact point and said first surface of said second dielectric layer and a copper layer having a thickness between 1 and 200 micrometers coupled to said second conductive layer.

7. The semiconductor chip of claim 1, wherein said conductive bump comprises a second conductive layer on said third contact point and said first surface of said second dielectric layer and a nickel-containing layer coupled to said second conductive layer.

8. The semiconductor chip of claim 1, wherein said first conductive layer comprises tantalum.

9. The semiconductor chip of claim 1, wherein said first dielectric layer comprises a nitride.

10. The semiconductor chip of claim 1, wherein said first dielectric layer comprises an oxide.

11. The semiconductor chip of claim 1, wherein said second dielectric layer comprises a polymer.

12. The semiconductor chip of claim 1, wherein said first opening has a maximum transverse dimension between 0.05 and 25 micrometers.

13. The semiconductor chip of claim 1, wherein said first opening has a length between 0.05 and 25 micrometers.

14. The semiconductor chip of claim 1, wherein said aluminum-containing layer has a thickness between 0.01 and 3 micrometers.

15. A semiconductor chip comprising:

a semiconductor substrate;

a MOS device in or on said semiconductor substrate;

a first patterned circuit layer over said semiconductor substrate, wherein said first patterned circuit layer comprises a copper portion and a first conductive layer at a bottom and a sidewall of said copper portion;

a first dielectric layer over said first patterned circuit layer and said semiconductor substrate, wherein a first opening in said first dielectric layer is over a first contact point of a first conductive interconnect of said first patterned circuit layer, and said first contact point is at a bottom of said first opening, and wherein a second opening in said first dielectric layer is over second contact point of a second conductive interconnect of said first patterned circuit layer, and said second contact point is at a bottom of said second opening, wherein said first conductive interconnect has a portion spaced apart from said second conductive interconnect;

a second patterned circuit layer over said first dielectric layer and on said first and second contact points, wherein said first contact point is connected to said second contact point through said second patterned circuit layer, wherein said second patterned circuit layer comprises a second conductive layer and a third conductive layer on said second conductive layer, wherein said second conductive layer is at a bottom of said third conductive layer but not at a sidewall of said third conductive layer;

a second dielectric layer on said second patterned circuit layer and over said first dielectric layer, wherein a third opening in said second dielectric layer is over a third contact point of said second patterned circuit layer, and said third contact point is at a bottom of said third opening, wherein said third contact point is connected to said first contact point through said first opening, and said third contact point is connected to said second contact point through said second opening; and a conductive bump on said third contact point and a first surface of said second dielectric layer and vertically over said first and second contact points.

16. The semiconductor chip of claim 15, wherein said conductive bump comprises a titanium-containing layer on said third contact point and said first surface of said second dielectric layer and a gold layer having a thickness between 2 and 30 micrometers coupled to said titanium-containing layer.

17. The semiconductor chip of claim 15 further comprising a polymer layer on said first dielectric layer, wherein a fourth opening in said polymer layer is coupled to said first contact point, and a fifth opening in said polymer layer is coupled to said second contact point, wherein said second patterned circuit layer is further on said polymer layer.

18. The semiconductor chip of claim 15, wherein said conductive bump comprises a fourth conductive layer on said third contact point and said first surface of said second dielectric layer and a copper layer having a thickness between 2 and 30 micrometers coupled to said fourth conductive layer.

19. The semiconductor chip of claim 15 further comprising a polymer layer on said first dielectric layer, wherein said polymer layer has a thickness between 5 and 20 micrometers, wherein a fourth opening in said polymer layer is coupled to said first contact point, and a fifth opening in said polymer layer is coupled to said second contact point, wherein said second patterned circuit layer is further on said polymer layer.

20. The semiconductor chip of claim 15, wherein said conductive bump comprises a fourth conductive layer on said third contact point and said first surface of said second dielectric layer and a copper layer having a thickness between 1 and 200 micrometers coupled to said fourth conductive layer.

21. The semiconductor chip of claim 15, wherein said conductive bump comprises a fourth conductive layer on said third contact point and said first surface of said second dielectric layer and a nickel-containing layer coupled to said fourth conductive layer.

22. The semiconductor chip of claim 15, wherein said first conductive layer comprises tantalum.

23. The semiconductor chip of claim 15, wherein said first dielectric layer comprises an oxide.

24. The semiconductor chip of claim 15, wherein said first dielectric layer comprises a nitride.

25. The semiconductor chip of claim 15, wherein said second dielectric layer comprises a polymer.

26. The semiconductor chip of claim 15, wherein said first opening has a maximum transverse dimension between 0.05 and 25 micrometers.

27. The semiconductor chip of claim 15, wherein said first opening has a length between 0.05 and 25 micrometers.

28. The semiconductor chip of claim 15, wherein said second conductive layer comprises titanium.

29. The semiconductor chip of claim 15, wherein said third conductive layer comprises a copper layer having a thickness between 1 and 35 micrometers.

30. A semiconductor chip comprising:
a semiconductor substrate;
a MOS device in or on said silicon substrate;
a first patterned circuit layer over said semiconductor substrate, wherein said first patterned circuit layer comprises a copper portion and a conductive layer at a bottom and a sidewall of said copper portion;
a separating layer over said first patterned circuit layer and said semiconductor substrate, wherein a first opening in said separating layer is over a first contact point of a first conductive interconnect of said first patterned circuit layer, and said first contact point is at a bottom of said first opening, and wherein a second opening in said separating layer is over a second contact point of a second conductive interconnect of said first patterned circuit layer, and said second contact point is at a bottom of said second opening, wherein said first conductive interconnect has a portion spaced apart from said second conductive interconnect;
a second patterned circuit layer over said separating layer and said first patterned circuit layer, said second patterned circuit layer having a first surface on said first and second contact points and a second surface opposite said first surface, wherein said first contact point is connected to said second contact point through said second patterned circuit layer, wherein said second patterned circuit layer comprises an aluminum-containing layer;
a first polymer layer directly on a first portion of said second surface of said second patterned circuit layer, wherein an opening in said first polymer layer exposes a second portion of said second surface of said second patterned circuit layer; and
a conductive bump over a top surface of said second patterned circuit layer and vertically over said first and second contact points.

31. The semiconductor chip of claim 30 further comprising a second polymer layer on said separating layer, wherein a third opening in said second polymer layer is coupled to said first and second contact points, wherein said second patterned circuit layer is further coupled to said second polymer layer.

32. The semiconductor chip of claim 30 further comprising a second polymer layer on said separating layer, wherein said second polymer layer has a thickness between 5 and 20 micrometers, wherein a third opening in said second polymer layer is coupled to said first and second contact points, wherein said second patterned circuit layer is further coupled to said second polymer layer.

33. The semiconductor chip of claim 30, wherein said conductive layer comprises tantalum.

34. The semiconductor chip of claim 30, wherein said separating layer comprises a nitride.

35. The semiconductor chip of claim 30, wherein said separating layer comprises an oxide.

36. The semiconductor chip of claim 30, wherein said first opening has a maximum transverse dimension between 0.05 and 25 micrometers.

37. The semiconductor chip of claim 30, wherein said first opening has a length between 0.05 and 25 micrometers.

38. The semiconductor chip of claim 30, wherein said aluminum-containing layer has a thickness between 0.01 and 3 micrometers.

39. A semiconductor chip comprising:
a semiconductor substrate;
a MOS device in or on said semiconductor substrate;
a first patterned circuit layer over said semiconductor substrate, wherein said first patterned circuit layer comprises a copper portion and a first conductive layer at a bottom and a sidewall of said copper portion;
a separating layer over said first patterned circuit layer and said semiconductor substrate, wherein a first opening in said separating layer is over a first contact point of a first conductive interconnect of said first patterned circuit layer, and said first contact point is at a bottom of said first opening, and wherein a second opening in said separating layer is over a second contact point of a second conductive interconnect of said first patterned circuit layer, and said second contact point is at a bottom of said second opening, wherein said first conductive interconnect has a portion spaced apart from said second conductive interconnect;
a second patterned circuit layer over said separating layer and said first patterned circuit layer, said second patterned circuit layer having a first surface on said first and second contact points and a second surface opposite said first surface, wherein said first contact point is connected to said second contact point through said second patterned circuit layer, wherein said second patterned circuit layer comprises a second conductive layer and a third conductive layer on said second conductive layer, wherein said second conductive layer is at a bottom of said third conductive layer but not at a sidewall of said third conductive layer;
a first polymer layer directly on a first portion of said second surface of said second patterned circuit layer, wherein an opening in said first polymer layer exposes a second portion of said second surface of said second patterned circuit layer; and a conductive bump over a top surface of said second patterned circuit layer and vertically over said first and second contact points.

40. The semiconductor chip of claim 39 further comprising a second polymer layer on said separating layer, wherein a third opening in said second polymer layer is coupled to said first and second contact points, wherein said second patterned circuit layer is further coupled to said second polymer layer.

41. The semiconductor chip of claim 39 further comprising a second polymer layer on said separating layer, wherein said second polymer layer has a thickness between 5 and 20 micrometers, wherein a third opening in said second polymer layer is coupled to said first and second contact points, wherein said second patterned circuit layer is further coupled to said second polymer layer.

42. The semiconductor chip of claim 39, wherein said first conductive layer comprises tantalum.

43. The semiconductor chip of claim 39, wherein said separating layer comprises a nitride.

44. The semiconductor chip of claim 39, wherein said separating layer comprises an oxide.

45. The semiconductor chip of claim 39, wherein said first opening has a maximum transverse dimension between 0.05 and 25 micrometers.

46. The semiconductor chip of claim 39, wherein said first opening has a length between 0.05 and 25 micrometers.

47. The semiconductor chip of claim 39, wherein said second conductive layer comprises titanium.

48. The semiconductor chip of claim 39, wherein said third conductive layer comprises a copper layer having a thickness between 1 and 35 micrometers.

* * * * *